US007003414B1

(12) United States Patent
Wichelman et al.

(10) Patent No.: US 7,003,414 B1
(45) Date of Patent: *Feb. 21, 2006

(54) MONITORING SYSTEM AND METHOD IMPLEMENTING FAILURE TIME SPECTRUM SCAN

(75) Inventors: James Wichelman, Fort Collins, CO (US); Bruce Votipka, Fort Collins, CO (US); Eric N. Flink, Loveland, CO (US); Craig Chamberlain, Louisville, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/449,643

(22) Filed: Nov. 30, 1999

(51) Int. Cl.
*G01R 23/16* (2006.01)
(52) U.S. Cl. .................. 702/76; 725/107; 324/76.19
(58) Field of Classification Search ............... 702/76; 725/107, 108, 150, 130, 111, 126; 324/76.19
See application file for complete search history.

(56) References Cited

U.S. PATENT DOCUMENTS

| 4,810,898 | A  | * | 3/1989  | Rocci et al. ............... 307/115 |
| 5,861,882 | A  | * | 1/1999  | Sprenger et al. ........... 345/700 |
| 5,953,009 | A  | * | 9/1999  | Alexander ................. 345/771 |
| 6,061,393 | A  | * | 5/2000  | Tsui et al. .................. 375/224 |
| 6,201,384 | B1 | * | 3/2001  | Alexander ............. 324/121 R |
| 6,230,326 | B1 | * | 5/2001  | Unger et al. ............... 725/111 |
| 6,385,773 | B1 | * | 5/2002  | Schwartzman et al. .... 725/124 |
| 6,453,472 | B1 | * | 9/2002  | Leano et al. ............... 725/111 |
| 6,522,987 | B1 | * | 2/2003  | Flink et al. ................. 702/122 |
| 6,546,557 | B1 | * | 4/2003  | Ovadia ...................... 725/129 |
| 6,570,913 | B1 | * | 5/2003  | Chen .......................... 375/223 |
| 6,574,797 | B1 | * | 6/2003  | Naegeli et al. ............. 725/120 |
| 6,590,587 | B1 | * | 7/2003  | Wichelman et al. ........ 345/736 |
| 6,643,607 | B1 | * | 11/2003 | Chamberlain et al. ...... 702/170 |
| 6,662,135 | B1 | * | 12/2003 | Burns et al. ................ 702/120 |
| 6,707,474 | B1 | * | 3/2004  | Beck et al. ................. 345/771 |
| 6,711,134 | B1 | * | 3/2004  | Wichelman et al. ........ 370/241 |
| 6,732,061 | B1 | * | 5/2004  | Wichelman et al. ........ 702/122 |
| 6,741,947 | B1 | * | 5/2004  | Wichelman et al. ........ 702/122 |
| 6,757,908 | B1 | * | 6/2004  | Vogel ........................ 725/107 |
| 6,775,840 | B1 | * | 8/2004  | Naegel et al. .............. 725/111 |
| 6,853,932 | B1 | * | 2/2005  | Wichelman et al. .......... 702/76 |
| 6,895,043 | B1 | * | 5/2005  | Naegeli et al. ............. 375/224 |

FOREIGN PATENT DOCUMENTS

EP               487306 A2 *  5/1992

* cited by examiner

*Primary Examiner*—Marc S. Hoff
*Assistant Examiner*—Anthony Gutierrez

(57) ABSTRACT

A channel plan with a corresponding test plan are implemented in connection with a plurality of nodes that communicate signals. The channel plan has one or more predefined specifications for each of one or more signal channels on each of the nodes. The channel plan enables a monitoring system to, among other things, conduct automatic periodic test plans, comprising tests, on the nodes, based upon the predefined data specified in the channel plan. Each test plan prescribes measurement of at least one signal parameter, pertaining to one or more nodes as a whole and/or to one or more channels contained within the nodes. The monitoring system includes a spectrum analyzer, a switch enabling the spectrum analyzer to interface with the nodes, and a controller controlling the switch and the spectrum analyzer. The controller is configured to enable creation of and display the channel plan and test plan, based upon user inputs. Notably, the controller can be configured to compare results from tests with alarm limits, specified in the test plan, to control the spectrum analyzer to perform a failure time spectrum scan when one or more test results exceed one or more alarm limits, and to generate a plot of power amplitude versus frequency over the frequency spectrum of the node at issue.

22 Claims, 59 Drawing Sheets

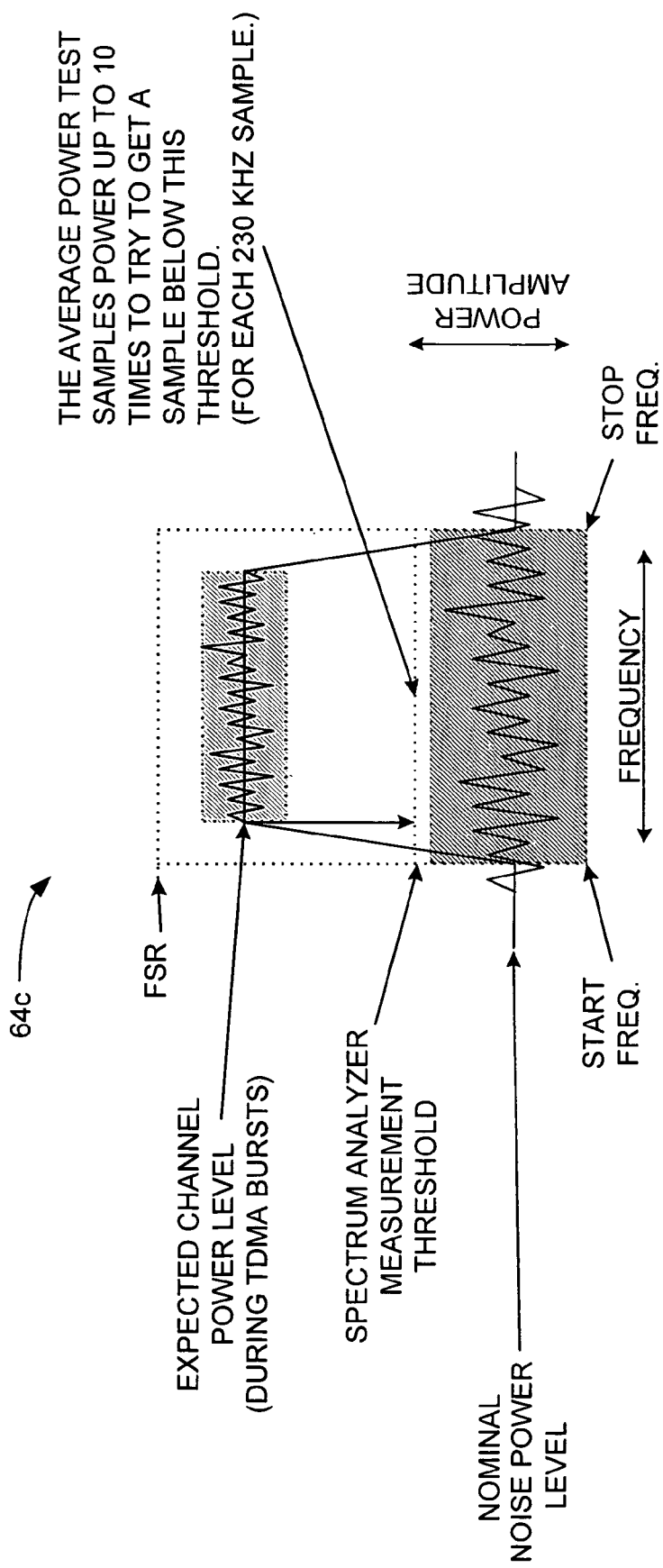

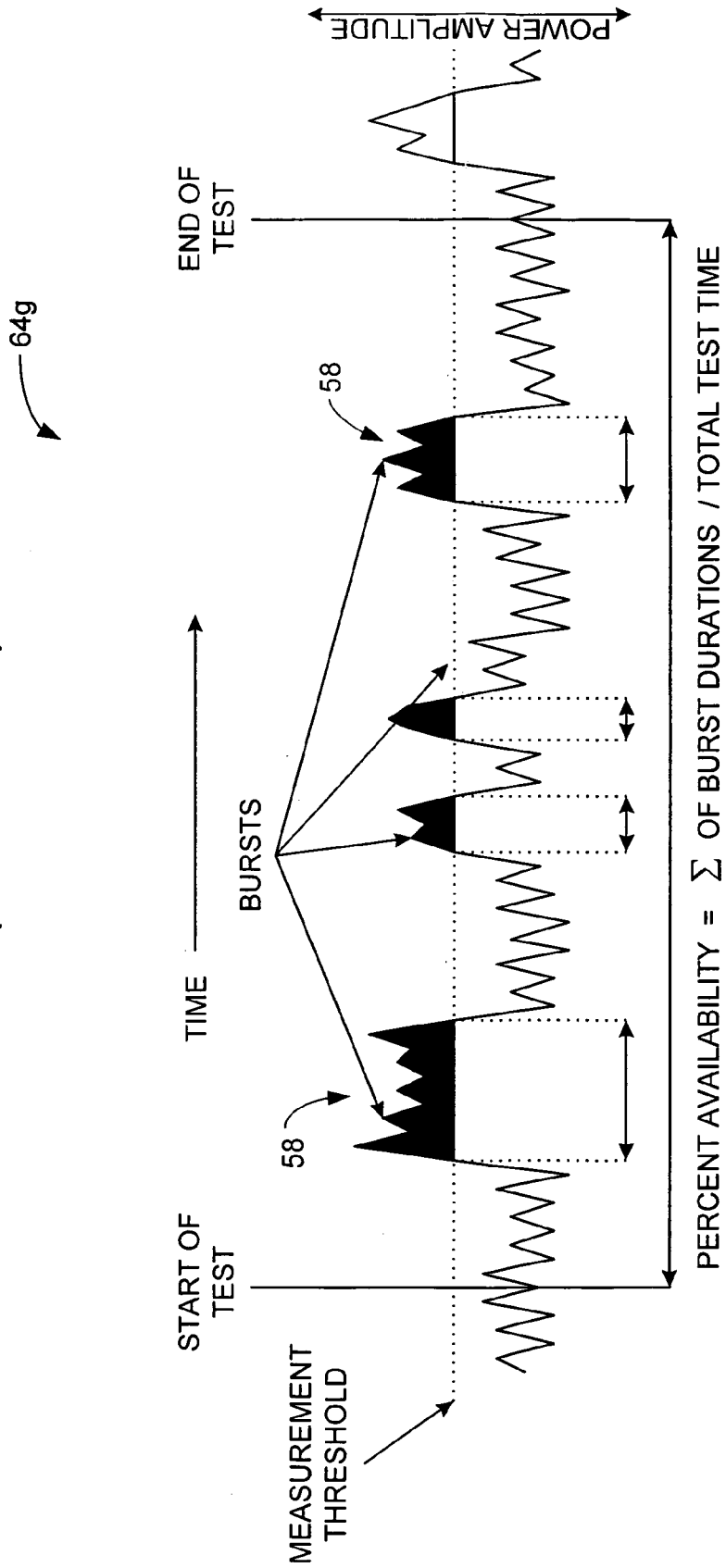

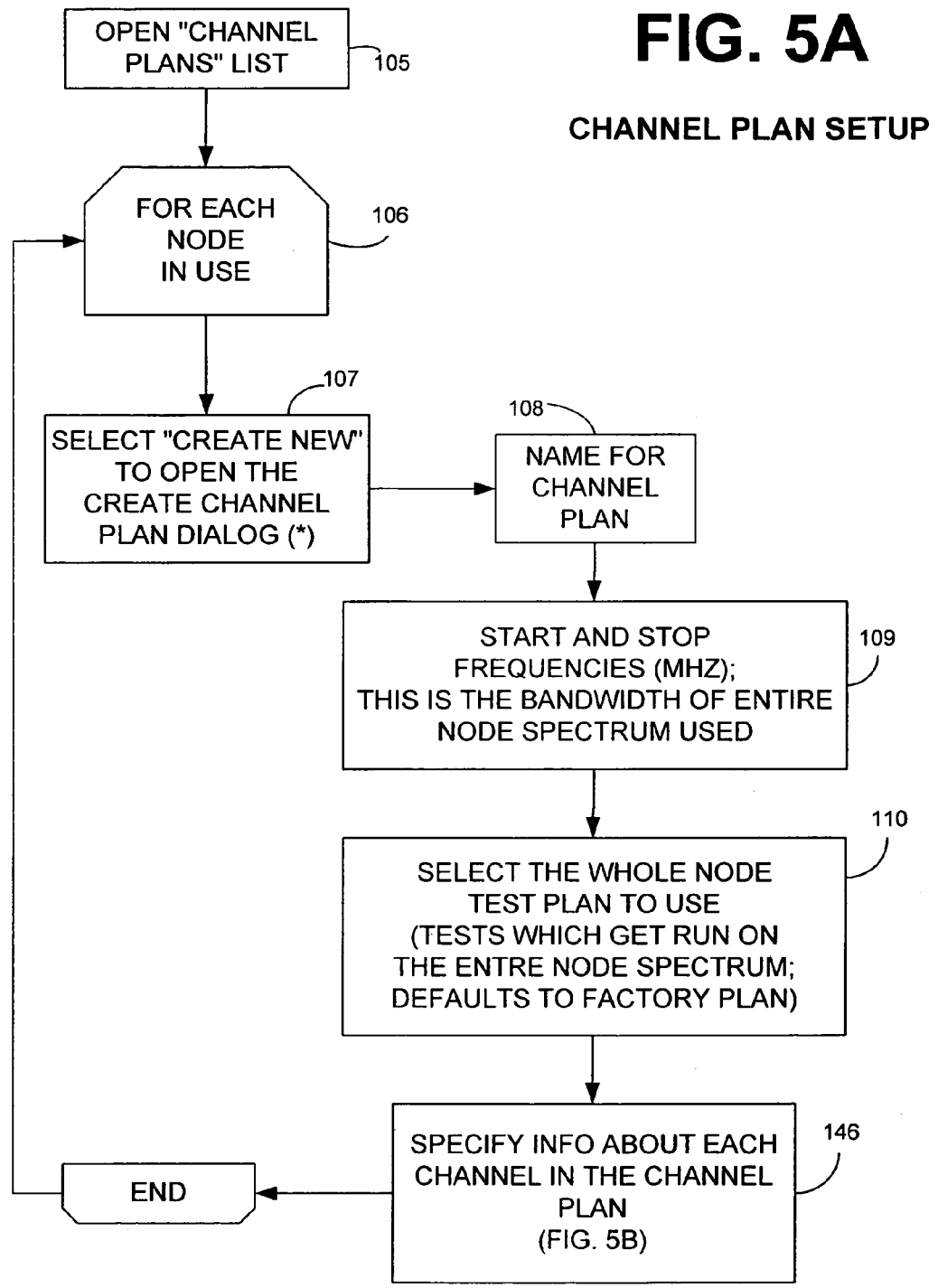

CHANNEL PLAN SETUP (CONTINUED)

DEVICE SETUP

TEST PLAN SETUP

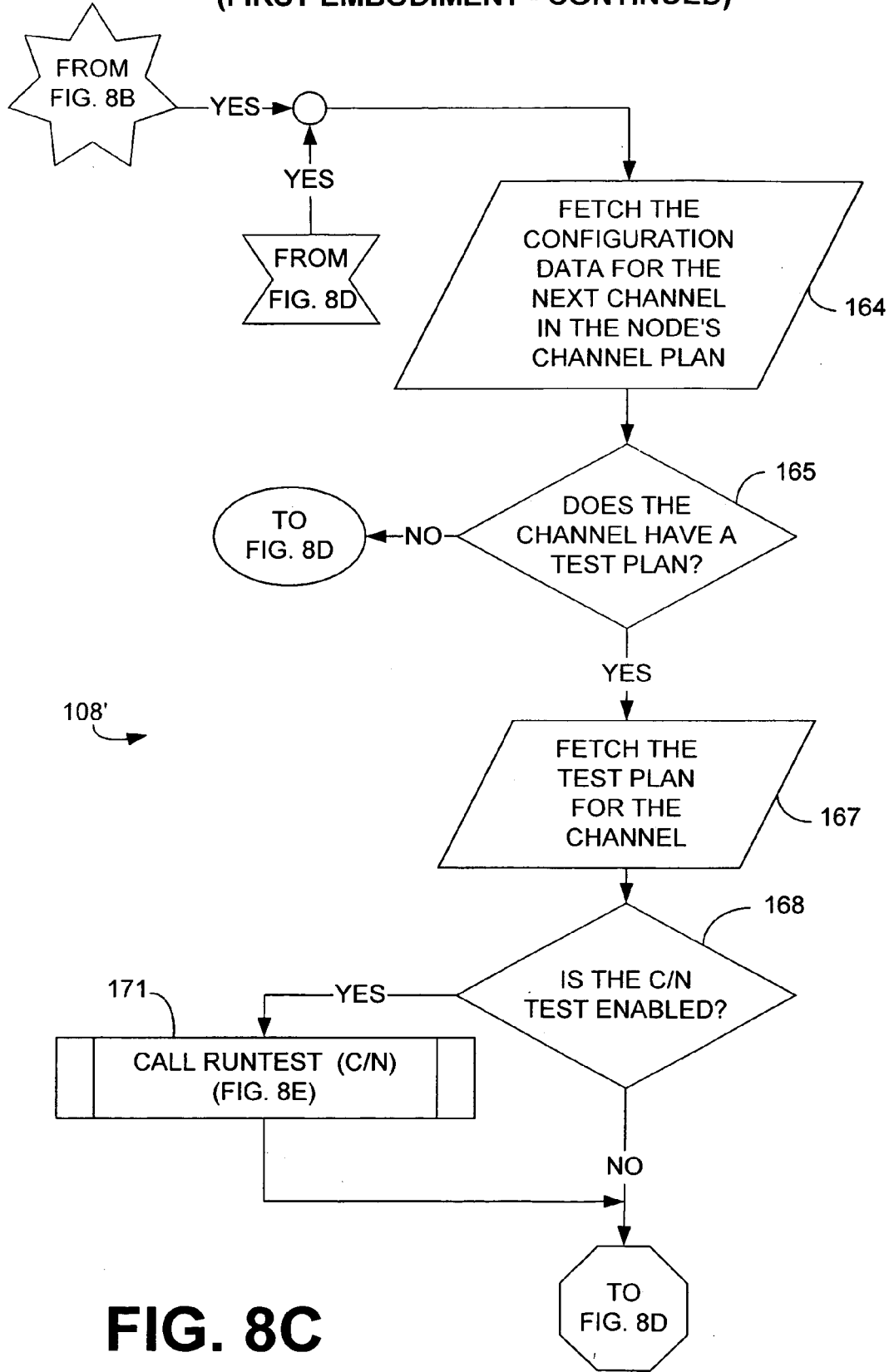

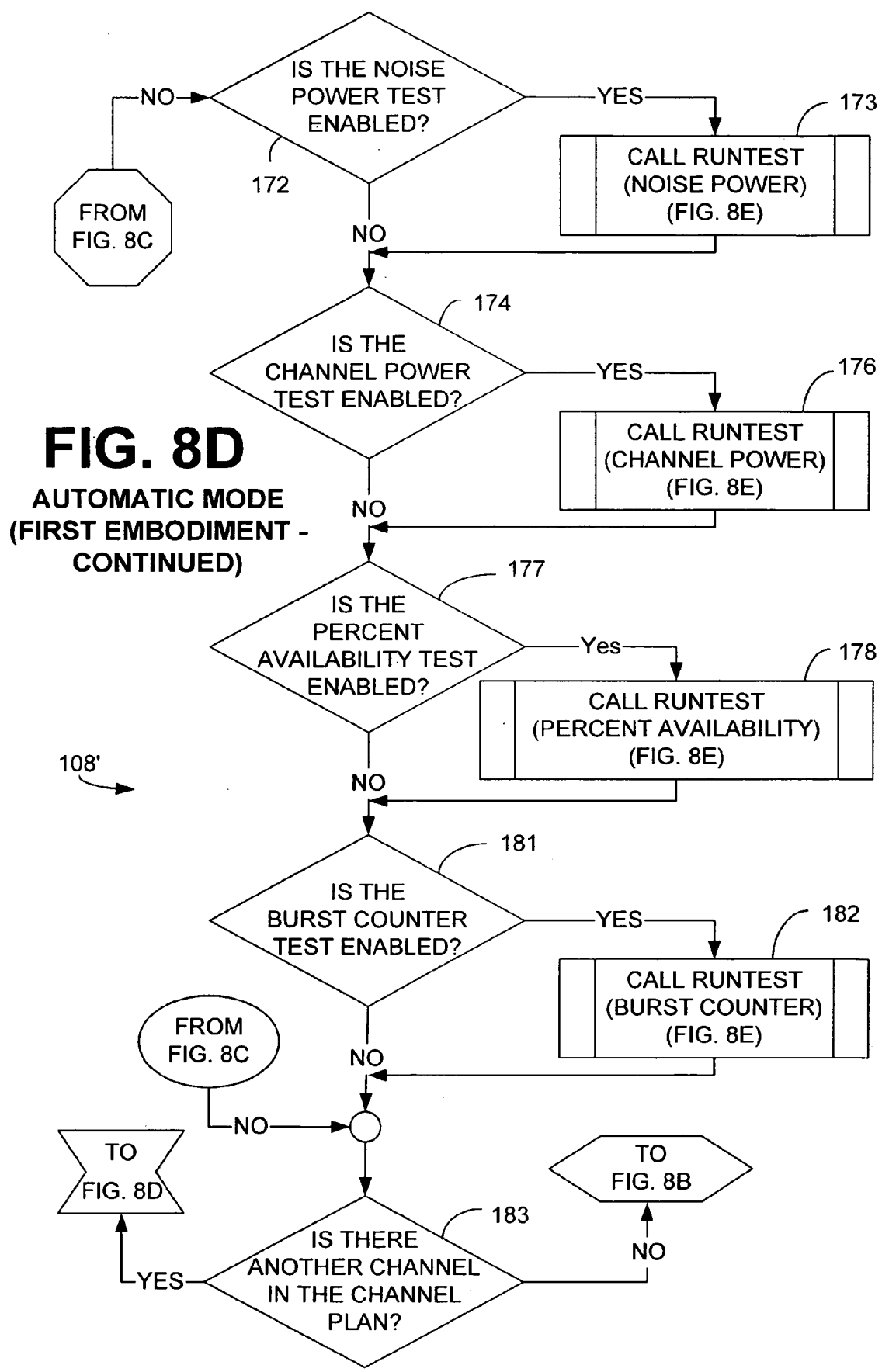

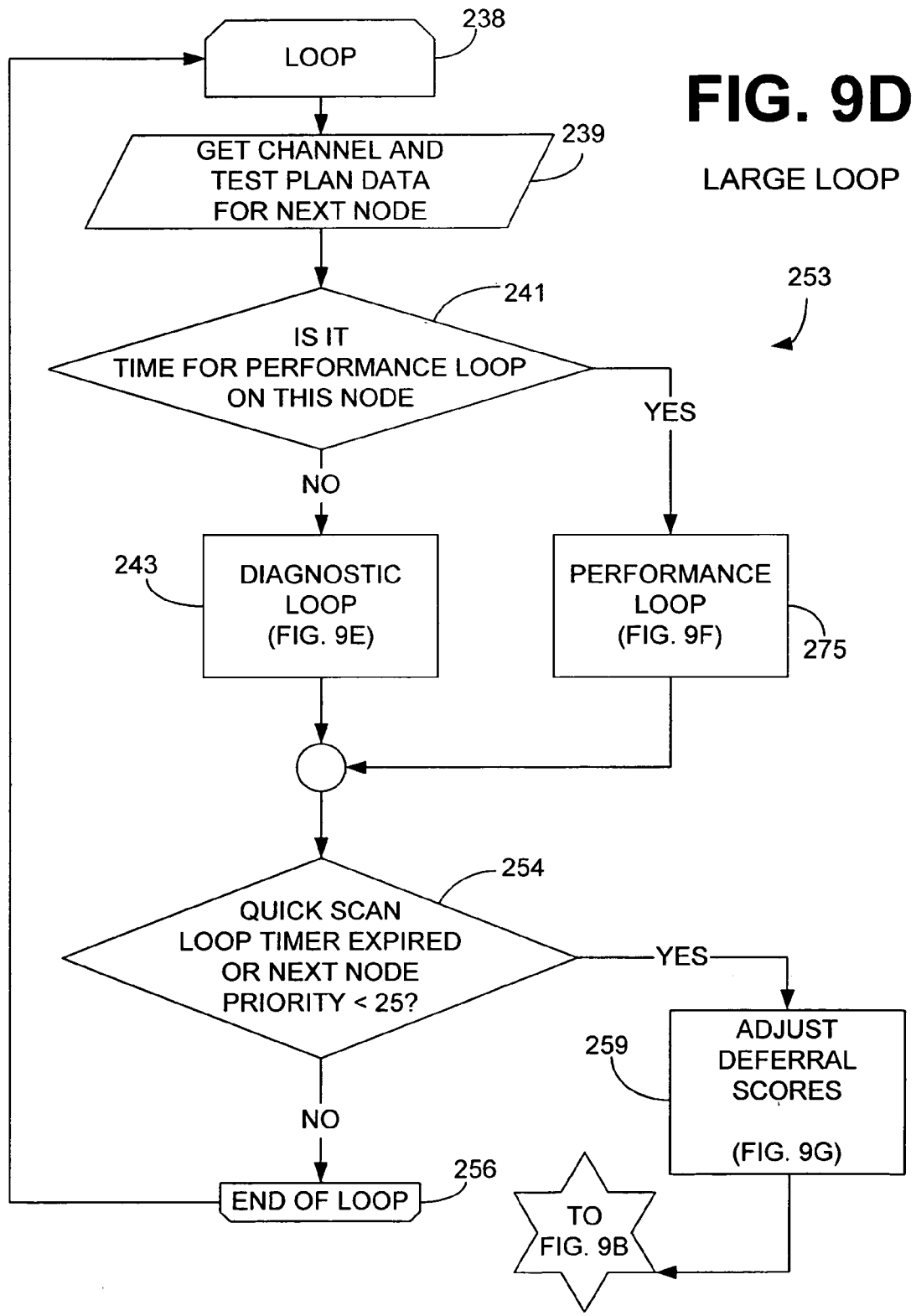

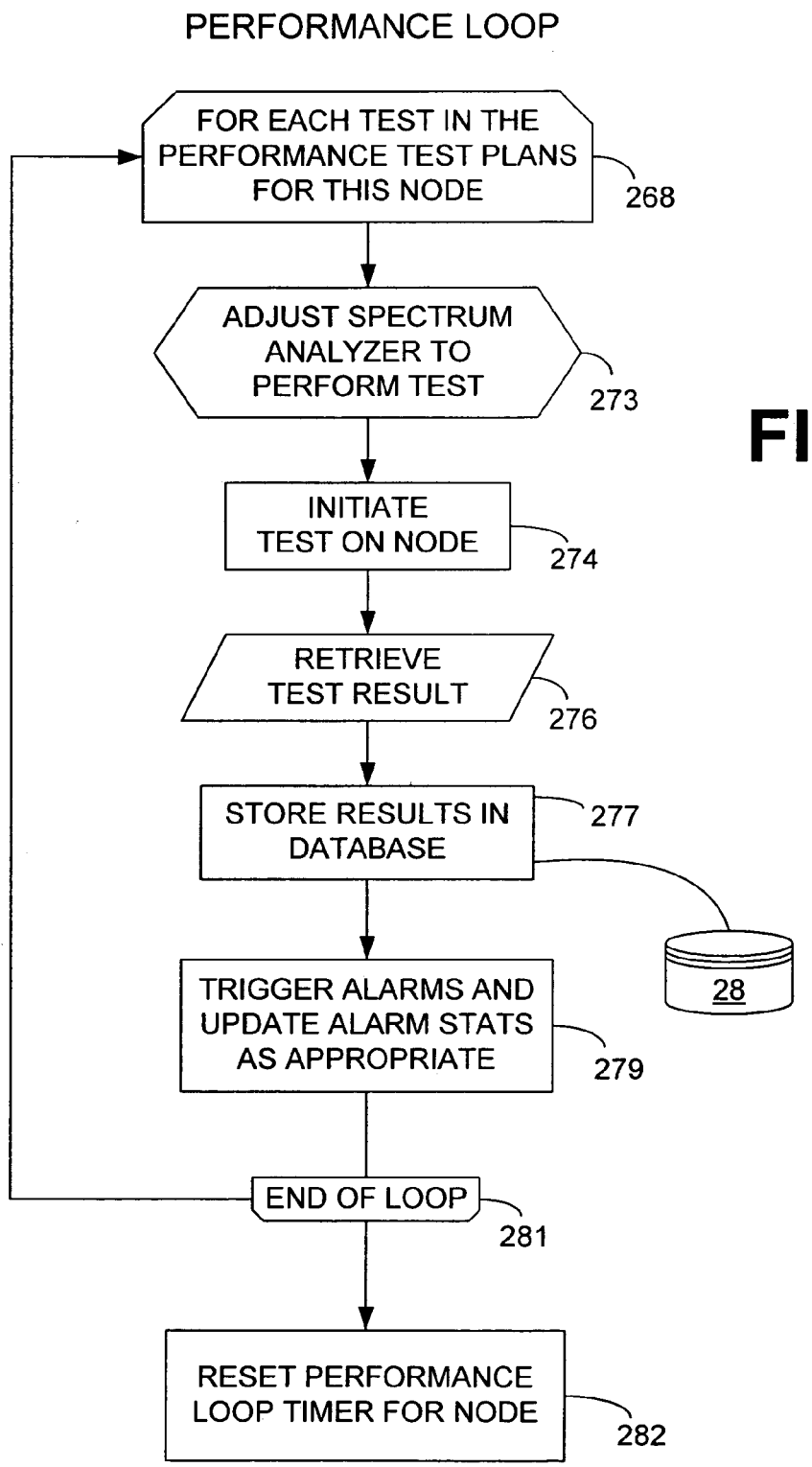

MONITORING SYSTEM AND METHOD IMPLEMENTING FAILURE TIME SPECTRUM SCAN

FIELD OF THE INVENTION

The present invention generally relates to fields of telecommunications and test equipment, and more particularly, to a monitoring system and method for enabling efficient monitoring of communications signals communicated along a plurality of connections. Although the monitoring system and associated methods of the present invention are not limited to this particular application, they are particularly suited for implementation in connection monitoring nodes associated with a cable television network.

BACKGROUND OF THE INVENTION

A television (TV) cable network, which is maintained and operated by a cable operator, generally includes a central office, oftentimes referred to as a "head end," where TV signals are captured for retransmission over trunk cables and neighborhood distribution cables to cable subscribers, for example, homes, businesses, and schools. Although these networks were originally designed and implemented with coaxial cables, optical fiber is now sometimes implemented between the head end office and trunk cables, among other places. The cable head end office usually has equipment to receive terrestrial and space-based transmissions from sources (e.g., satellites) around the world. Recently, head end offices have been equipped with high-capacity connections to the Internet. Many companies in the cable television market that own and maintain these networks are currently in the process of upgrading their networks from one-way to two-way networks (a forward path outwardly and a return path inwardly) in order to offer high speed data communications to the Internet and new multimedia services, such as the ability to order specific music and movies on demand.

The forward and return paths occupy different frequency ranges. In North America, the forward path, where the television, music, or other signal channels are usually located, starts at about 55 MHz and spans across the frequency spectrum to about 750 MHz to 1 GHz. Typically, each television channel has a bandwidth of about 6 MHz. The return path is usually allocated to that region of the frequency spectrum between about 5 MHz and 42 MHz, which is inherently susceptible to noise and interference from a variety of sources, due largely to its low frequency range. The return path can support a number of different services operating within the frequency spectrum of the return path, such as Internet data, telephony, and pay-per-view, as examples.

Each of the cable services is provided via a forward and/or a return path with one or more communications devices and/or modems situated at the subscriber's location and one or more corresponding communications devices and/or modems at the cable system's head end office. In order to operate properly and deliver a high quality service to the end user, each of these communications devices needs, among other things, an adequate signal-to-noise (S/N) ratio (typically greater than 20–30 dB) to operate correctly. Also, it is important for the device to operate within an expected power range. Furthermore, the cable operator is also concerned with the overall power of the entire node to ensure that all of the services together do not overload the transmission facilities.

One of the biggest problems that cable TV operators encounter is noise degradation in the return path, which can have a catastrophic impact on performance. As a result, many cable operators have been focusing on carefully monitoring the signal characteristics of the return path, identifying problematic connections and components thereof, and replacing and repairing parts where necessary in order to maintain and improve the return path signal characteristics. At least one prior art system for monitoring signal channels on the various nodes, or paths on connections having one or more signal channels, of the cable network utilizes a spectrum analyzer, which plots power amplitude versus frequency. A user of these systems typically specifies, for example, by drawing on a computer screen, an alarm level limit above and/or below the frequency spectrum for an entire return path, which may have one or more signal channels. Some of these prior art systems can learn an alarm limit by recording high level and low level marks through a series of spectrum scans. The limits are taken from this information and then adjusted by the user, as needed. Alarms are triggered based on the actual power amplitude level deviating above or below the specified alarm limit(s) based on some pattern, such as multiple successive scans or percentages outside the limit. These prior art systems do not have any inherent knowledge of the signal characteristics associated with any of the services within the return path spectrum. In essence, in the foregoing systems, the systems record how the return path is actually working, and the systems attempt to keep the return path working the same way.

Although meritorious to an extent, these prior art systems are problematic and have disadvantages. They generally do not provide a mechanism for testing individual channels, and measuring signal parameters, for example but not limited to, carrier-to-noise (C/N) ratio. Moreover, these prior art systems typically do not provide a measure of total node power, which is useful for ensuring proper power levels for the transmission lasers associated with the optical fibers of the cable system. Finally and perhaps most notably, the signal characteristics (e.g., center frequency, bandwidth, amplitude, etc.) of the various signal channels vary from node to node of the cable network, based in part upon (a) use of different device types (most devices burst on and off based on data traffic, while some other types of devices transmit continuous signals) and (b) failure to implement a systematic global plan, making it extremely difficult to design and implement sophisticated automated testing systems.

SUMMARY OF THE INVENTION

The present invention provides a monitoring system and methods for enabling efficient monitoring of communications signals communicated along a plurality of connections. Although the monitoring system and methods of the present invention are not limited to this particular application, they are particularly suited for implementation in connection monitoring nodes associated with a cable television network. Notably, in connection with the monitoring system and method, the present invention provides a user friendly feature, called a failure time spectrum scan, that can be automatically triggered in the event of an alarm condition (indicative of a possible failure) and that results in sampling of additional data for future reference for troubleshooting purposes.

The channel plan has one or more predefined specifications for each of one or more signal channels on each of the nodes. The channel plan may comprise a specification of the following, for example, for each of the channels: a label describing use of the corresponding channel, a center frequency, a bandwidth, a power level, information regarding the carrier roll-off, a default status indicator identifying whether the corresponding channel is currently allocated or reserved for future use, one or more default threshold levels for various tests, and an alternate center frequency that may be utilized by the corresponding channel. Each test plan prescribes measurement of one or more signal parameters, pertaining to one or more nodes as a whole and/or to one or more channels contained within the nodes.

The channel plan enables a monitoring system to, among other things, conduct automatic periodic test plans, comprising tests, on the nodes, based upon the predefined data specified in the channel plan. As an example of a possible implementation, the monitoring system can include a spectrum analyzer, a switch enabling the spectrum analyzer to interface with the nodes, and a controller, for example, a processor executing software, controlling the switch and the spectrum analyzer. The controller is configured to enable creation of and display of the channel plan and test plan, based upon user inputs. The controller can cause periodic automatic testing of the signal characteristics of each of the nodes based upon the test plan. The test plan may include alarm thresholds that are triggered and tracked when a signal parameter of a node or channel exceeds an alarm threshold.

The controller also implements the feature of the failure time spectrum scan. The controller can be configured to compare results from one or more tests with one or more alarm limits, specified in the test plan, to control the spectrum analyzer to perform a failure time spectrum scan when one or more test results exceed one or more alarm limits, and to generate a plot of power amplitude versus frequency over the frequency spectrum of the node at issue.

The present invention can also be viewed as providing several methods for enabling efficient monitoring of signals on nodes by providing a very useful graphical user interface. In this regard, one of these methods, as an example, can be broadly conceptualized as a method for recording the frequency spectrum of electrical signals communicated along a plurality of electrical connections, each connection having a plurality of signal channels, comprising the following steps: communicating signals along each of a plurality of nodes; testing communication of signals on nodes by conducting a test plan, the test plan prescribing measurement of at least one test on at least one node; comparing results from the one test with a user definable alarm limit; and performing a failure time spectrum scan on the one node when the test results exceed the alarm limit, the failure time spectrum scan representative of power amplitude versus frequency over the frequency spectrum of the node.

Other features, advantages, systems, and methods provided by the present invention will become apparent to one with skill in the art upon examination of the following drawings and detailed description. It is intended that all such additional features and advantages be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 3A through 3O are graphical illustrations showing an example of an implementation of the channel plan and examples of tests that can be associated with the test plan, which are based upon the channel plan;

FIG. 3A is a graphical illustration showing data that can be contained within the channel plan object of FIG. 2, which corresponds to a channel plan of one or more nodes;

FIG. 3G is a graphical illustration showing how alarm limits can be set in connection with a channel power test, which may be specified as part of a test plan object of FIG. 2;

FIG. 3I is a graphical illustration showing a channel power test, which may be specified as part of a test plan object of FIG. 2;

FIG. 3N is a graphical illustration showing a percent availability test, which may be specified as part of a test plan of FIG. 2;

FIG. 3O is a graphical illustration showing the percent availability test in connection with active channels;

FIGS. 5A and 5B collectively illustrate a flow chart showing an example of the architecture, functionality, and operation of a process for enabling a user to set up a channel plan(s), the process being implemented by the combination of the control process and GUI of FIGS. 1A–1C;

FIGS. 8A–8F are flow charts showing an example of the architecture, functionality, and operation of a first embodiment of the process (round robin algorithm) for implementing the automatic mode of FIG. 4;

FIGS. 9A–9G are flow charts showing an example of the architecture, functionality, and operation of a second embodiment of the process (smart scanning algorithm) for implementing the automatic mode of FIG. 4;

DETAILED DESCRIPTION OF THE PREFERRED EMBODIMENTS

For facilitating a better understanding of the present invention, the following is a Table of Contents for the detailed description section of this document.

Table of Contests

Figure 1A:
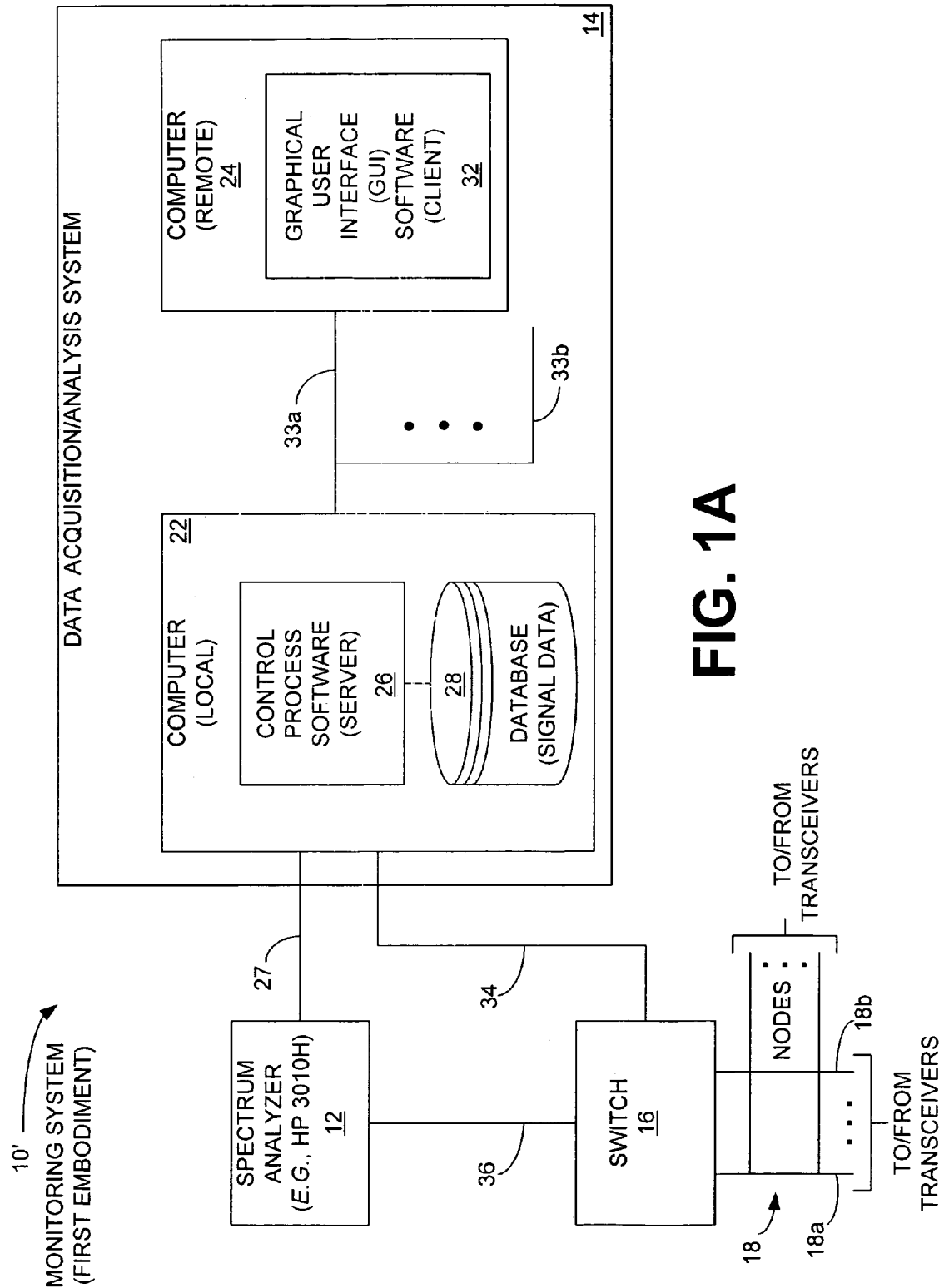
FIG. 1A is a block diagram of a first embodiment of the monitoring system of the present invention.
Figure 1B:
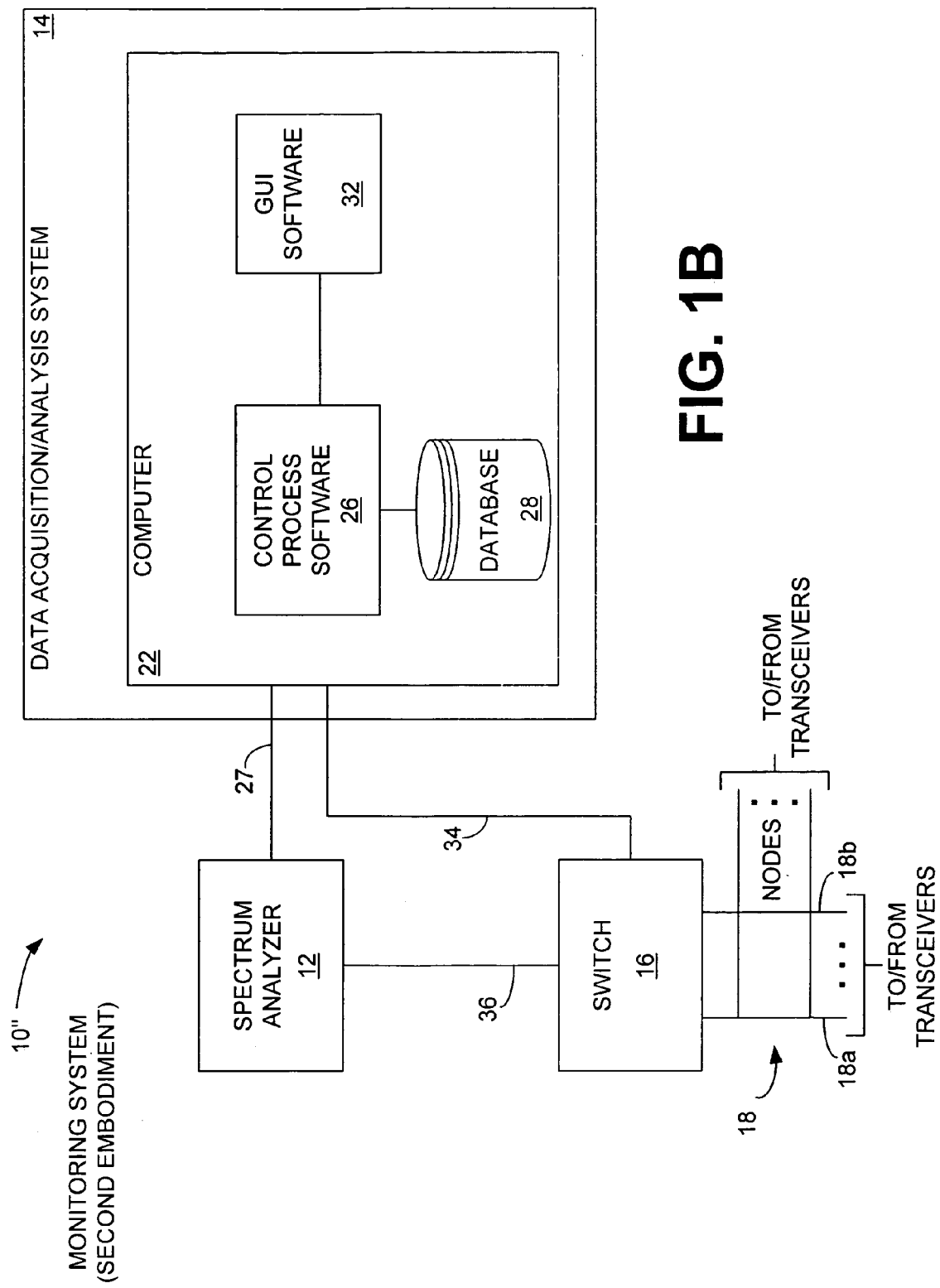
FIG. 1B is a block diagram of a second embodiment of the monitoring system of the present invention.
Figure 1C:
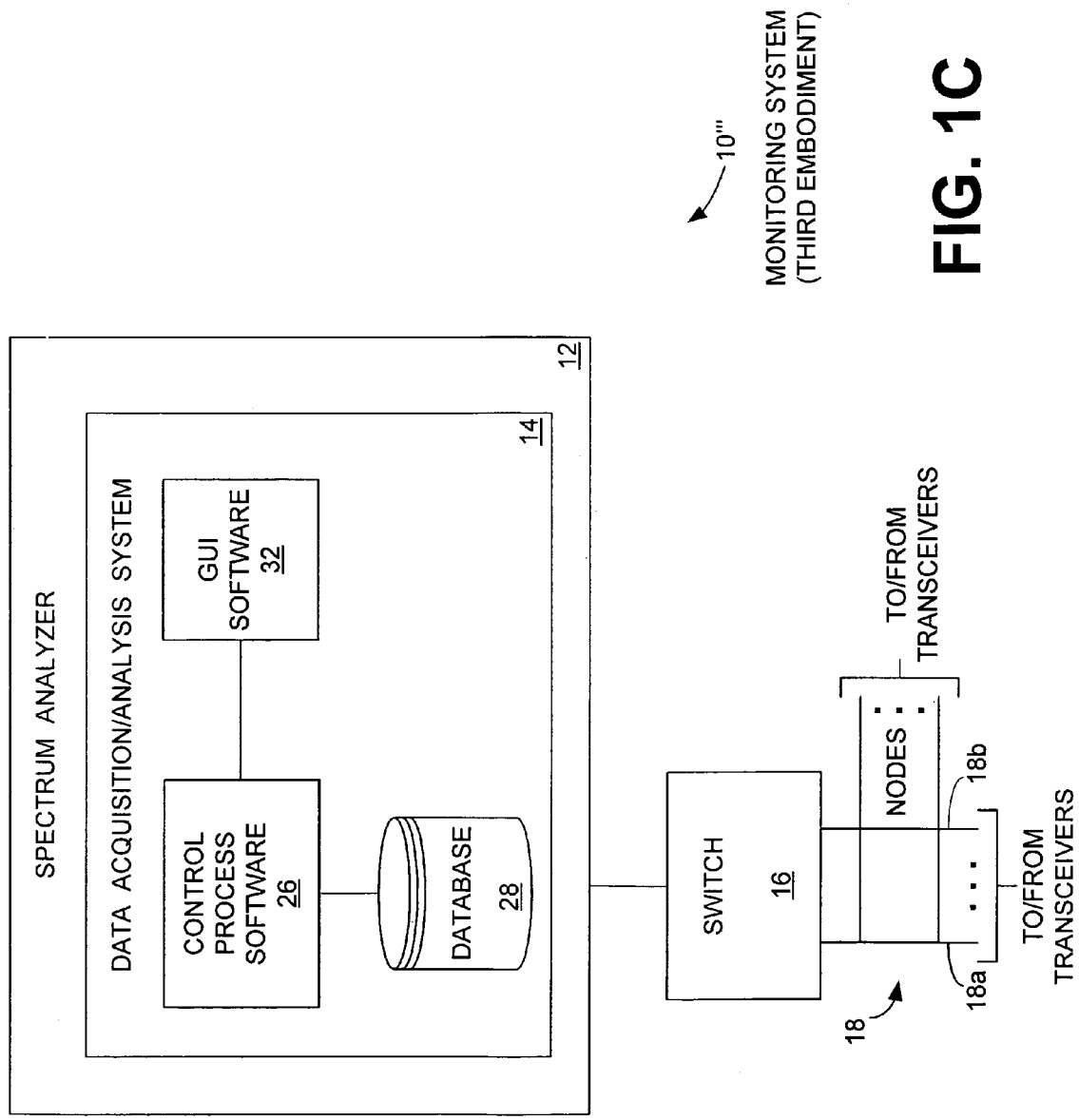
FIG. 1C is a block diagram of a third embodiment of the monitoring system of the present invention.

I. Hardware Architecture
II. Data Structure Of Database
III. Channel Plan And Test Plan Methodology
  A. Automated Tests
  B. Full Scale Reference (FSR)
  C. Thresholds Versus Alarm Limits
  D. Spectrum Scan Test
  E. Discrete Frequency Scan (DFS) Test
  F. Total Node Power Test
    1. Node Level—Total Node Power Results Display
    2. Group Level—Total Node Power Results Display
  G. Average Noise Power Test
  H. Channel Power Test
  I. Channel Power Test For Bursty Channels
  J. Carrier-to-Noise (C/N) Test
  K. Burst Counter Test
  L. Percent Availability Test
    1. Example
  M. Failure Time Spectrum Scan Test
IV. Software Architecture
  (Control Process Software And GUI Software)
  A. Channel Plan Setup
  B. Device Setup
  C. Test Plan Setup
  D. First Embodiment Of Automatic Mode
    (Automated Testing Using Round Robin Algorithm)
  E. Second Embodiment Of Automatic Mode
    (Automated Testing Using Smart Scanning Algorithm)
    1. Main Scanning Loop
    2. Diagnostic Test Loop
    3. Performance Loop
    4. Smart Scanning Algorithm
      a. Test Priority Score System
      b. Example Of Test Priority Score Computation
    5. Preferred Specific Implementation
      a. Quick Scan Loop
      b. Setup For Large Loop
      c. Large Loop
      d. Diagnostic Loop
      e. Adjusting Deferral Scores Loop
      f. Performance Loop
V. Graphical User Interface (GUI) Screens
  A. Navigation/Monitoring
  B. Configuration Of Tests
VI. Advantages
VII. Anticipated Variations And Modifications End of Table of Contents I. Hardware Architecture As examples, first, second, and third embodiments of the monitoring system of the present invention are shown in FIGS. 1A, 1B, and 1C, respectively, and are generally denoted by respective reference numbers 10', 10", and 10'''. Herein, reference numeral 10 denotes any one of the foregoing embodiments. Currently, the first embodiment is the best mode known to the inventors for practicing the present invention, as it is believed to provide the most flexibility in terms of implementation.

As shown in FIG. 1A, the monitoring system 10' includes, in general, a spectrum analyzer 12, a data acquisition/analysis system 14, and a switch 16. The data acquisition/analysis system 14 controls the spectrum analyzer 12 and the switch 16 to retrieve signal data from signals on one or more of the plurality of nodes 18. Each node 18 represents one or more signal channels on a connection, and can be, for example but not limited to, a return path (having one or more return channels), a forward path (having one or more forward channels) or a combination thereof. As a non-limiting example of an application, the nodes 18 may be nodes associated with a cable television network and the monitoring system 10' may be situated at a hub or head end associated with the cable television network. Furthermore, the monitoring system 10', as well as the second and third embodiments of same to be described hereafter, are particularly suited to efficiently monitor the return path in such cable networks.

The spectrum analyzer 12 can be any suitable analyzer or test device that can monitor and retrieve spectrum information from a signal, for example, but not limited to, the HP CaLAN 85963A (HP 3010H) sweep/ingress analyzer, which is manufactured by and commercially available from Agilent Technologies, Inc., U.S.A. (formerly, part of Hewlett-Packard Company, U.S.A.). The foregoing example was chosen, despite its age in the industry, for its functionality, as will be clear from later discussions in this document. However, it is envisioned and it is clear that the present invention can be implemented in connection with many types of spectrum analyzers. The spectrum analyzer 12 is connected to and is controlled by the data acquisition/analysis system 14 via a connection 27, preferably, but not limited to, an RS232 bus connection. Generally, based upon control signals received from the data acquisition/analysis system 14, the spectrum analyzer 12 samples data from signals by way of the switch 16 and provides the data to the data acquisition/analysis system 14 for further analysis.

Figure 3A:
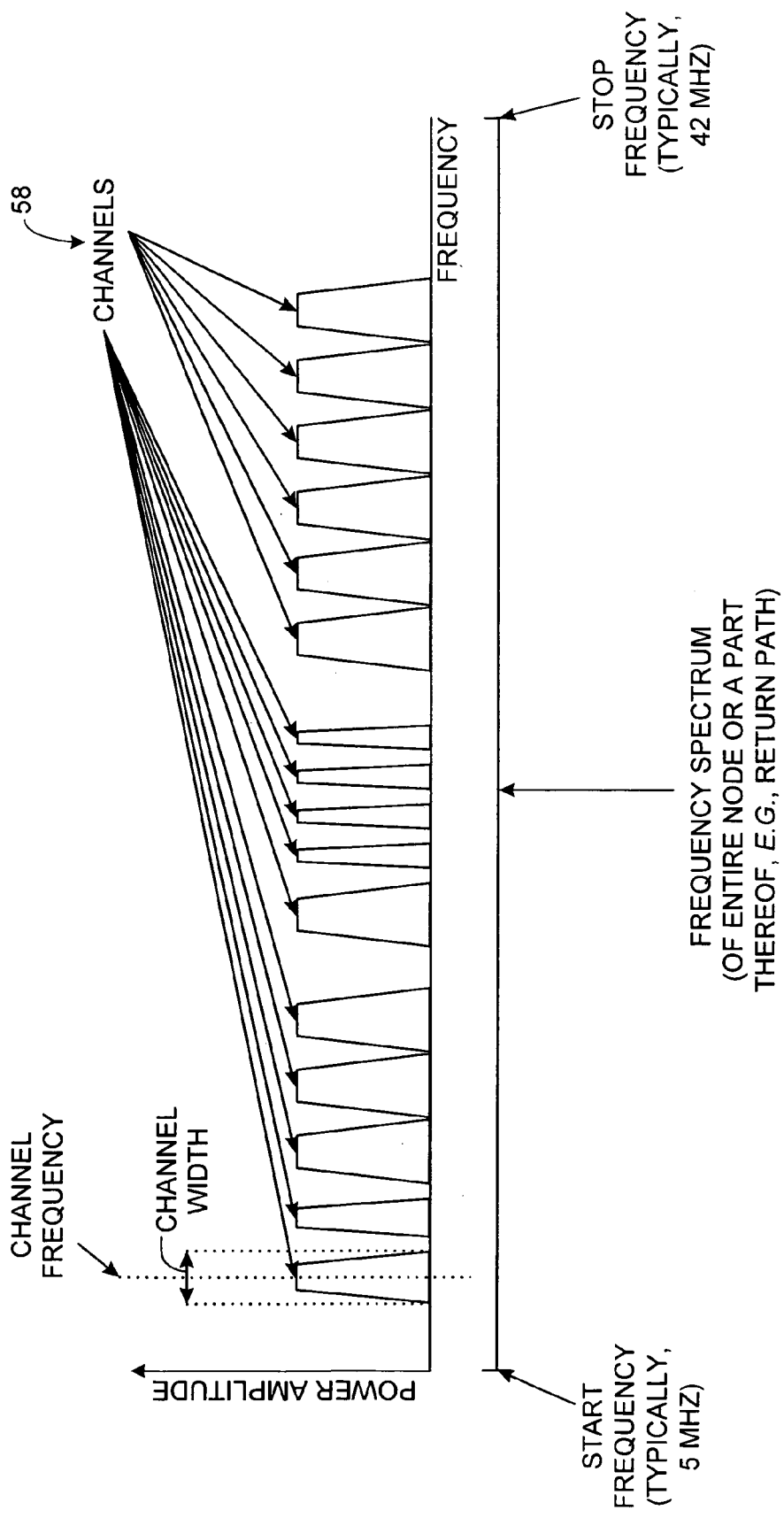
Figure 3B:
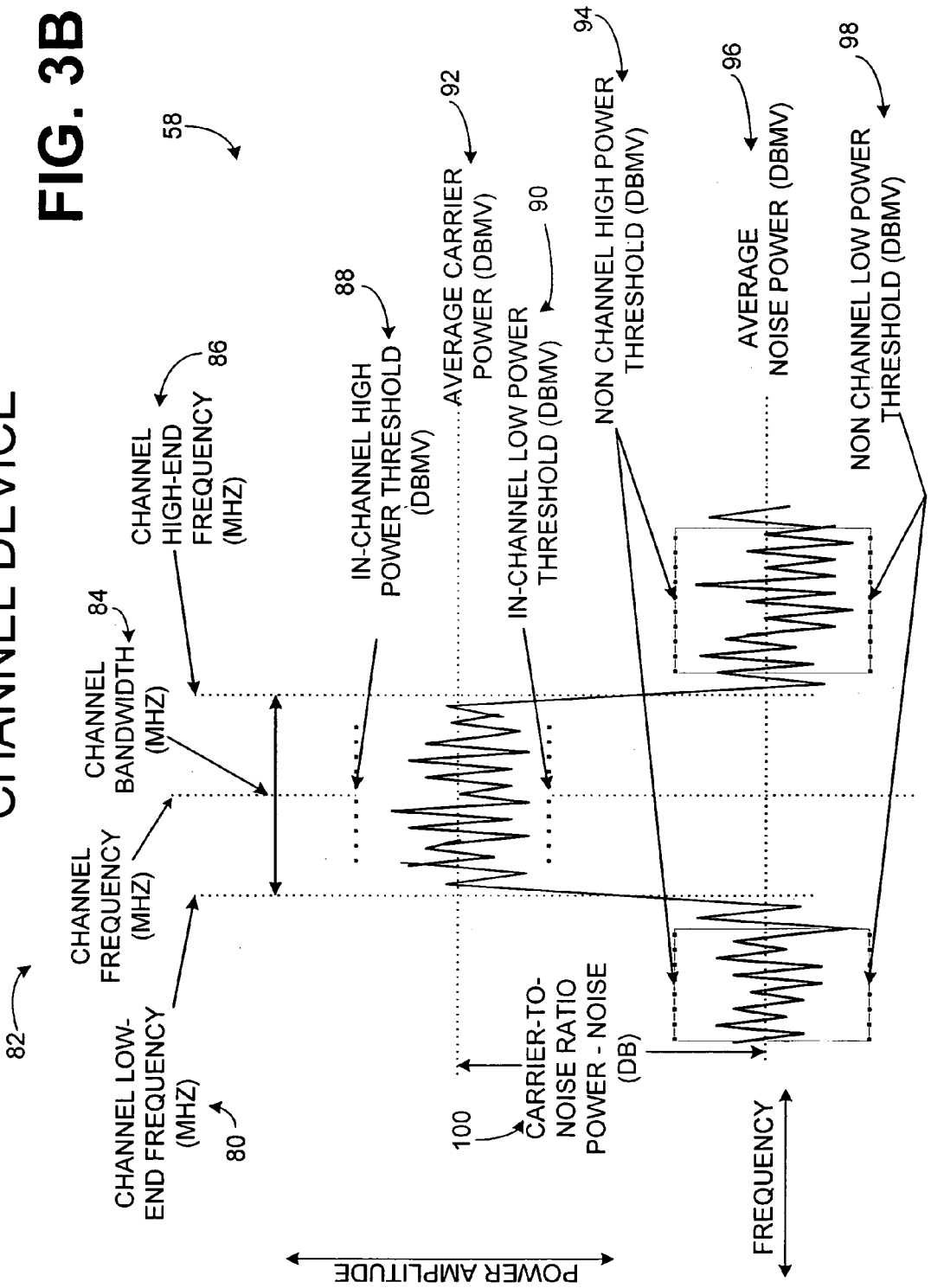
FIG. 3B is a graphical illustration showing data that can be contained within a channel object of FIG. 3, which corresponds to a particular device type contained within a channel plan.
Figure 3C:
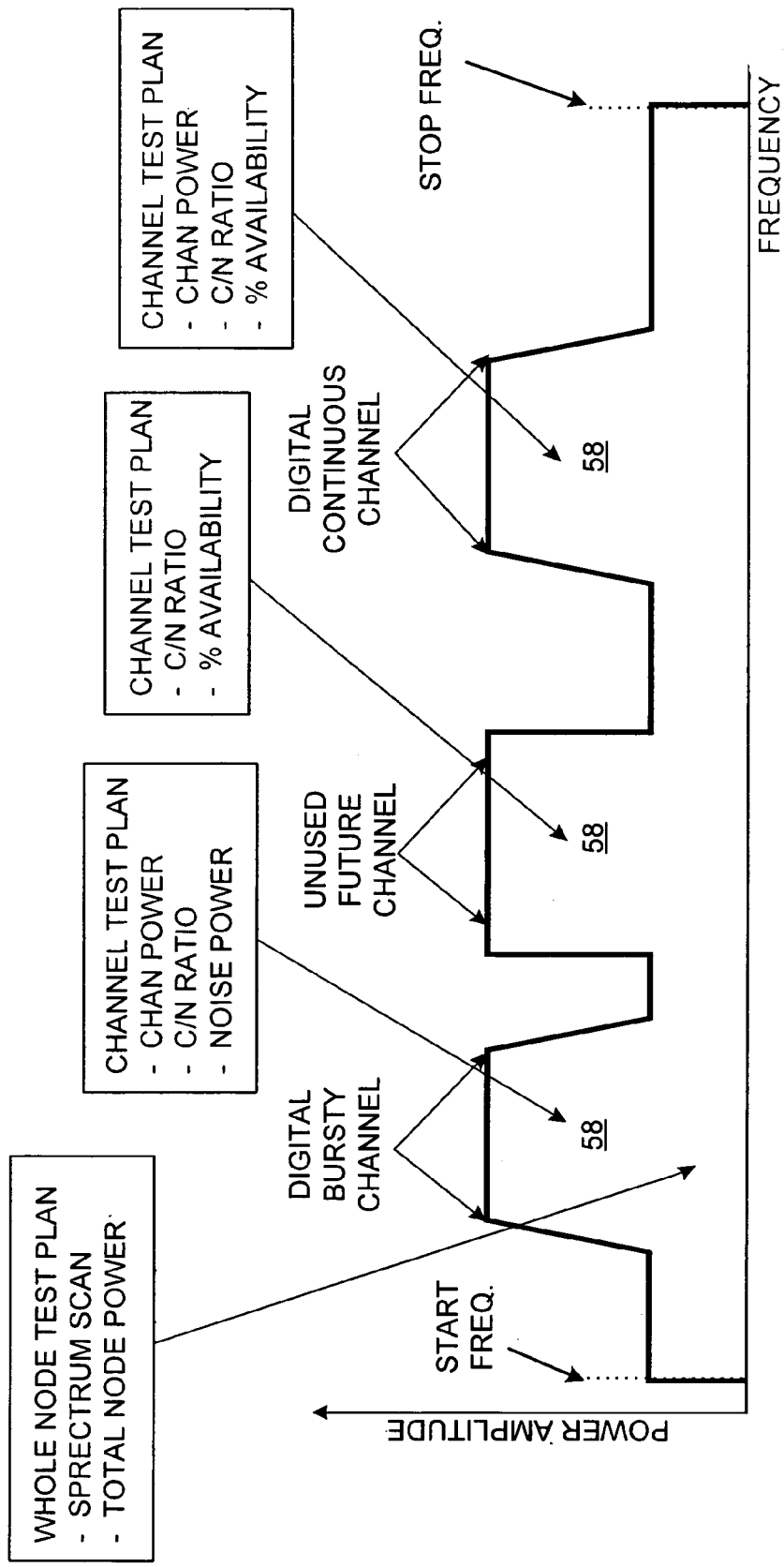
FIG. 3C is a graphical illustration showing data that can be contained within the test plan object of FIG. 3, which corresponds to a test plan associated with a channel plan.
Figure 3D:
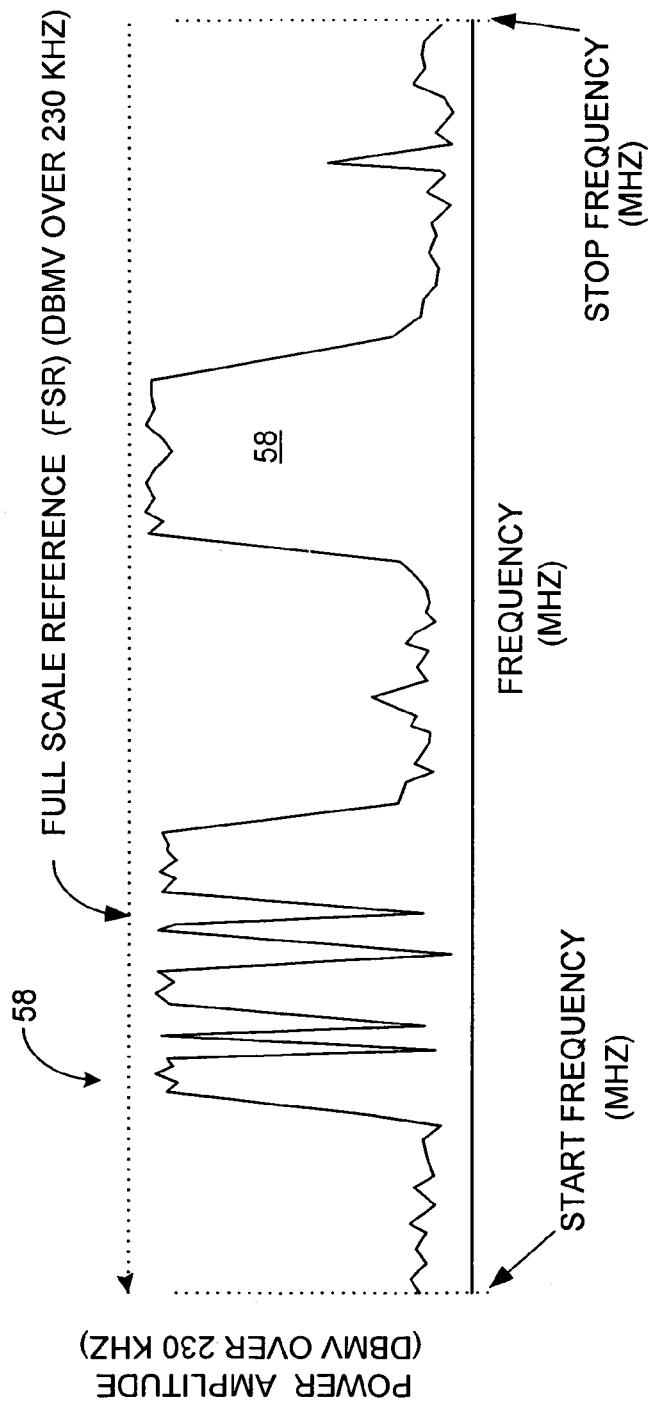
FIG. 3D is a graphical illustration of a spectrum scan test, which may be specified as part of a test plan object of FIG. 2.
Figure 3E:
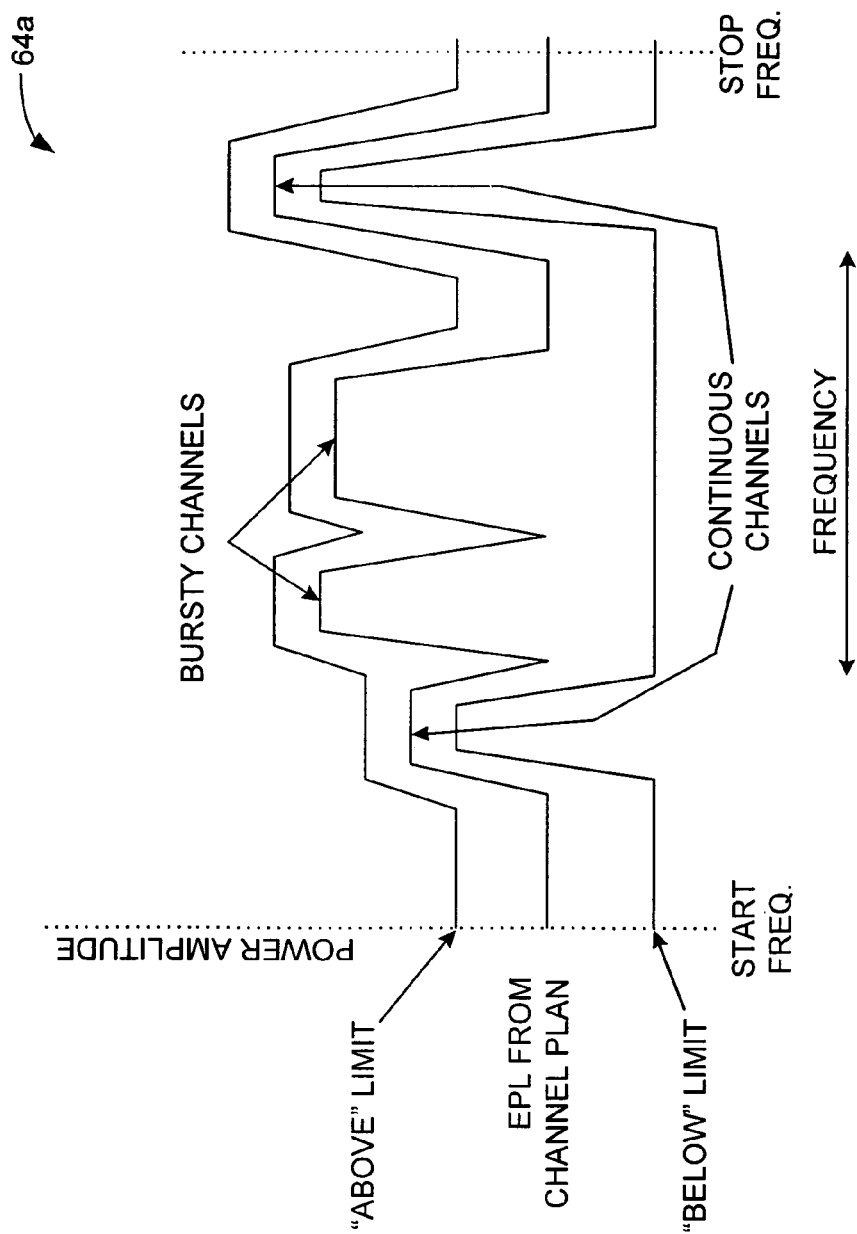
FIG. 3E is a graphical illustration showing how alarm limits can be set in connection with the spectrum scan test, which may be specified as part of a test plan object of FIG. 2.
Figure 3F:
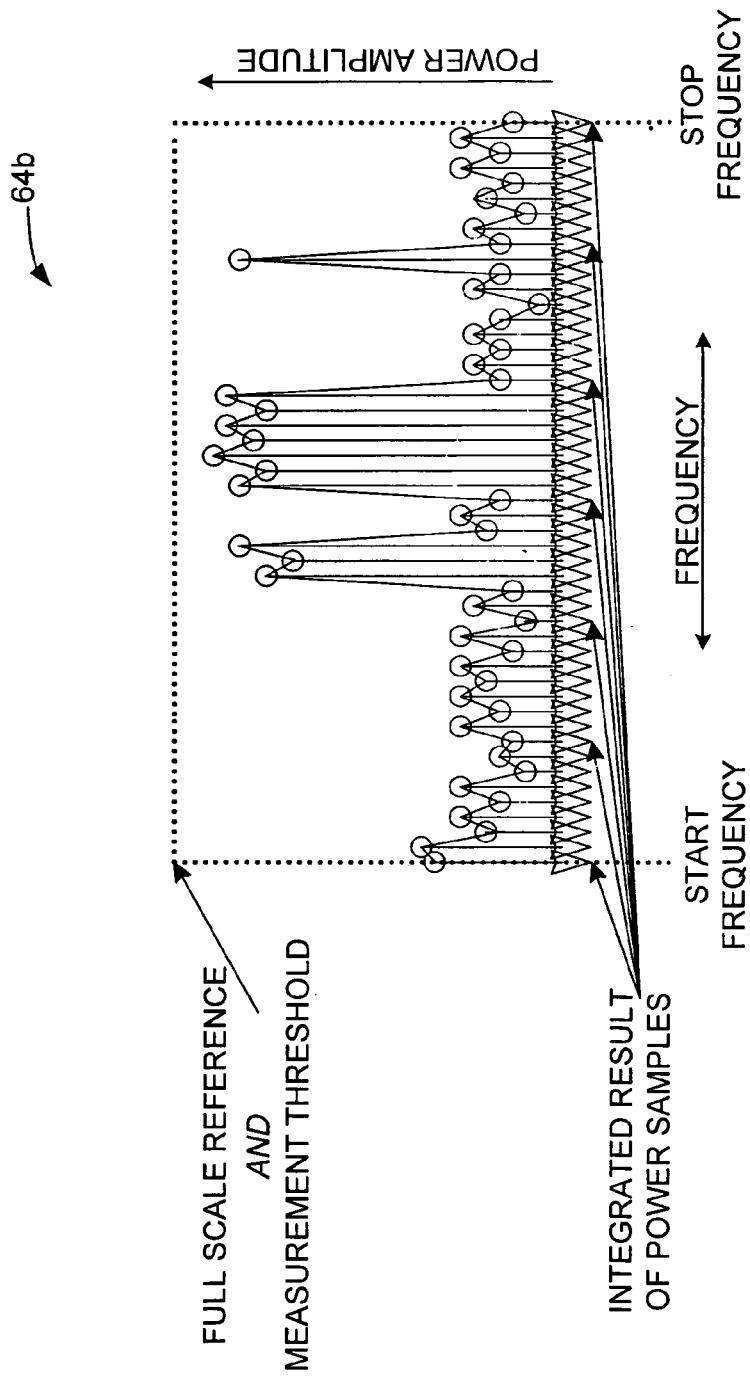
FIG. 3F is a graphical illustration showing how alarm limits can be set in connection with an average noise power test, which may be specified as part of a test plan object of FIG. 2.
Figure 3H:
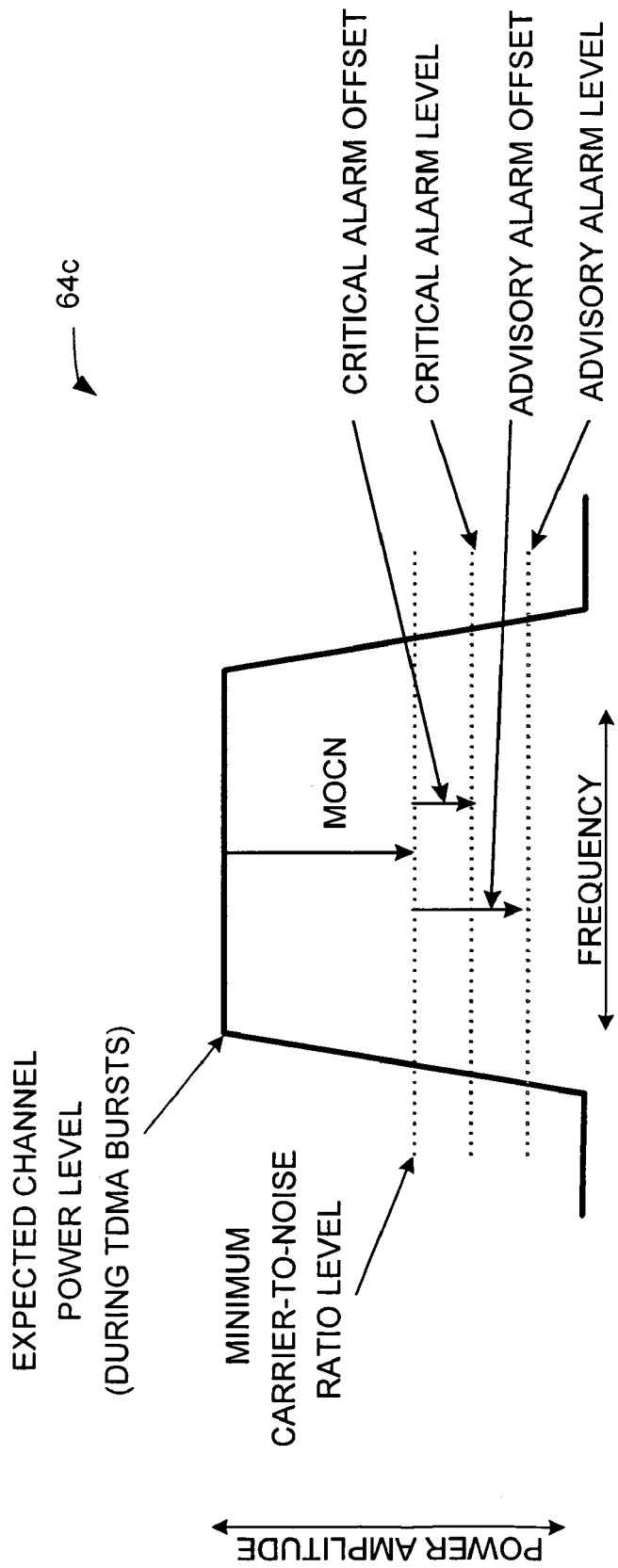
FIG. 3H is a graphical illustration showing a total node power test, which may be specified as part of a test plan object of FIG. 2.
Figure 31:
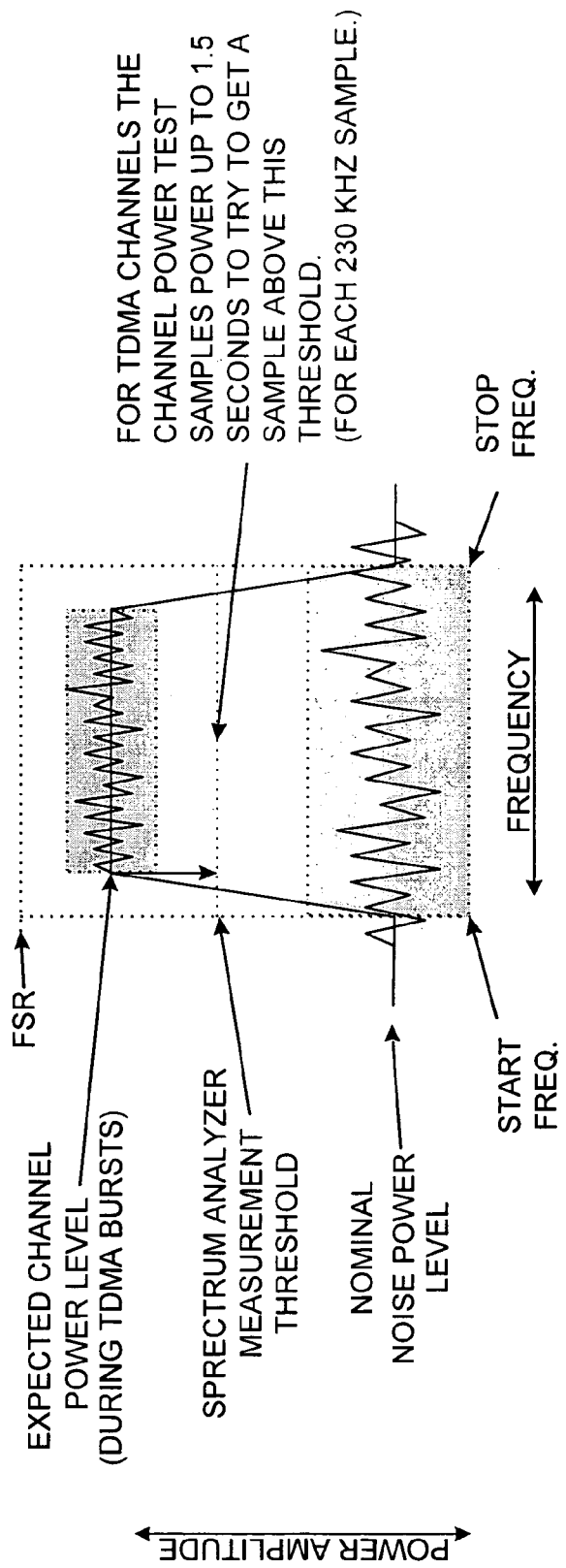
Figure 3J:
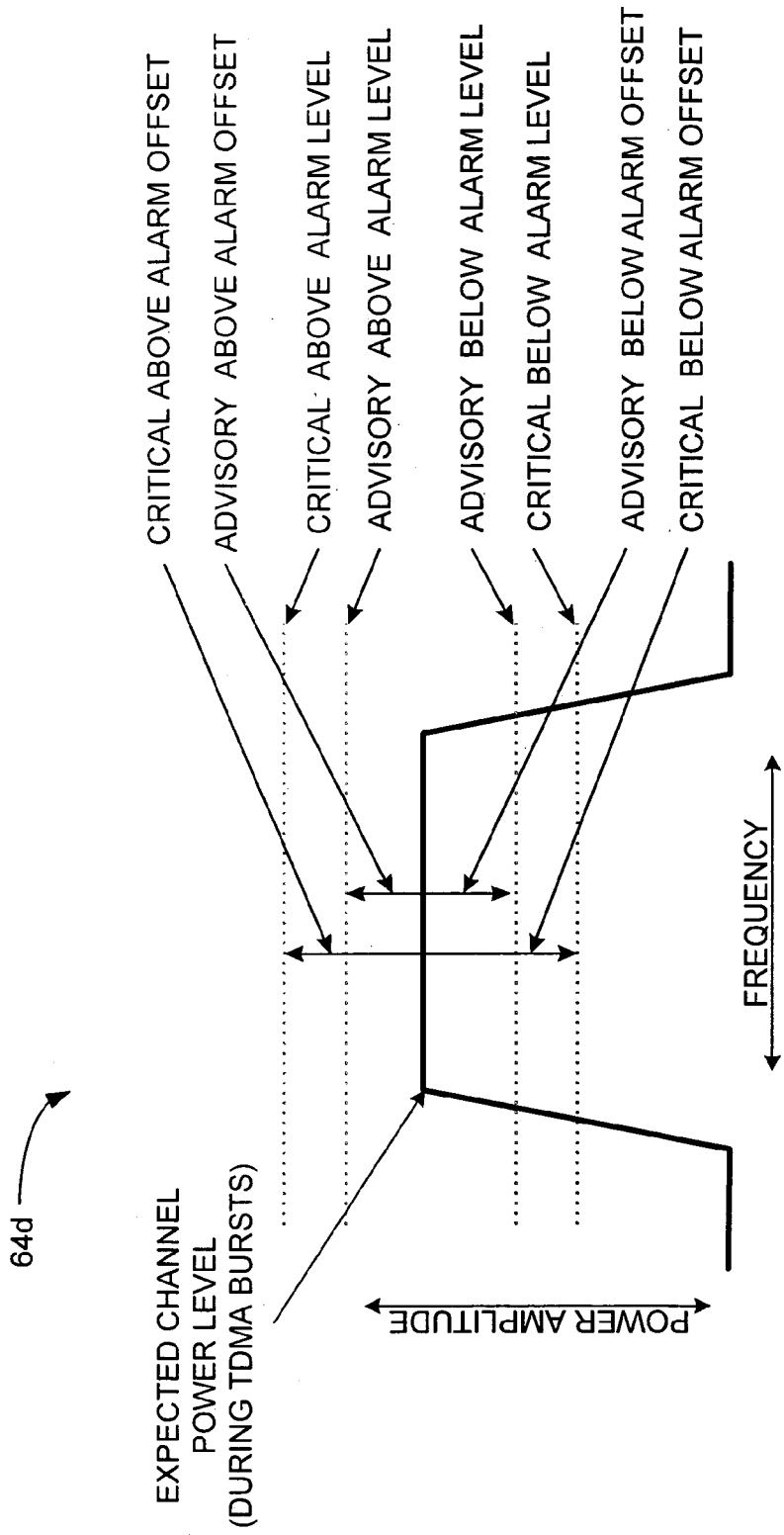
FIG. 3J is a graphical illustration showing alarms thresholds that may be defined in connection with the channel power test of FIG. 3I.
Figure 3K:
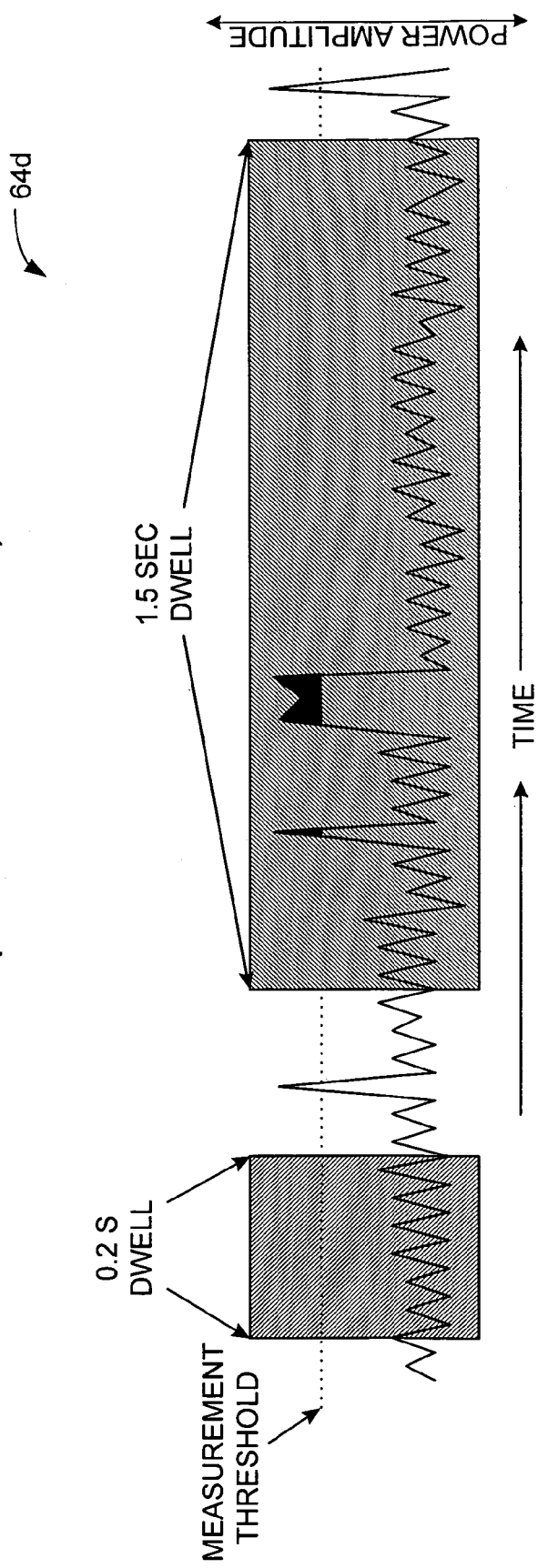
FIG. 3K is a graphical illustration showing a channel power test for a time division multiple access (TDMA) bursty channel, which may be specified as part of a test plan object of FIG. 2.
Figure 3L:
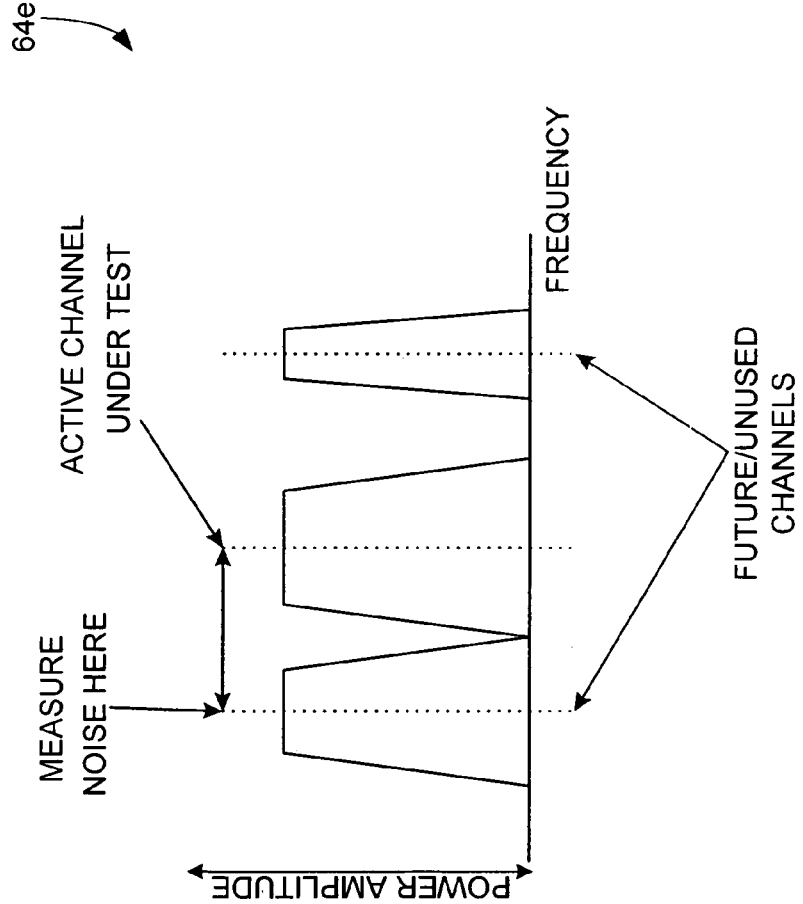
FIG. 3L is a graphical illustration showing a channel-to-noise (C/N) test, which may be specified as part of a test plan object of FIG. 3.

The 3010H spectrum analyzer 12 has several unique ingress measurement capabilities that are utilized by the monitoring system 10', which are listed as follows and which will be described in detail hereafter:

(a) spectrum scan measurement: a measurement of power amplitude versus frequency; see FIG. 3D;

(b) average power measurement: a measurement of integrated power level over a specified bandwidth; the 3010H spectrum analyzer 12 is able to measure the noise within the bandwidth of an active, bursty signal by "masking" signal bursts; see FIGS. 3I–3J;

(c) channel power measurement: a measurement of integrated operating power level of a transponder or communications device over its bandwidth for both continuous and bursty (for example, TDMA signals) modem types; bursty modem power levels are measured by the 3010H spectrum analyzer 12 while they are bursting on; see FIG. 3G; and (d) burst counter measurement: a measurement of the duration of energy bursts; the analyzer measures energy bursts above a specified power level, records the duration of the bursts, and reports a summary of the burst counts by duration; see FIG. 3L for more details.

Power measurements are typically reported in units of dBmV over a specified bandwidth. Users are typically familiar with dBmV over 4 MHz, which is a useful reference in the forward path. However in the reverse path of a node 18, there is no "standard" bandwidth for comparison.

The 3010H spectrum analyzer 12 measures power in reference to its fixed resolution bandwidth of 230 kHz. Most results, including the spectrum scan, report dBmV values relative to 230 kHz. However, the 3010H average power and channel power measurements automatically convert their results to the bandwidth of the measurement specified by the user. Thus, a channel power measurement of a 6 MHz wide channel will be reported in dBmV over 6 MHz.

The monitoring system 10' (as well as the second and third embodiments thereof) follows the standard of the 3010H and reports spectrum scan levels relative to the 3010H resolution bandwidths and channel power measurements relative to the channel bandwidth. As a result, the equation for converting bandwidth to power, or vice versa, is as follows:

Power(dB)=log (measured $BW$/desired $BW$)*10, where BW is bandwidth.

The spectrum scan measurement is performed by the 3010H spectrum analyzer 12 as follows. The 3010H spectrum analyzer 12 plots 222 amplitudes between a start and stop frequency specified by the user. The user also specifies a full scale reference (FSR), which sets the 3010H spectrum analyzer's input attenuators to the proper region. The 3010H spectrum analyzer 12 has a dynamic range of approximately 65 dB, so the FSR should be set several dB above the highest power level present. The power amplitude (y axis) is shown in dBmV over 230 kHz, i.e., the 3010H resolution bandwidth.

The 3010H average power measurement is a flexible measurement that reports the integrated power level over a specified bandwidth. It can measure the total power present within a bandwidth, or it can measure the noise power within a bursty carrier bandwidth by masking the carrier. The 3010H spectrum analyzer 12 steps through the specified bandwidth in 230 kHz increments measuring the power at each point. The 3010H spectrum analyzer 12 then integrates all the individual measurements are reports the power in dBmV over the bandwidth specified.

The 3010H spectrum analyzer 12 can perform an average power measurement. This measurement can be used to measure the noise power within a bursty channel. The 3010H spectrum analyzer 12 has a measurement threshold that enables the instrument to distinguish carrier power from noise. The user sets this threshold at a level below the expected carrier power level, close to the expected noise level. At each 230 kHz increment, the instrument measures the power level and compares it to the threshold. If the reading is above the threshold, it retries the measurement. If after 10 tries the power is still above the threshold, it uses the last reading.

The average power measurement cannot be used to measure the noise power within the bandwidth of a continuous channel. Since the carrier power is always present, there is no point in time where the 3010H spectrum analyzer 12 can see the noise floor to measure it.

The accuracy of the noise power measurement within a bursty channel is very dependent on the measurement threshold. If the threshold is too close to the channel power level, some of the channel signal may pass as noise. Furthermore, if a channel bursts on for a long period (>200 mS), the average power test will exceed 10 retries and then use the last measurement. This will cause the overall noise power to be overstated.

The channel power test 64d performed by the 3010H spectrum analyzer 12 is similar to the average power test in that it measures integrated power over a bandwidth. However, it is designed to measure the power of the channel, not the noise. It can measure the power of both continuous and bursty carriers. Results are reported in dBmV over the specified channel bandwidth.

In order to measure the power associated with bursty channels using the channel power test 64d, the 3010H spectrum analyzer 12 has a measurement threshold (similar to the average power test) that distinguishes between carrier power and noise. The user sets this threshold several dB below the carrier power level. At each 230 kHz increment, the instrument measures the power level and compares it to the threshold. If the reading is below the threshold, it retries the measurement. It retries for a user defined period of time, up to 1.5 seconds per increment. If the retry period expires, the instrument uses the last power level measured. Because of the foregoing algorithm, the channel power test 64d can take quite a bit longer to run than the average power test.

The channel power test 64d does not work well for intermittent channels where signal bursts occur infrequently. For the measurement to work properly, the communications device needs to burst on at least once every 1.5 seconds. Some modem models communicate a regular "heartbeat" even if there is no data to transmit. Other designs may communicate only when there is data to transmit. The channel power test 64*d* could underreport the power of the later type of communications device during periods of low use.

The burst counter test performed by the 3010H spectrum analyzer reports on the number of energy bursts that are present at a given frequency by burst duration. A user-defined measurement threshold is used to distinguish burst events. Energy levels above the threshold constitute a burst. When the energy level exceeds the threshold, the 3010H spectrum analyzer 12 records the duration of time above the threshold. The burst is recorded in a counter per the length of the burst.

There are seven counters segmented as follows: for bursts less than 0.1 mS, less than 1 mS, less than 10 mS, less than 100 mS, less than 1 second, less than 3 seconds, and greater than 3 seconds. The result of the burst counter test 64*f* is essentially the count of each of the foregoing seven burst duration counters.

With reference to FIG. 1A, the data acquisition/analysis system 14 is preferably implemented as a computer-based system, although other non-computer controller-based systems may be possible. The data acquisition/analysis system 14 includes a local computer 22, which preferably is situated locally with respect to the spectrum analyzer 12 and the switch 16, and one or more remote computers 24, which are situated remotely from the local computer 22. The computers 22, 24 can be personal computers, workstations, minicomputer, mainframe computers, or other systems for executing software. The local computer 22 executes a control process software 26 (server process), implemented in software, that controls the spectrum analyzer 12 and the switch 16. Preferably, the control process software 26 is stored in a memory(ies) (not shown, for simplicity) associated with the computer 22 and is executed by a suitable processor (not shown) associated therewith. In the preferred embodiment, the source code of the control process software 26 is written in C+ programming language and is executed on a Windows NT operating system (O/S). The control process software 26 maintains, updates, and reads data from a database 28, which stores signal data. The database 28 can be any suitable database, but is preferably a object oriented database for flexibility. Generally, the control process software 26 controls the switch 16 via a control connection 34 to select one of the nodes 18 for analysis and causes the spectrum analyzer 12 to sample signal data from the one node 18 that has been accessed by the switch 16 via connection 36. The signal data captured by the spectrum analyzer 12 is then forwarded to the local computer 22 via the connection 27 and stored in database 28 under command of the control process software 26. The control process software 26 is capable of analyzing the signal data in the database 28 and making information pertaining to the signal data available to the user of the computer 22 as well as the user of the remote computer(s) 24.

In envisioned alternative embodiments, the switch 16 may be configured to connect concurrently a plurality of nodes 18 to a suitable spectrum analyzer 12 or combination of analyzers 12 that can concurrently analyze signals on the plurality of nodes 18. This configuration would obviously increase the rate of analysis, but this alternative embodiment may not be cost effective or necessary for the application.

In this first embodiment, the remote computer 24 includes, a graphical user interface (GUI) 32, which is also implemented in software and is essentially a client process relative to the server control process software 26 of the computer 22. Preferably, the GUI software 32 is stored in a memory(ies) (not shown) associated with the computer 24 and is executed by a suitable processor (not shown) associated therewith. In the preferred embodiment, the source code of the GUI software 32 is written in Visual Basic programming language and is executed on a Windows NT operating system (O/S). The remote computer 24, when used in the context of a cable television network, could be situated at a corporate office, network operations office, or a field office. The GUI software 32 enables, among other things, remote access to the signal data in the database 28 and the ability to control the spectrum analyzer 12 and switch 16.

It should be noted that the programs associated with the GUI software 32 as well as the control process software 26, which each comprise an ordered listing of executable instructions for implementing logical functions, can be embodied in any computer-readable medium for use or transport. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Still referring to FIG. 1A, the switch 16 can be any suitable device for connecting one (or more in alternative embodiments) of the nodes 18 to the spectrum analyzer 12 under the control of the computer 22 of the data acquisition/analysis system 14 via control connection 34. In the preferred embodiment, the switch 16 is a 1×32 port radio frequency (RF) switch with auxiliary test port, which is manufactured by and commercially available from Quicktech Electronics, Inc., U.S.A. The switch 16 is essentially comprised of a network of switching transistors (FET) for selectively switching access to the channels.

FIG. 1B is a block diagram of a second embodiment of the monitoring system of the present invention and is generally denoted by reference numeral 10". The monitoring system 10" is architected so that a single computer 22 executes both the control process software 26 and the GUI software 32. In this embodiment, the data acquisition/analysis system 14 can be situated locally or remotely relative to the spectrum analyzer 12. Furthermore, in this embodiment and the others, it is envisioned that the spectrum analyzer 12 could be situated locally or remotely relative to the switch 16.

FIG. 1C is a third embodiment of the monitoring system of the present invention and is generally denoted by reference numeral 10'''. In the monitoring system 10''', the control process software 26 and the GUI software 32 are implemented within or as part of the spectrum analyzer 12.

II. Data Structure of Database

Figure 2:
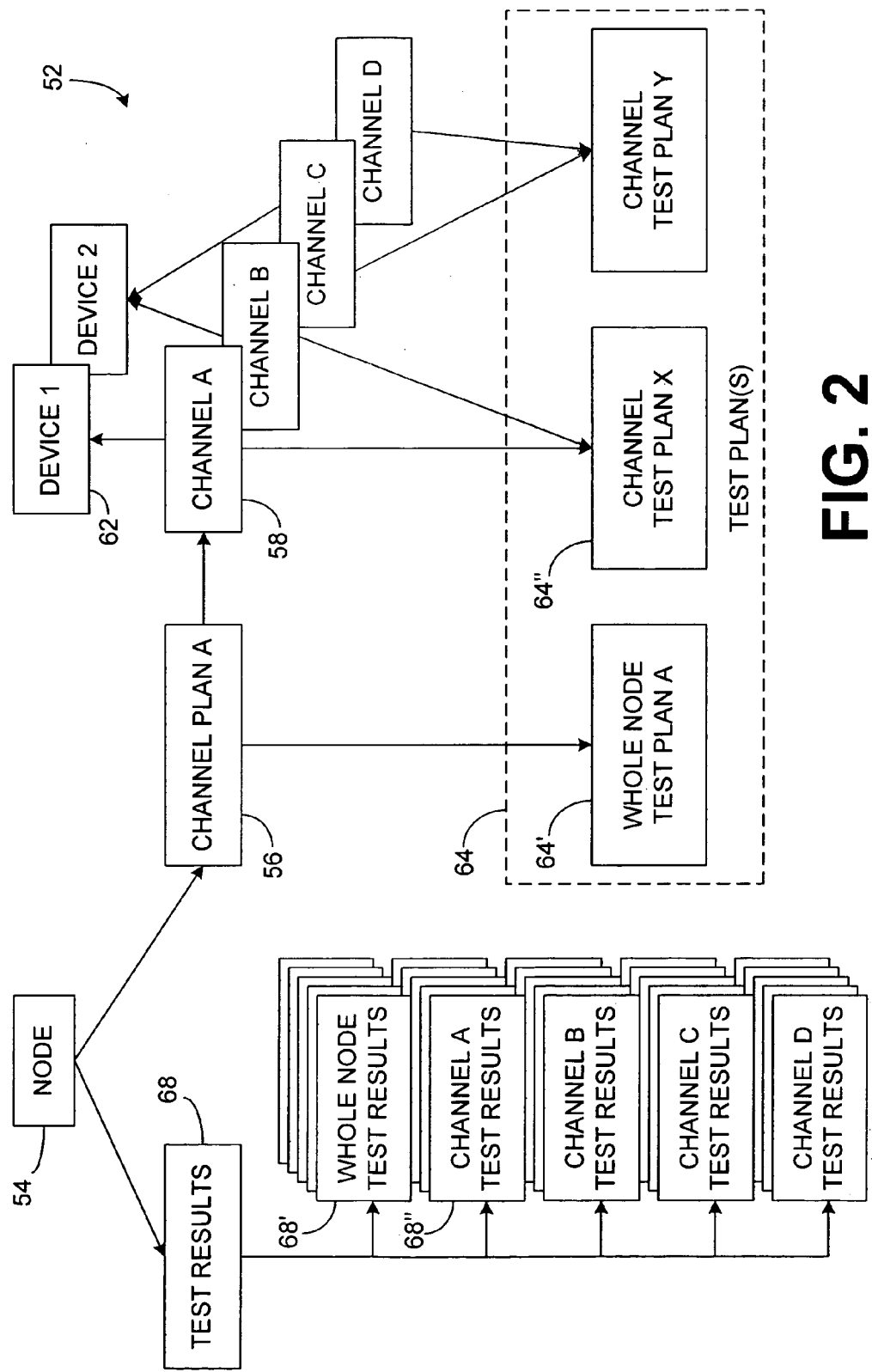
FIG. 2 is a diagram of the data structure associated with the database of FIGS. 1A–1C, which includes one or more channel plan objects, channel objects (corresponds to a particular device type) within said channel plan objects, test plan objects associated with the channel plan objects or the channel objects, and test plan result objects storing results of respective test plans.

FIG. 2 is a diagram illustrating the data structure of the object-oriented database 28 (FIGS. 1A–1C) for storing signal data. Essentially, the data structure 52 of FIG. 3 illustrates the content of and the linking of objects within the database 28, which is preferably a suitable object oriented database. As illustrated in FIG. 2, a channel plan 56 is associated, or linked, to a node 54. The channel plan 56 specifies the signal characteristics of one or more signal channels 58 (labeled "A" to "D" in FIG. 2) associated with the corresponding node 18 (FIGS. 1A–1C). Each channel 58 specifies the signal characteristics of a particular type of communications device 62 from a particular vendor. As shown, more than one channel 58 can specify the same type of communications device 62. One or more test plans 64 may be associated with each channel plan 56. A whole node test plan 64' may be associated with an entire node of the channel plan 56. A channel test plan 64" may be associated with one or more channels 58 of the node 18 corresponding with the channel plan 56. One or more test results 68 may be associated with the node 54. Finally, the test results 68 can include whole node test results 68' and/or channel test results 68".

FIG. 3A is a graph visually showing an example of the possible contents of a channel plan 56 (FIG. 2) and its corresponding object in the database 28. The channel plan 56 (and its corresponding object in the database 28 of FIGS. 1A–1C) includes a specification of one or more channels 58. In the preferred embodiments, for each channel 58, the channel plan 56 includes at least the following: a center frequency, a bandwidth, power level of the carrier signal (dBmV), and a label identifying use of the channel 58. The channel plan 56 may further include, optionally and among other things: information about the carrier roll-off (optional), default status (i.e., allocated or future), default threshold levels for various tests, and frequency hopping characteristics (list of alternate frequencies, if any).

FIG. 3B is a graph visually showing an example of the possible contents of a database object corresponding with a channel 62 (FIG. 2). The object corresponding with a channel 62 essentially defines the signal characteristics of a particular communications device 62. Obviously, other non-mentioned information could be stored in connection with such a database object and/or also information derived from that shown in FIG. 3B.

FIG. 3C is a graph visually showing an example of the possible contents of a database object corresponding with a test plan 64 (FIG. 2). The object corresponding with a test plan 64 essentially defines the one or more tests to be performed on the node or channel, whichever is applicable.

III. Channel Plan and Test Plan Methodology

Generally, the channel plan 56 captures the information about the frequency spectrum of a connection, or node, that is necessary to configure automated tests pursuant to a test plan 64. The channel plan 56 has information about the overall path as well as each individual channel 58 operating within the path.

The monitoring system 12 makes it easy to create as many variations of channel plans 56 as needed to reflect differences between the many nodes 18 within a TV cable system. Moreover, while the channel plan 56 typically refers to one or more return paths, it can be used for the forward paths as well. The channel plan 56 is constructed by first focusing on communications devices 62, which represent the modems or other transponders communicating within the spectrum. The monitoring system 12 enables the user to capture the key operational specifications for a communications device 62 in one location. The device specifications may include, for example but not limited to, the following information: (a) expected channel power level (power level of communications device 62 if it is on 100% of the time); minimum operational carrier-to-noise ratio (MOCN) (below which the communications device 62 will not function properly); occupied bandwidth, typically to the 40 dB drop-off point; and type of communications device 62. See FIG. 3B for other parameters that may be specified in connection with each device and its corresponding template.

The MOCN parameter for a communications device 62 is a key concept for the monitoring system 12. It is important to set this parameter to a reasonable value, because of its effects on automated measurements. The MOCN parameter should be set to the carrier-to-noise ratio at which the communications device 62 will no longer function correctly. If the noise floor gets within MOCN decibels of the carrier power, data transmission will degrade. The measurement thresholds and alarm limits use MOCN extensively as will be described hereafter.

The communications device type describes the general characteristics of the signal from the communications device 62. The monitoring system 12 uses this information to select an appropriate default test plan 64 for the communications device 62. There are currently the following types of communications devices 62:

(a) future/unused: a bandwidth currently not used; may be allocated to represent a communications device 62 to be deployed at a future date, or simply a guardband where noise measurements can be taken;

(b) digital bursty: a digital communications device 62 which bursts on and off, for example a TDMA device 62;

(c) digital continuous: a digital communications device 62 in which the signal never blanks off;

(d) digital bursty frequency hopping and digital continuous frequency hopping: same as the previous two types except the communications device 62 can change to an alternate frequency range dynamically; the monitoring system 12 does not take channel power measurements for these channels 58;

(e) analog continuous: an analog signal which is always present; and (f) analog intermittent: a periodic analog signal, for example but not limited to: PPV and CB Radio.

The monitoring system 12, particularly, the control process software 26, maps out the frequency allocation scheme for one or more nodes 18. Every node 18 must have a channel plan 56 for it to be tested automatically. Several nodes 18 with the same allocation scheme can share a single channel plan 56.

As shown in FIG. 3A, the channel plan 56 defines the start and stop frequencies of the spectrum to be tested, typically 5 to 42 MHz for a return path in a cable system application. It also contains a list of channels 58, which are the specific communications devices 62 operating at various allocated frequencies within the spectrum and described on the previous slides. Each channel 58 has a unique center frequency.

As illustrated in FIG. 3C, each channel 58 (or communications device 62) of a node 18 as well as the entire node (perhaps return path in a cable television application) can have a test plan 64 assigned that controls which tests are to be performed and what the alarm limits are to be. The channel plan 56 is central to automated testing. The testing philosophy is to compare the expected operational levels for the various communications devices 62 to the actual measured values. The channel plan 56 encompasses all the expected values for all the services operating on a given node and all the information necessary to configure analyzer tests automatically.

Each communications device type has a factory default test plan 64 which can be used and modified, or can be used to create new test plans 64 for channels 58, as desired.

One key principle is that the actual operational levels of the nodes 18 are compared against the expected levels given in the channel plan 56. With the expected values specified by the user, the control process software, 26 (FIGS. 1A–1C) of the data acquisition/analysis system 14 (FIGS. 1A–1C) has all the information necessary to set up each of the analyzer measurements automatically. This is advantageous because the ingress measurements of the 3010 spectrum analyzer 12 can be challenging to configure correctly. The control process software 26 takes care of the details regarding configuring each measurement. By configuring the various measurement parameters for the analyzer 12 from the channel plan 56, the control process software 26 ensures that the measurements are taken accurately and consistently.

A. Automated Tests

The monitoring system 10 implements tests based on the intrinsic measurement capabilities of the 3010H spectrum analyzer 12. These tests can be divided into two categories: the tests that apply to the entire spectrum, and the tests that apply to individual channels 58 within the spectrum:

(a) entire spectrum tests:
(1) spectrum scan—frequency vs. amplitude across spectrum;
(2) total node power—total integrated power present across spectrum; and (3) discrete frequency scan (DFS) test—similar in concept to spectrum scan; tests power levels of specified frequencies at two different scan rates.

(b) channel specific tests:
(1) carrier-to-noise ratio (C/N)—carrier to noise for a given channel signal;
(2) average noise power—integrated power of noise floor within a channel 58;
(3) percentage availability—percentage of channel capacity "lost" to energy bursts;
(4) channel power—integrated power of the channel 58 as if channel 58 on 100% of time; and
(5) burst counter—energy bursts characterized over time.

B. Full Scale Reference (FSR)

All 3010H spectrum analyzer measurements make use of a full scale reference (FSR) parameter. The 3010H spectrum analyzer 12 has a dynamic range of approximately 65 dB, which means that it cannot simultaneously measure two power levels that are more than 65 dB apart. The FSR controls a step attenuator built into the instrument. Setting the FSR appropriately gets the 3010H spectrum analyzer 12 into the right ballpark to perform the measurement.

If the FSR is too high, then the spectrum analyzer 12 may not be able to analyze the noise floor of the system. This will typically undesirably result in sections of flat lines near the bottom of a spectrum scan, or a power measurement, that is overstated. On the other hand, if the FSR is too low, then the power level of the channels 58 of the system under test will saturate the input receiver of the spectrum analyzer 12. This undesirably results in spectrums with the tops cut off and/or inaccurate power measurements.

The FSR should be set above the highest channel power level in the return path, even if a given measurement does not include that particular channel bandwidth. This is because the input receiver detects all the power of the return path, not just the segment being measured.

In the preferred embodiments, the control process software 26 of the data acquisition/analysis system 14 sets FSR to the same value for all measurements on a node 18. The control process software 26 compares all the various power levels of channels 58 within the channel plan 56. The FSR is placed 6 dB above the highest level, to allow for variation within the signal and to catch the peaks of the power within the signal, and to ensure the most powerful signal in the return path does not saturate the 3010H receiver. The 3010H FSR is specified in dBmV over 230 kHz (the resolution bandwidth), so the control process software 26 automatically converts various channel power levels to dBmV over 230 kHz.

C. Thresholds Versus Alarm Limits

To better understand how automated tests work, it is important to understand the distinction between measurement thresholds and alarm limits.

Three of the intrinsic measurements of the 3010H spectrum analyzer 12 use thresholds to distinguish different power levels. The average power measurement uses a threshold to distinguish noise from channel power. The channel power measurement uses a threshold to catch TDMA channels 58 while bursting. The burst counter uses a threshold to distinguish the start and stop of an energy burst.

The 3010H spectrum analyzer 12 does not implement any sort of alarms. It only takes measurements. The alarms are generated by the control process software 26 when it compares the results of the various measurements against alarm limits. The alarm limits are specified by the user via the test plan 64 for a particular channel type.

The channel plan 56 of a node 18 specifies the expected operational power levels and C/N tolerances for any given channel 58, and the alarm limits specify how far the measured results can deviate from the expected value before an advisory or critical alarm is generated.

D. Spectrum Scan Test

FIG. 3D shows the spectrum scan test 64a. The spectrum scan test 64a applies to an entire channel 58 of a connection (e.g., a return path of a node 18). As shown in FIG. 3D, besides the FSR described previously, the input parameters are the start and stop frequencies of the return path as specified within the channel plan 56 for the connection (e.g., node 18).

If the channel plan 56 has no channels 58, then the control process software 26 will default the FSR to 0 dBmV. In this case, it is useful to set up a future/unused channel 58 to provide a reference power level.

The alarm limits for the spectrum scan measurement are illustrated in FIG. 3E. The alarm limits of the spectrum scan measurement can be composed of line segments in roughly the same shape as the channel plan 56. Each spectrum scan alarm limit is custom fit to a particular channel plan 56. The user can edit the default threshold by moving vertex points and additional points to modify the shape. The "above" threshold tracks the tops of the channels 58. The "below" threshold is below the expected noise floor level, except under continuous channels 58, where it jogs up under the channel 58 as shown. It is important to note that while only an advisory alarm for the spectrum scan measurement is illustrated in FIG. 3E, the channel plan 56 also has the capability to configure a critical alarm limit custom fit to the particular channel plan 56.

E. Discrete Frequency Scan (DFS) Test

The DFS test provides a rapid measurement across a series of user-defined frequencies. These level measurements provide both a short sample and long peak detected measurement at each frequency, comparable to viewing a spectrum with two distinct scan rates. The DFS test helps identify potential interference sources quickly and efficiently.

F. Total Node Power Test

The total node power test 64b is illustrated in FIG. 3F and is described hereafter. The total node power test 64b applies the average power test over the entire return-path spectrum. The total node power test 64b does not depend on the channel plan. The purpose of the test 64b is to record total node power over time to enable a technician to detect broadband problems that may not have introduced an individual signal channel critical alarm or advisory alarm, which if left unresolved may result in multiple signal channel failures.

The total node power test 64b is performed using the intrinsic 3010H spectrum analyzer average power test with the start and stop frequencies set to the start and stop frequencies of the network node under test, and the measurement threshold set at the FSR. With the measurement threshold set equal to the FSR, the average power test measures all power present across the entire frequency spectrum of the node under test. In this regard, the average power test result consists of both noise power and channel signal power. The 3010H spectrum analyzer 12 performs an average power test every 230 kHz, which is the resolution bandwidth of the 3010H spectrum analyzer 12, across the entire return-path spectrum as defined by the start and stop frequencies of the channel plan 56. Upon completing each 230 kHz step across the return-path spectrum, the 3010H spectrum analyzer 12 records a power level sample for that particular 230 kHz frequency segment. After generating power level samples associated with each of the individual 230 kHz segments, the 3010H spectrum analyzer 12 integrates the individual measurements across the entire return-path spectrum.

1. Node Level—Total Node Power Results Display

The total node power measurement returns a single numeric result, measured in dBmV over the bandwidth of the return-path frequency spectrum. Each time that the control process 26 triggers the 3010H spectrum analyzer 12 to perform the total node power measurement on the node 18, the control process records the result in database 28. The data acquisition/analysis system 14 is configured to retrieve data stored in database 28 for communication to graphical user interface 32. In this way, a service technician can retrieve and plot the total node power test 64b results versus time to reveal trends in node 18 power health.

In this regard, the system operator wants to keep the total node power within an acceptable operating range. The acceptable operating range may be defined by both upper and lower critical alarm limits. Too much total power can cause "clipping" within the system resulting in an undesirable loss of service. Conversely, too little power may indicate an amplifier failure or a network discontinuity (i.e., a cable cut). It is important to note that total node power on a particular node 18 within a network may vary over time due to influences other than an amplifier failure or a complete network discontinuity. For at least these reasons it is important for network service technicians to monitor total node power over time.

To enable total node power monitoring over time, the control process 26 provides two alarm levels, advisory and critical, both above and below the desired operational power range. The user specifies these alarm limits as absolute power levels in dBmV over the bandwidth of the return-path spectrum. In this manner, the system of the present invention may alert the user to node health conditions.

Figure 11A:
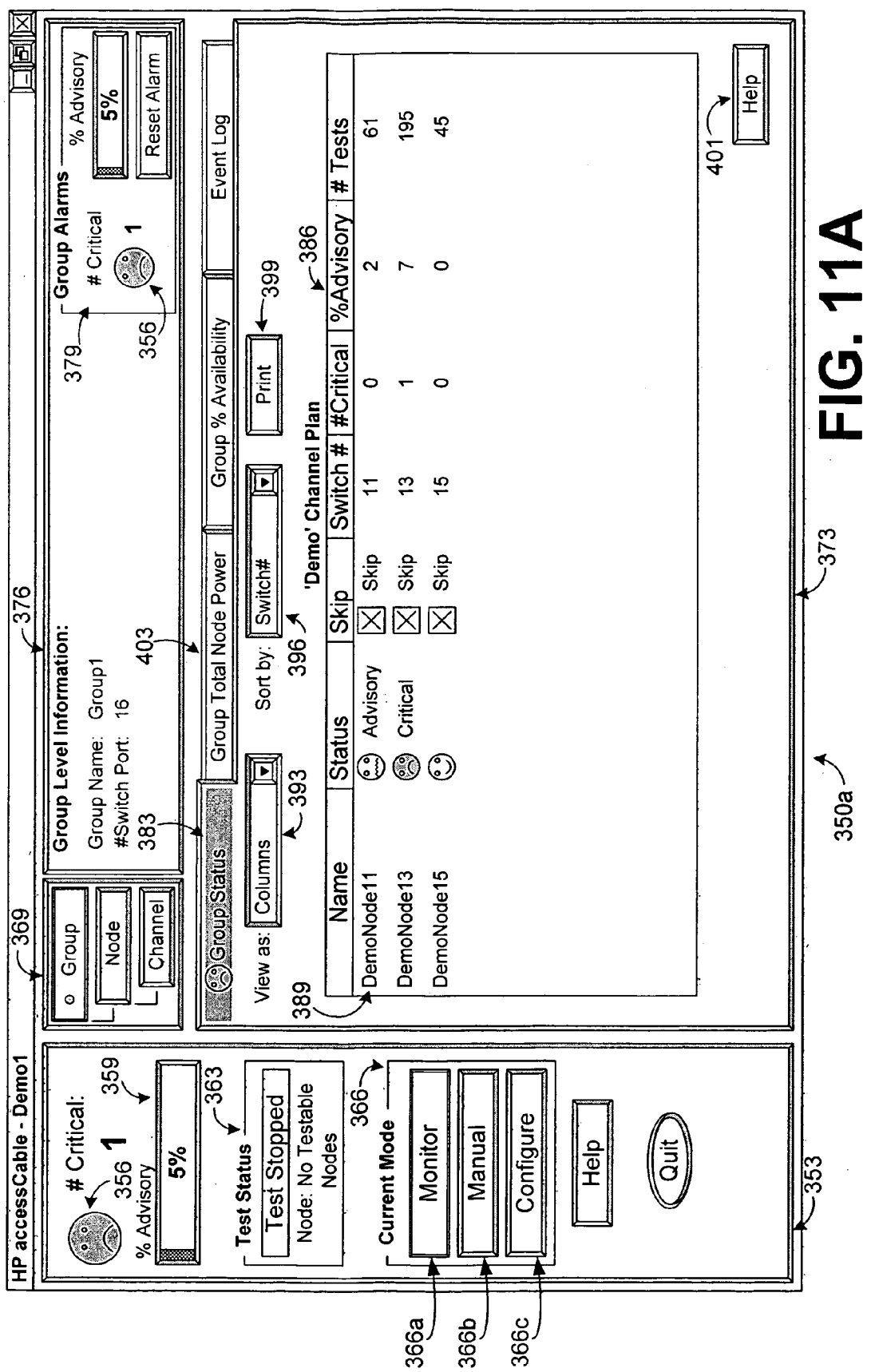
FIGS. 11A–11K are display screens generated by the GUI software of the monitoring system of FIGS. 1A–1C for enabling a user to analyze test data.
Figure 11B:
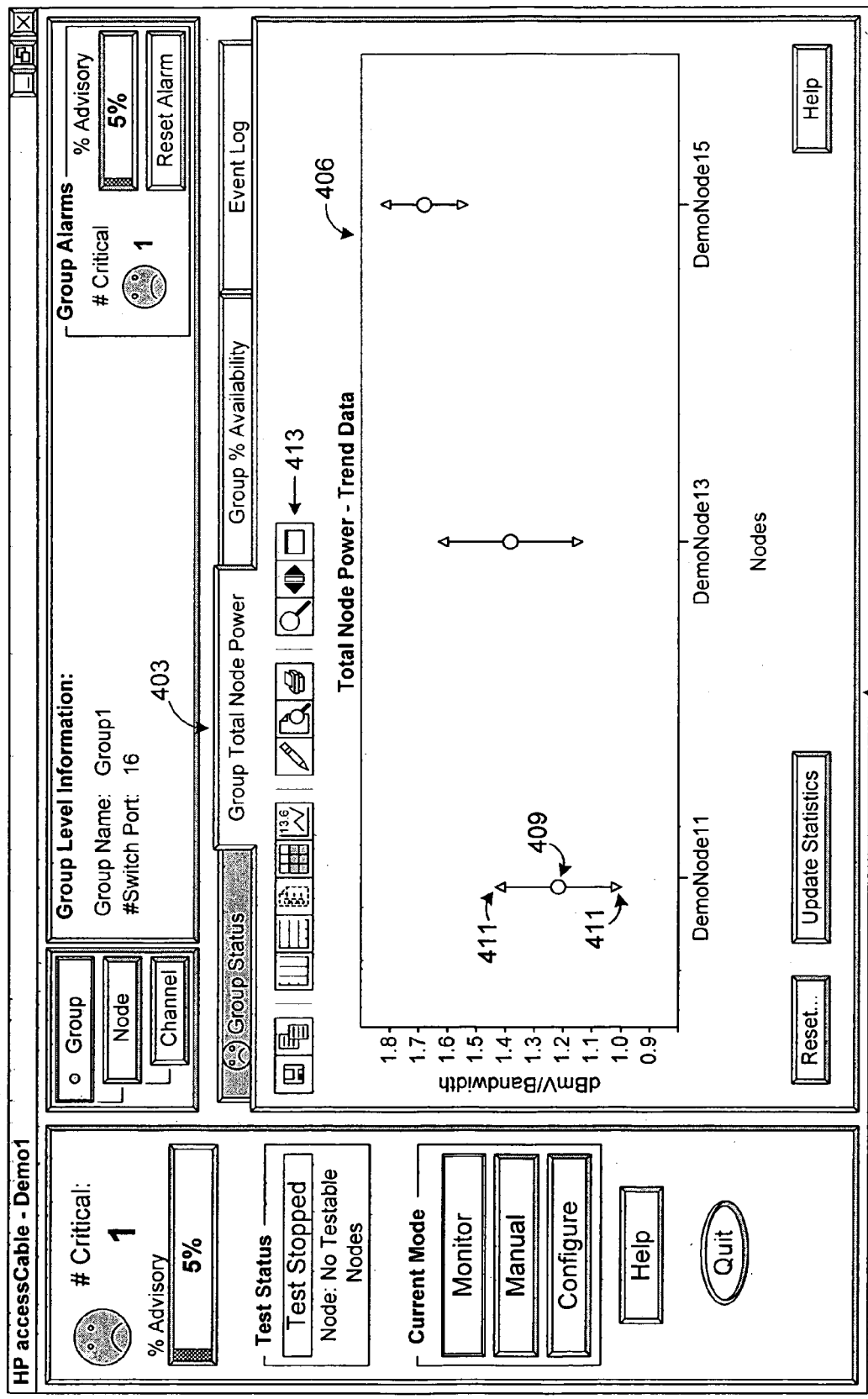
Figure 11C:
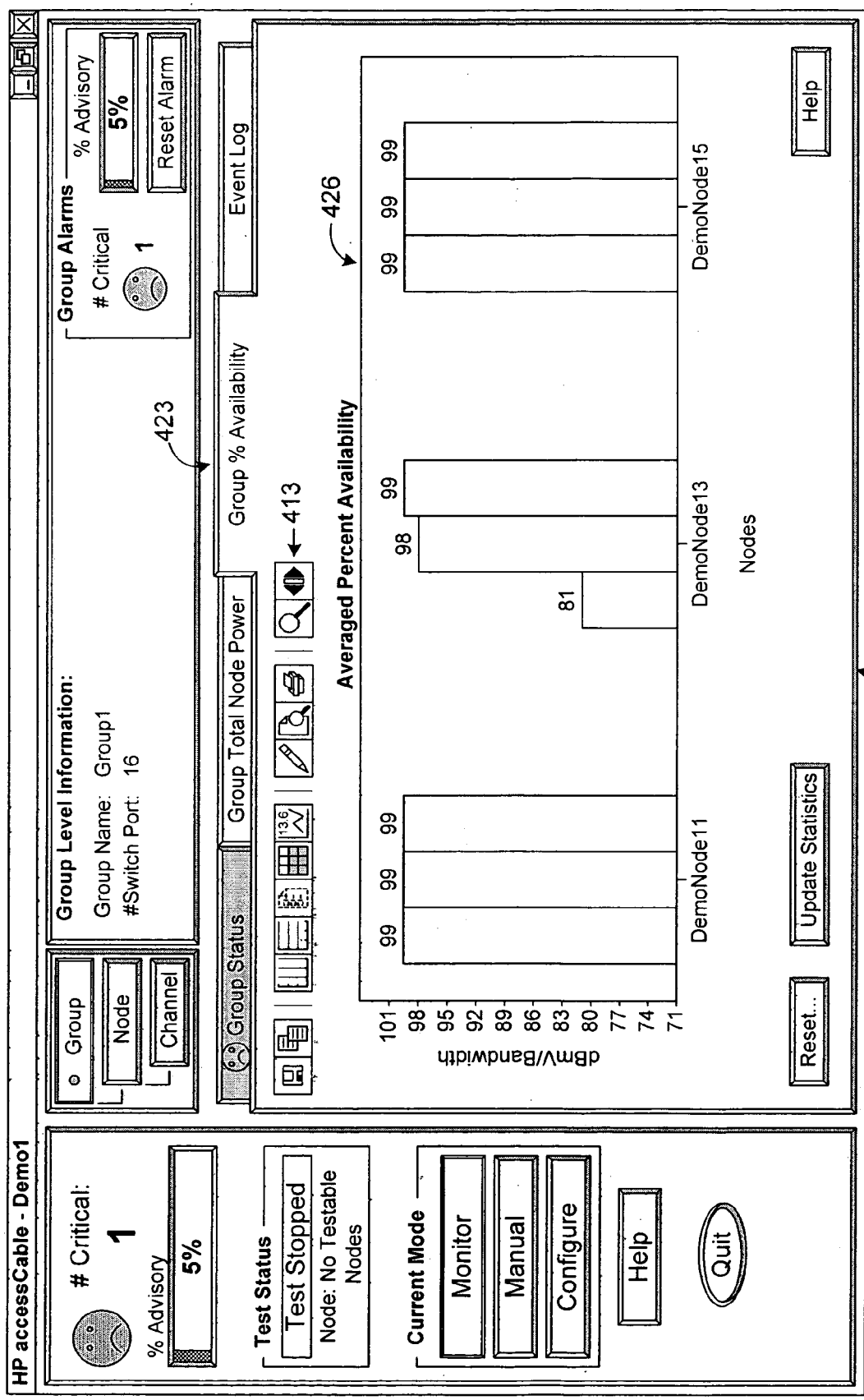
Figure 11D:
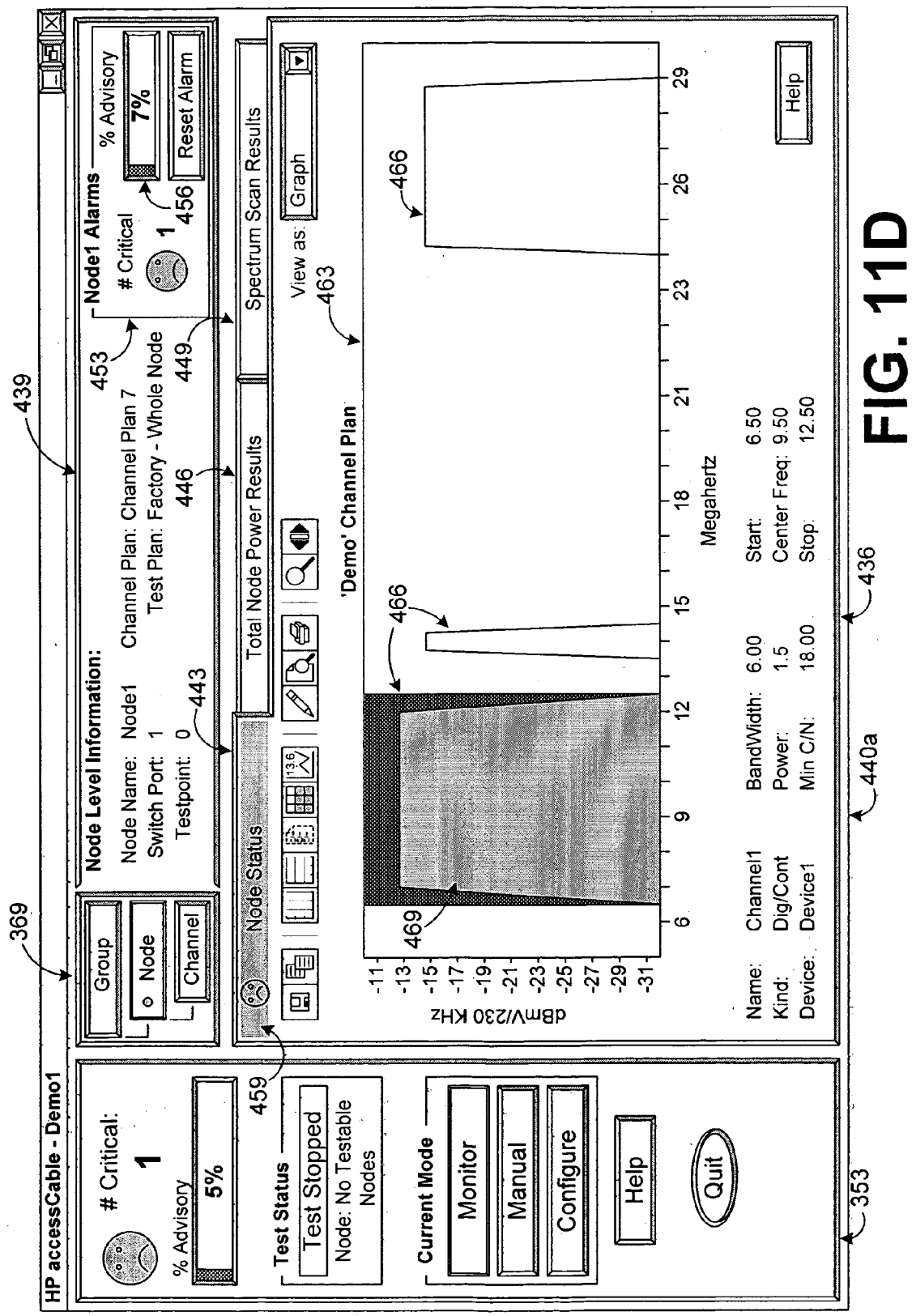
Figure 11E:
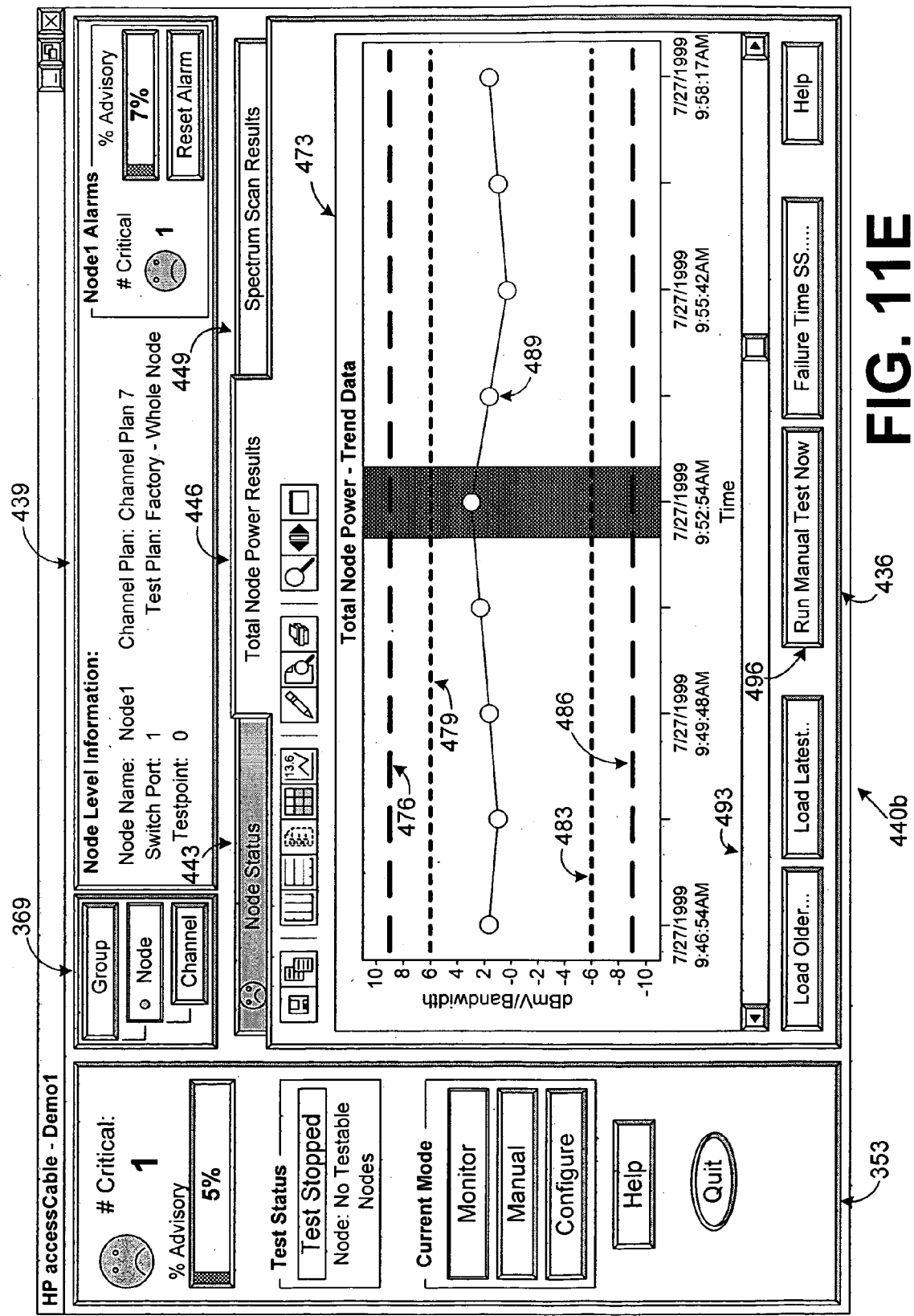

Reference is now directed to FIG. 11E which illustrates total node power over time. In this regard, FIG. 11E reveals a trend of total node power on the node of interest over time by plotting a series of discrete measurements. Individual data points are defined by time on the x-axis and dBmV/Bandwidth on the y-axis of the plot. The total node power graphical user interface is further configured to support both upper and lower critical alarm limits, as well as, both upper and lower advisory alarm limits. The critical and advisory alarm limits are user configurable based on operator knowledge and or the design specifications related to the overall system. As previously described in section C, Thresholds Versus Alarm Limits, alarms are generated by the control process 26 when it compares the results of total node power of the particular node of interest with the alarm limits specified by the user via the test plan.

2. Group Level—Total Node Power Results Display

As previously introduced in Section D, First Embodiment of Automatic Mode, group level statistics are statistics involving all channels of a node 18, collectively. Group level statistics for the total node power test 64b results are illustrated in FIG. 11B. In this regard, group total node power data is illustrated as an average total node power over a user defined time period (the time between user initiated system resets). As shown in FIG. 11B, a node low power level data point, a node average power level data point, and a node high power level data point are provided in the display with individual nodes on the x-axis and power amplitude in dBmV on the y-axis of the display.

In this regard, the node low power level data point for the user defined time period is illustrated with a downward pointing arrow head. The low power level data point represents the lowest of all total node power measurements recorded on the node under test. The node high power level data point for the user defined time period is illustrated with an upward pointing arrow head. The high power level data point represents the highest total node measurement recorded on the node under test. The node average power level data point for the user defined time period is illustrated with a dot on the display. The node average power level data point represents the average total node power of all total node power measurements recorded on that particular node. The group total node power graphical user interface screen as shown in FIG. 11B is further configured to provide data point specific information on the display when a user places a mouse icon over the illustration of the data points associated with a particular node and the user applies a double-left-click input on the mouse.

G. Average Noise Power Test

The average noise power test 64c is illustrated in FIG. 3G. The average noise power test 64c reads the noise power within the bandwidth of a channel 58. The measurement is implemented using the inherent average power measurement of the 3010H spectrum analyzer 12. The average power threshold is used to distinguish noise from the channel 58 power. The measurement is meaningful for bursty (TDMA) and future/unused channels 58. For other channel types, the measurement may include some samples of channel power, overstating the noise level.

For best results, the 3010H measurement threshold should be set below the expected channel power level and above (but close to) the noise power level. The user does not specify the measurement threshold for automated measurements. The control process software 26 can calculate where the threshold should be set to optimize the measurement accuracy relative to the critical and advisory alarm limits.

The average noise power measurement returns a single numeric result, measured in dBmV over the bandwidth of the channel 58, which is plotted versus time to show trends.

As shown in FIG. 3H, the alarm limit(s) is specified relative to the channel's minimum operational C/N (MOCN) level. The idea is that if the noise floor exceeds the MOCN level, then channel data transmissions are impaired. The alarm levels are specified as offsets (in dB) down from the MOCN level. A single test plan can be used for multiple channels 58 even if the expected power level or MOCN levels for the channels 58 are different.

As mentioned previously, the average power measurement threshold is set by the control process software 26 to optimize accuracy of the measurement at the alarm limits. The specific formula used to place the threshold is as follows:

(Expected Channel Power)−(MOCN*⅔)−(Alarm Offset)+3 dB

The test is first performed with the limit optimized for the advisory alarm limit. If the measured result is above the advisory limit, then the test is re-run with the threshold optimized for the critical limit. The higher of the two results is reported to the user by the control process software 26.

H. Channel Power Test

The channel power test 64*d* is illustrated in FIG. 3I. In the channel power test 64*d*, the channel power within the bandwidth of a channel 58 is measured. The channel power test 64*d* works for both continuous and bursty (TDMA) carriers. For bursty carriers a threshold is used to distinguish carrier signal from noise (similar to the average noise power, previously described hereinbefore). As described above, the signal should burst "on" at least once every 1.5 seconds, or else the channel power will be under reported.

For best results, the measurement threshold of the 3010 spectrum analyzer 12 should be set below the expected channel power level but well above the noise power floor, as shown in FIG. 3I. The user does not specify the measurement threshold for automated measurements. The control process software 26 calculates where the threshold should be set using, for example, a suitable mathematical formula.

The average noise power test 64*c* by the analyzer 12 returns a single numeric result, measured in dBmV over the bandwidth of the channel 58, which is plotted versus time by the control process software 26 to show trends.

As shown in FIG. 3J, the alarm limit(s) is specified relative to the channel's expected channel power level. The alarm levels are specified as offsets (in dB) above and below the expected power level. A single test plan 64 can be used for multiple channels 58 even if the expected power level for the channels 58 are different.

The measurement threshold is used only for bursty channels 58. It enables the test to distinguish channel bursts from background noise. The threshold level is set by the control process software 26 automatically using the following formula:

(Expected Channel Power)−(MOCN*¼)−4 dB

For example, if the expected channel power is 5 dBmV over the bandwidth, and the Minimum operational C/N is 24 dB, the threshold would be set to:

5 dBmV−6 dB−4 dB=−5 dBmV (over the bandwidth of the channel 58)

The control process software 26 then converts this power level to dBmV over 230 kHz for the 3010H spectrum analyzer 12.

I. Channel Power Test for Bursty Channels

A channel power test 64*d* for bursty channels 58, for example, TDMA, is illustrated in FIG. 3K and described hereafter. For bursty channels 58, the control process software 26 also configures a burst rate parameter of the 3010H spectrum analyzer 12. This parameter controls how long the 3010H spectrum analyzer 12 dwells at each 230 kHz sample bandwidth, waiting for a signal burst above the measurement threshold. The larger the burst rate parameter, the longer the time required to run the test. If there are no signal bursts within the sample bandwidth during the dwell time, the spectrum analyzer 12 returns the value of the noise power.

To achieve both reasonable accuracy and speed, the control process software 26 configures the channel power test 64*d* to first dwell for 0.2 seconds per sample. If the measured channel power level is below the alarm limits specified by the user (meaning that the channel 58 did not burst often enough), then the software re-runs the measurement with the maximum dwell of 1.5 seconds per sample to improve the likelihood of catching and measuring channel bursts.

J. Carrier-to-Noise (C/N) Test

The C/N test 64*e* is derived from the average power and channel power measurements that are intrinsic to the 3010H spectrum analyzer 12. The C/N test 64*e* involves subtracting the noise power level from the channel power (either measured or from the channel plan 56).

For active channel types (except digital bursty), the noise power measurement cannot be performed within the bandwidth of the channel 58. In the preferred embodiment, for these active channels 58, the noise is measured in an unused bandwidth, as is illustrated in FIG. 3L. This procedure is performed in the closest future/unused channel 58 in order to enable the user to control where the noise is measured. Thus, in the preferred embodiment, in order to perform a C/N test 64*e* on any channel 58 (except digital bursty), at least one future/unused channel 58 is defined.

Although not limited to this specific implementation, the specific C/N test algorithm that is implemented in the preferred embodiment of the control process software 26 is as follows:

(a) Perform pre-test: If the channel type is anything other than future/unused or digital bursty, then there is at least one future/unused channel 58 defined elsewhere in the channel plan 56 where the noise power measurement can be taken. If not, the test is not performed. The user can be warned of the latter situation when the channel plan 56 is created.

(b) Obtain channel power: If the channel power test 64*d* is enabled in the test plan 64 for this specific channel 58 and the channel type is either digital continuous or analog continuous or digital bursty, then the result is taken from the most recent channel power test 64*d*. Otherwise, the power level for the channel 58 specified by the user in the channel plan 56 is used.

(c) Obtain noise power: If the channel type is digital bursty or future/unused, then the noise power test is run in-band. Otherwise, the noise power test is run on the closest future/unused channel 58 (measured from center frequency to center frequency). This result is normalized to the bandwidth of the channel 58 under test.

(d) Subtract noise power from channel power to produce the C/N.

K. Burst Counter Test

The burst counter of the 3010H spectrum analyzer 12 measures the duration of bursts above a specified measurement threshold at a given frequency (within a 230 kHz sample bandwidth).

Figure 3M:
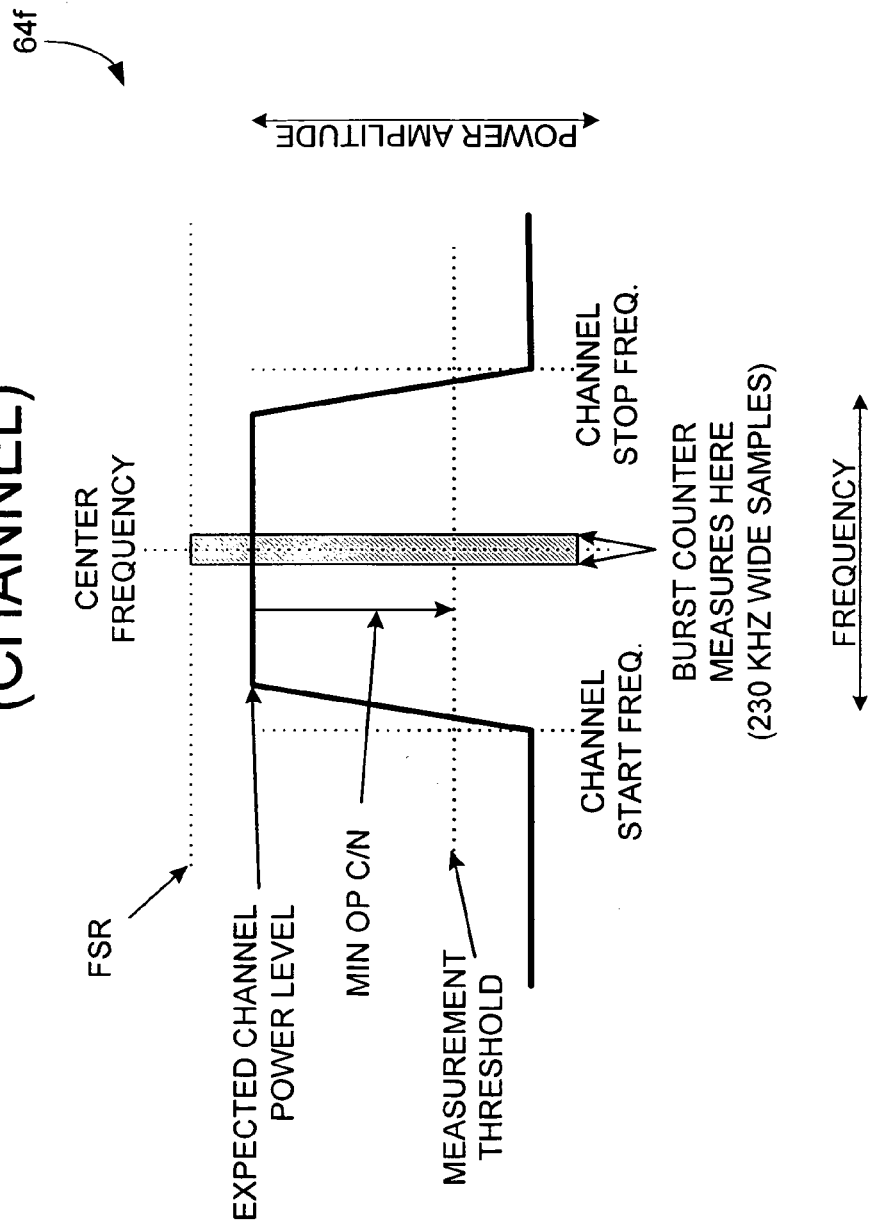
FIG. 3M is a graphical illustration showing a burst counter test, which may be specified as part of a test plan object of FIG. 2.
Figure 30:
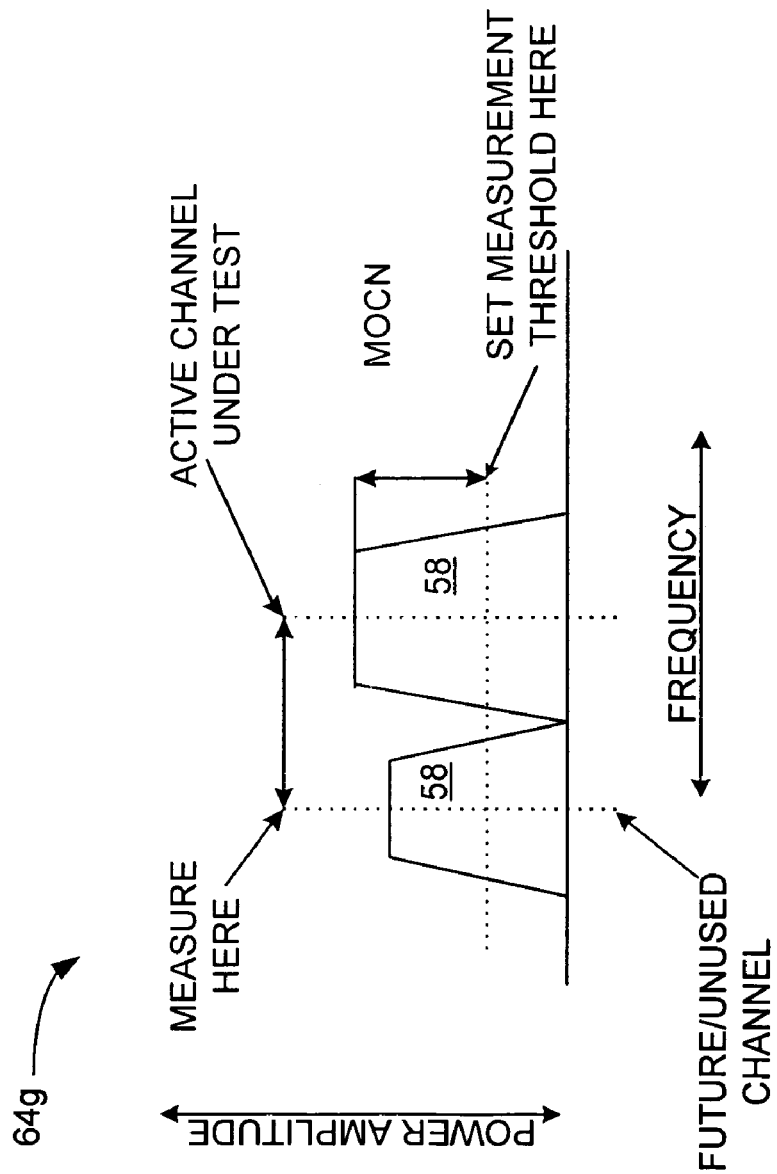

As is shown in FIG. 3M, the control process software 26 of the data acquisition/analysis system 14 configures the burst counter to run at the center frequency of the specified channel 58, and the measurement threshold is set at the minimum operational C/N level for the channel 58 (expected power level minus MOCN). The presumption is that noise energy bursts above the MOCN for the channel 58 would have disrupted signal transmissions for the channel 58.

It is assumed that the burst counter is used on future/unused channels 58. If it is enabled for active channels 58, it will record the signal bursts of the channel 58.

In the preferred embodiment, the control process software 26 does not supply alarm limits to the 3010H spectrum analyzer 12 for the burst counter test 64f. Furthermore, the burst counter reports the number of bursts by duration in the following groups:

| | |
|---|---|
| (a) | <100 µS |
| (b) | >100 µS and <1 mS |
| (c) | >1 mS and <10 mS |
| (d) | >10 mS and <100 mS |
| (e) | >100 mS and <1 Second |
| (f) | >1 Second and <3 Seconds |
| (g) | >3 Seconds |

The control process software 26 is configured to set the duration of the burst counter to be 30 seconds, in the preferred embodiment. The measurement result is displayed as a histogram by the GUI software 32.

Further note that the burst counter test 64f is used to implement the percent availability test described next.

L. Percent Availability Test

The percent availability test 64g is shown in FIG. 3N and is described hereafter. The percent availability test 64g is derived from the 3010H spectrum analyzer's intrinsic burst counter measurement. The purpose of the percent availability test 64g is to estimate the time lost to bursts of noise on an individual channel 58 on a node. The idea is that if noise exceeds the allowable level given by a channel's minimum operational C/N ratio, then data transmission on that channel 58 is compromised. As shown in FIG. 3N, the percent availability test 64g measures the time noise exceeds the MOCN level for the channel 58 and reports this as a percentage of total test time.

The percent availability test 64g may be performed over proposed channel bandwidths and may be derived for currently active channel bandwidths. As previously described, the 3010H spectrum analyzer's burst counter measurement is configured to measure and record noise bursts of different durations that exceed a measurement threshold. In this regard, the control process 26 of the data acquisition/analysis system 14 may be configured to request the 3010H spectrum analyzer 12 to perform the burst counter measurement at the center frequency of any future/unused channel bandwidth. Since future/unused channels 58 do not have a signal carrier, the control process 26 configures the 3010H spectrum analyzer 12 to perform the burst counter measurement over noise present within the future/unused channel bandwidth. The expected power level and MOCN may be set by an operator based on system design specifications for the proposed service or operator knowledge derived from the experience of installing similar service(s) on other cable networks. By performing the percent availability test 64g on a future/unused channel 58 on a node 18 over time and averaging the test results, technicians are presented with quantifiable proof of how a proposed service can be expected to perform on that particular node 18 prior to installing the required hardware.

In order to perform a percent availability test 64g on an active channel 58, the control process 26 of the data acquisition/analysis system 14 must shift the center frequency from the channel 58 of interest as described below. The center frequency shift is required as the 3010H spectrum analyzer 12 has no knowledge of signal characteristics. As a result, the 3010H spectrum analyzer 12 cannot accurately distinguish between noise energy bursts and actual channel signal power. In order to overcome this limitation, the percent availability test 64g is designed to perform its burst counter measurement within adjacent unused bandwidth of the node frequency spectrum. An active channel percent availability test 64g is illustrated in FIG. 3O. The approach is reasonable given that noise tends to be broadband in nature, and noise that disrupts an active channel 58 will typically be present in adjacent bandwidth of the node frequency spectrum.

The control process 26 performs the percent availability test 64g at the center frequency of the closest future/unused channel measured center frequency (of the active channel 58) to center frequency (of the future/unused channel 58). Thus, to perform a percent availability test 64g on an active channel 58, there must be at least one future/unused channel 58 allocated in the test plan, the closer to the active channel 58 the better. In fact, the data acquisition/analysis system 14 is configured to warn the operator when creating the node test plan that the percent availability test 64g will be unavailable if the operator attempts to store a test plan without at least one future/unused channel 58 in the test plan. In response to the stored test plan, the graphical user interface 32 is configured to disable that portion of the interface related to the percent availability test 64g if the test plan does not contain at least one future/unused channel 58.

It is important to note that the parameters necessary for setting up the percent availability test 64g over an active channel 58 (such as expected power level and MOCN) are taken from the active channel 58, not the future/unused channel 58. By performing the percent availability test 64g on an active channel 58 on a particular node 18 over time and averaging the test results, technicians are presented with quantifiable proof of how well the cable operator has provided a particular service on that particular node 18.

The following example demonstrates how burst counter results are used to calculate the percent availability.

1. EXAMPLE

Assume that the burst counter test is run for 5 seconds and the results read and recorded by the 3010H spectrum analyzer 12. The control process 26 of the data acquisition/analysis system 14 retrieves the count totals for each of the separate burst duration intervals. If there is a burst in the >3 second bin, then the percent availability result is set to 0%. Otherwise, for each of the other burst count duration intervals, multiply the number of bursts by the mid-point of the duration interval to compute the time lost to energy bursts.

For example, assume the following burst counter measurement data was retrieved by the 3010H spectrum analyzer 12 and forwarded to the database 28 for manipulation by the control process 26:

| Burst Duration | Count | Multiply by | Total Duration |
|---|---|---|---|
| <100 µS | 1234 | 0.00005 S | 0.0617 S |
| >100 µS and <1 mS | 523 | 0.00055 S | 0.2876 S |
| >1 mS and <10 mS | 55 | 0.0055 S | 0.3025 S |
| >10 mS and <100 mS | 7 | 0.055 S | 0.3850 S |
| >100 mS and <1 S | 0 | 0.55 S | 0.0 S |
| >1 S and <3 S | 0 | 2.0 S | 0.0 S |
| | | Total | 1.0368 S |

Control process 26 sums the total duration results associated with each of the separate duration intervals to compute the total test time lost to bursts. If the total test time lost to bursts is greater than or equal to 5 seconds, then control process 26 sets the percent availability to 0%. Otherwise, control process 26 subtracts the total test time lost result from the total test time (5 seconds) to determine the total time the channel 58 was available. Next, control process 26 divides the total test time the channel 58 was available by the total test time (5 seconds). Control process 26 then proceeds to multiply the result by 100 to determine the percent availability. A sample calculation for the burst counter measurement previously illustrated is shown hereafter:

[(5 sec.−1.0368 sec.)/−5 sec.]*100=79%.

As previously introduced in Section D, First Embodiment of Automatic Mode, group level statistics are statistics involving all channels 58 of a node 18, collectively. Group level statistics for the percent availability test 64g results are illustrated in FIG. 11C. In this regard, group percent availability data is illustrated as an average percent availability over a user defined time period. As shown in FIG. 11C, a low channel 58, average channel 58, and high channel value is provided in a histogram with individual nodes 18 displayed on the x-axis and percent on the y-axis of the histogram.

Figure 11F:
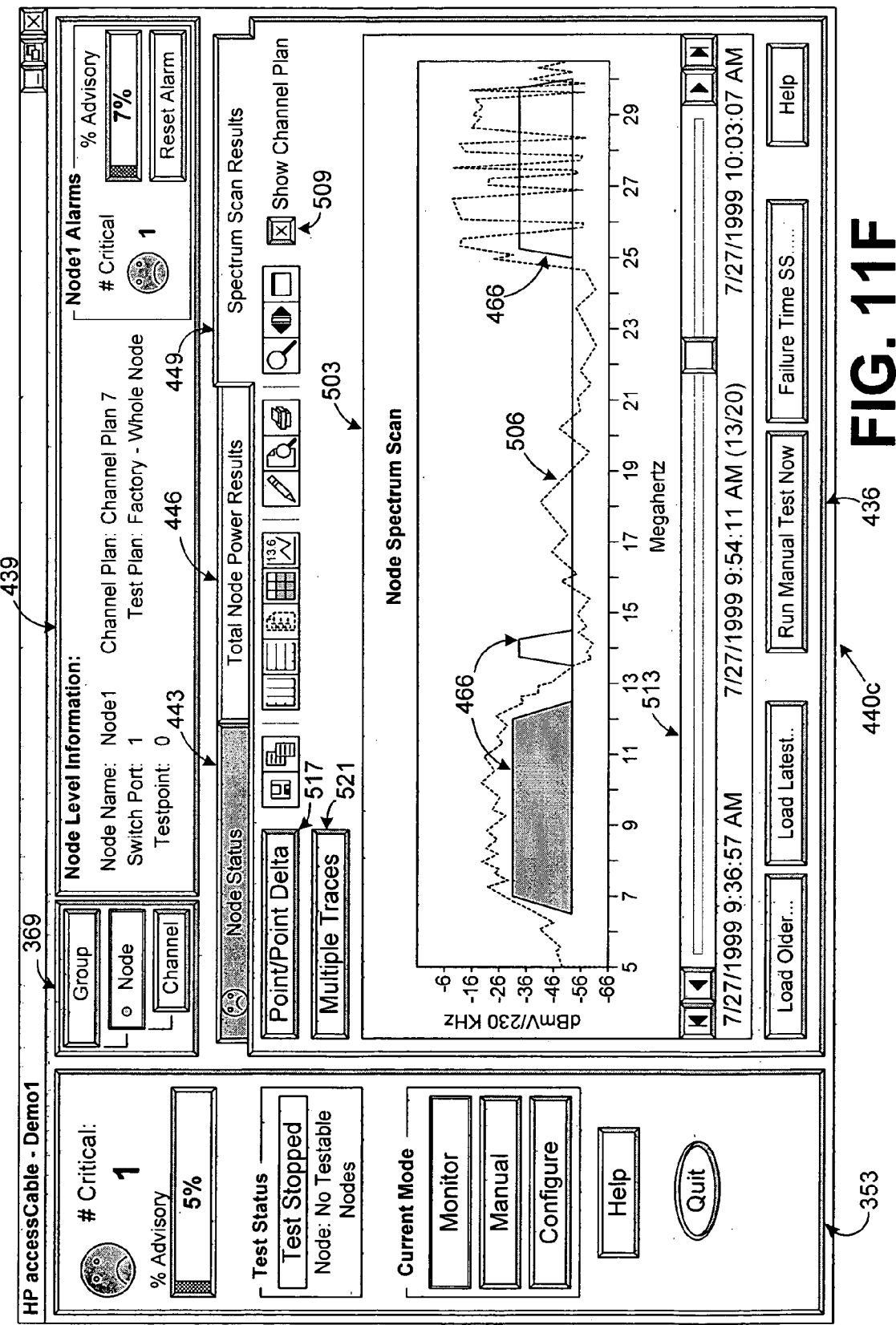
Figure 11G:
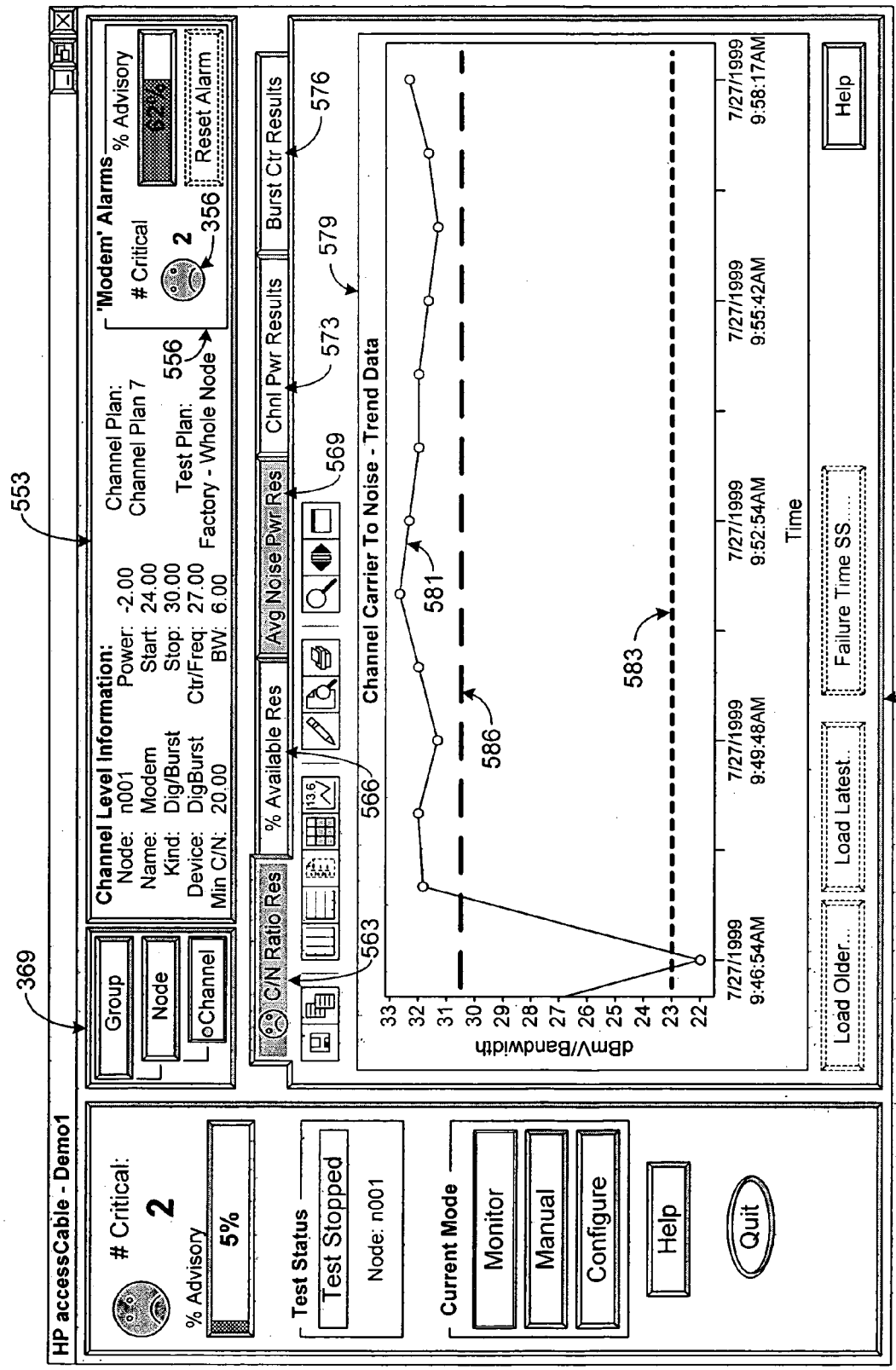
Figure 11H:
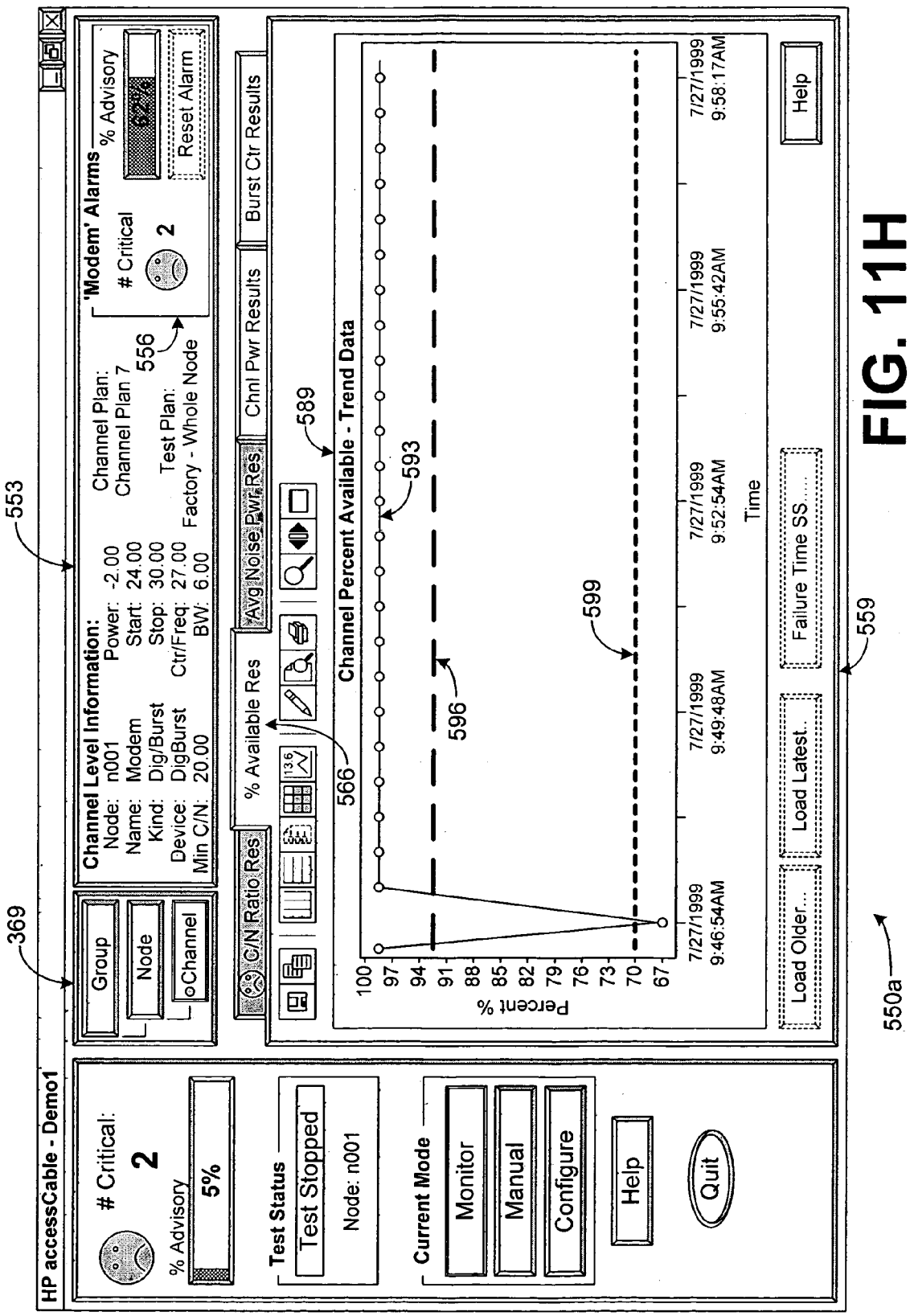

Having described the representation of percent availability statistics on a group level, reference is now directed to FIG. 11H which illustrates percent availability results of a particular channel 58 on a node 18. In this regard, FIG. 11H reveals a trend of percent availability results of the channel 58 of interest over time by plotting a series of discrete measurements. Individual data points are defined by time on the x-axis and percent availability on the y-axis of the plot. It is important to note that the channel percent availability graphical user interface is further configured to support both a critical alarm limit, as well as, an advisory alarm limit. Both alarm limits are user configurable based on operator knowledge and or the design specifications related to each individual service. As previously described in section C, Thresholds Versus Alarm Limits, alarms are generated by the control process 26 when it compares the results of percent availability of the particular channel 58 with both the critical and advisory alarm limits specified by the user via the test plan.

M. Failure Time Spectrum Scan Test

Any exception to a critical alarm limit triggers an alarm indicator within the graphical user interface 32 on the given node 18. To prevent erroneous critical alarms due to a single bad data point, control process 26 will immediately re-run the test which triggered the critical alarm exception some number of times to ensure that the critical exception is real.

Once the control process 26 of the data acquisition/analysis system 14 determines that a critical alarm limit exception is real, control process 26 triggers a spectrum scan of the entire return-path spectrum of the node 18 as defined in the channel plan 56. In this way, a spectrum scan of the entire node 18 is available upon technician demand when the alarm event is reviewed. The system of the present invention provides a technician with a failure time spectrum scan of the entire node 18 upon determining that a critical alarm limit has been exceeded in relation to the following tests: total node power test 64b, C/N test 64e, percent availability test 64g, average noise power test 64c, channel power test 64d, and burst counter 64f.

Alternatively, control process 26 may be configured to provide a detailed spectrum scan of the affected bandwidth upon encountering a real critical alarm exception event. The detailed spectrum scan is then available upon technician demand when the alarm is reviewed. For example, if the system of the present invention triggers a C/N test critical alarm exception for a channel 58 at 17 MHz which is 2 MHz wide, the control process 26 may initiate the 3010H spectrum analyzer 12 to measure and record a spectrum scan on the node 18 under test from 15.5 MHz to 18.5 MHz. The control process 26 then associates the stored spectrum scan with the critical alarm. A technician may retrieve failure time spectrum scans by navigating through the system graphical user interfaces further described hereafter (see FIG. 11E, and FIGS. 11G–K). In this regard, the system of the present invention provides a technician with a failure time spectrum scan upon determining that a critical alarm limit has been exceeded in relation to the following tests: total node power test 64b, C/N test 64e, percent availability test 64g, average noise power test 64c, channel power test 64d, and burst counter 64f It is important to note that in addition to providing a user selectable button (FIG. 11E, and FIGS. G–K) a user may retrieve a failure time spectrum scan by manipulating a mouse pointer or other computer pointing device over a data point that triggered a critical alarm limit associated with any of the aforementioned tests and applying a double-left-click.

IV. Software Architecture
  (Control Process Software and GUI Software)

Figure 4:
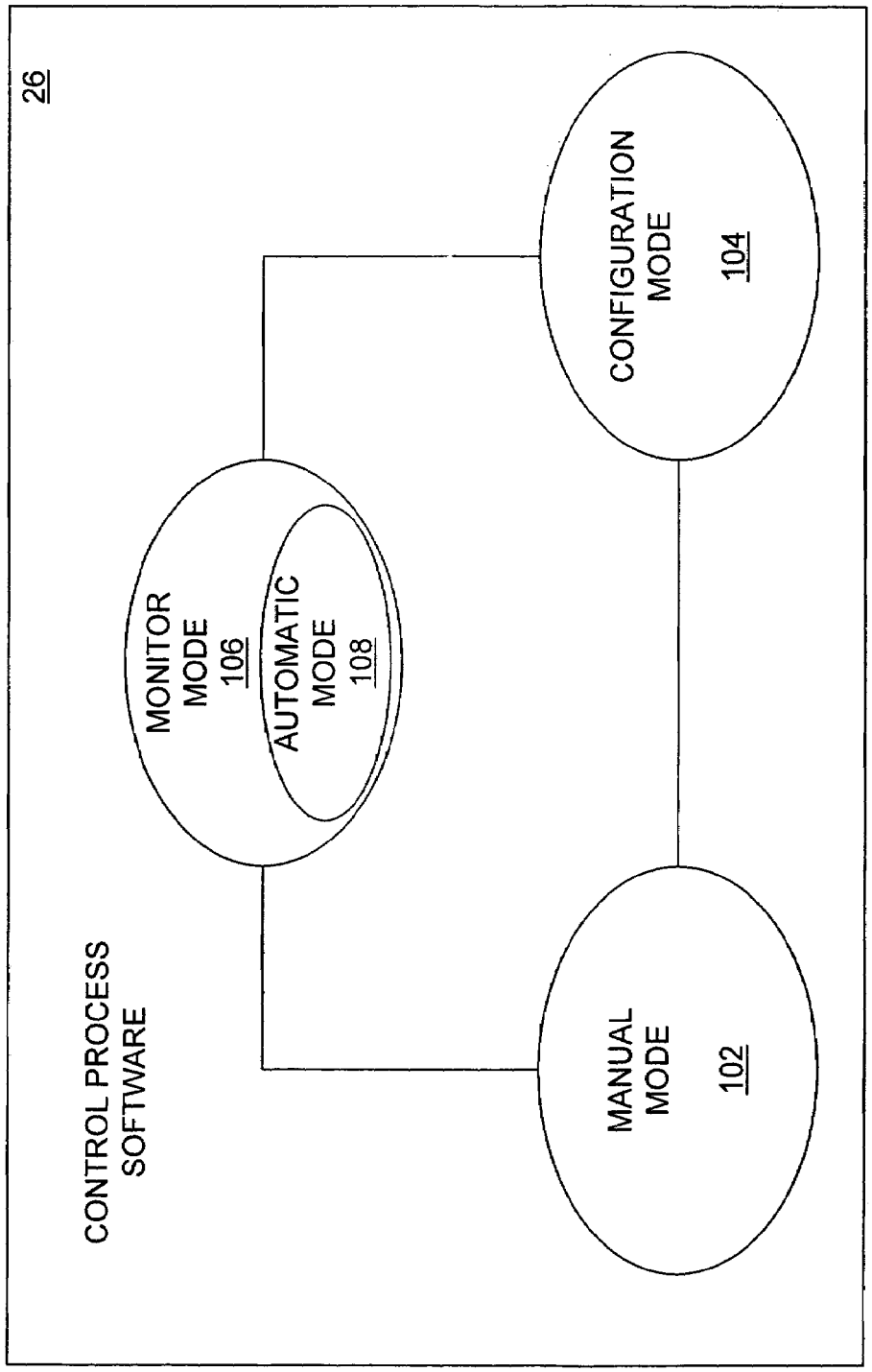
FIG. 4 is a state diagram of an example of possible modes that can be implemented in the control process of FIGS. 1A–1C.

FIG. 4 shows a state diagram illustrating an example of a set of operational modes that can be implemented by the control process software 26 (FIGS. 1A–1C). In this configuration, the control process software 26 is designed to operate in one of three possible modes 102, 104, or 106 at any given time, depending upon which is selected by the user. The GUI software 32 provides appropriate screens to the user to enable the user to select one of the modes. Obviously, other modes and mode schemes are possible.

In this preferred embodiment, when the control process software 26 operates in a manual mode 102, the control process software 26 enables a user, via the GUI software 32, to directly control and perform tests using the spectrum analyzer 12. When the control process software 26 operates in the configuration mode 104, the control process software 26 enables the user to set up channel plans 56 and test plans 64 via the GUI software 32. When the control process software 26 operates in the monitor mode 106, the user can browse through signal data contained within the database 28 via the GUI software 32, and in addition, the control process software 26 automatically controls the spectrum analyzer 12 and the switch 16 in the background, in order to retrieve signal data from signals on nodes 18. Optionally, but in the preferred embodiment, the control process software 26 includes an automatic mode 108, which causes automatic and periodic updating of signal data in the database 28 pursuant to one or more specified channel plans 56 and test plans 64.

As examples of possible implementations, first and second embodiments of software for implementing the automatic mode 108 are described hereinafter relative to FIGS. 8 and 9, respectively. Each of these embodiments implements a different kind of scheduling process. The first embodiment implements a round robin algorithm and the second embodiment implements a smart scanning algorithm, which attempts to focus on those nodes 18 exhibiting less than desirable signal characteristics more often than those nodes 18 exhibiting acceptable signal characteristics. Finally, note that the control process software 26 may be designed to implement either or both of these embodiments. When both are implemented, the control process software 26 can be configured to permit the user, via the GUI software 32, to select which of the embodiments to execute during the automatic mode 108.

A. Channel Plan Setup

Figure 5B:
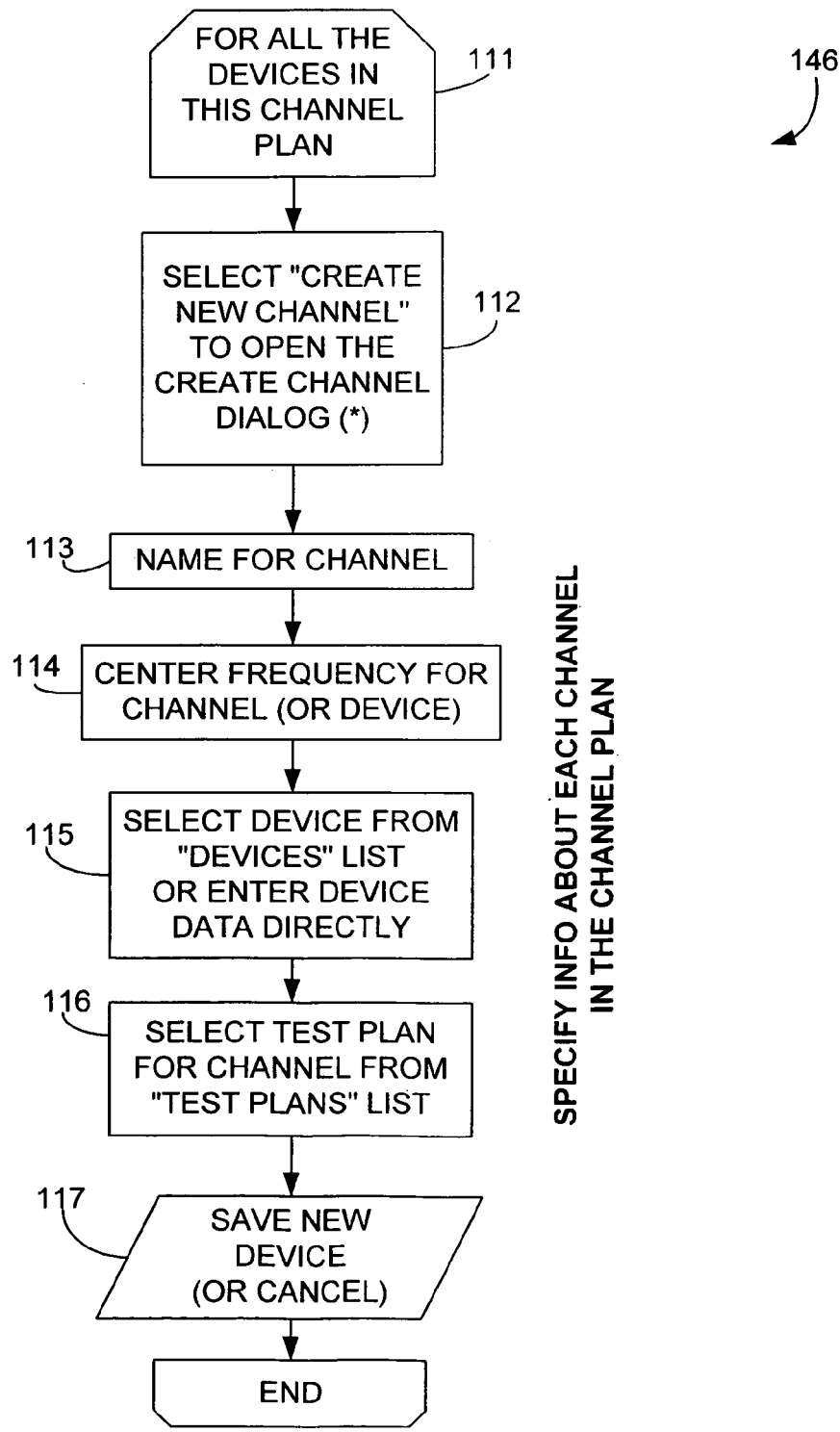

FIGS. 5A and 5B collectively illustrate a flowchart showing an example of how a channel plan(s) 56 can be set up by a user, while the control process software 26 operates in the configuration mode 104 (FIG. 4). The steps indicated in the flow chart are executed by the GUI software 32 or the combination of the GUI software 32 and the control process software 26.

Note that each block of the flow charts in this document represents a part (e.g., a module, segment, or script) of the software code, which comprises one or more executable instructions for implementing the specified logical function (s). It should also be noted that in some alternative implementations, the functions noted in the blocks may occur out of the order that is specified. For example, two blocks shown in succession in the figures may in fact be executed substantially concurrently or the blocks may sometimes be executed in the reverse order, depending upon the functionality involved, as will be further clarified hereinbelow.

With reference to block 105 of FIG. 5A, in the preferred embodiment, the GUI software 32 enables a user to open a channel plan list generated by the GUI software 32. Herein, when a statement is made to the effect that "the GUI software 32 enables . . . " or "the GUI software 32 permits . . . ," this means that the GUI software 32 provides a prompt, dialog box, display screen indicia, or some other suitable communication to the user to solicit the prescribed information from the user. Moreover, the user can provide the solicited information to the GUI software 32 via any suitable mechanism, for example but not limited to, a mouse, keyboard, etc. At this point, the user can select a preexisting channel plan 56 to manipulate or can choose to create a new channel plan 56.

Next, a loop is entered to process each return path frequency allocation scheme in use, which starts at block 106.

As indicated at block 107, the GUI software 32 enables the user to commence a dialog for creating a new channel plan 56 for a node 18.

The GUI software 32 enables the user to enter information about the channel plan 56 in blocks 108–113 and information about each channel 58 within the channel plan 56 in the looping operation denoted by blocks 114–117.

More specifically, as indicated at block 108 of FIG. 5A, the GUI software 32 enables the user to enter the name for the channel plan 56.

At block 109, the GUI software 32 enables the start and stop frequencies to be entered by the user. The start and stop frequencies essentially define the bandwidth of the entire return spectrum being utilized.

At block 110 of FIG. 5A, the GUI software 32 enables the user to select which whole node test plan 64 to utilize, for example, the spectrum scan test 64a or the total node power test 64b. This is essentially the test that is run on the entire return path spectrum. If the user does not enter a particular whole node test plan 64, then the GUI software 32 or control process software 26 will select a default whole node test plan 64 that is predefined by the GUI software 32, control process software 26, or otherwise.

At block 146, parameters regarding channels 58 are specified. The functionality of block 146 is specified in detail at blocks 111–117 of FIG. 5B, which is, essentially a looping operation for focusing on each channel 58.

With reference to FIG. 5B, block 111 initiates the loop for entering new communications device parameters.

At block 112, the GUI software 32 permits the user to select a routine for creating a new channel 58.

At block 113, the GUI software 32 enables the user to enter a name for the channel 58.

At block 114, the GUI software 32 permits the center frequency for the communications device 62 to be entered by the user.

Figure 6:
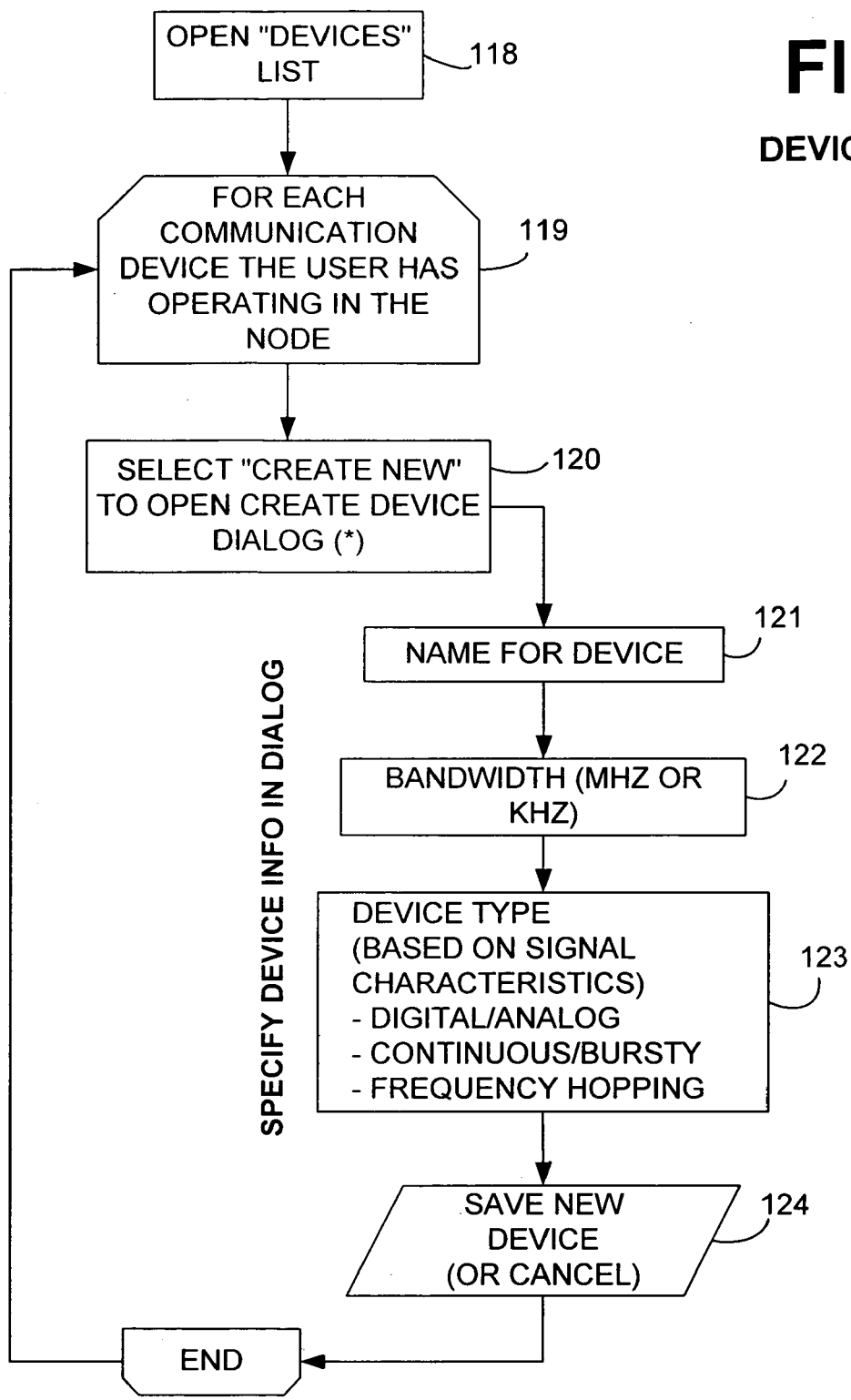
FIG. 6 is a flow chart showing an example of the architecture, functionality, and operation of a process for enabling a user to set up a channel object(s) (device template), the process being implemented by the combination of the control process and GUI of FIGS. 1A–1C.

At block 115 of FIG. 5B, the GUI software 32 permits the user to select predefined communications device types from a preexisting devices list or enter communications device data directly. The preexisting devices list is retrieved by the control process software 26 from the database 28 and provided to the GUI software 32 for display to the user. Communications devices 62 may be Predefined for the list by the user via the GUI software 32 as indicated in FIG. 6, which is described later in this document.

Referring still to FIG. 5B, at block 116, the GUI software 32 enables the user to select a test plan 64 from a preexisting test plans list, which is retrieved by the control process software 26 from the database 28.

Next, at block 117, the GUI software 32 advises the control process software 26 to save the new device parameters for the channel plan 56.

Finally, the process flow loops back to block 111, if any new channels 58 remain to be specified. Further, if there are other return paths to analyze, then process flow reverts back to block 106 of FIG. 5A and the entire foregoing described process is executed once again.

B. Device Setup

FIG. 6 is a flowchart showing an example of how communications device templates are set up, while the control process software 26 operates in the configuration mode 104 (FIG. 4). The steps indicated in the flow chart are executed by the GUI software 32 or the combination of the GUI software 32 and the control process software 26.

As indicated at block 118, a devices list is retrieved by the control process software 26 and made available to the user by the GUI software 32.

At block 119, a loop is entered to process each communication device 62 that the user has operating in the return path.

At block 120 of FIG. 6, the GUI software 32 makes available to the user the option to open a create device dialog.

Afterward, at block 121, the GUI software 32 enables the user to enter a name for the communications device 62.

At denoted at block 122, the GUI software 32 enables the user to enter a bandwidth for the communications device 62.

At block 123, the GUI software 32 enables the user to enter a communications device type (based on signal characteristics).

As indicated at block 124 of FIG. 6, the GUI software 32 enables the user to save the new device configuration or cancel same. When a save operation is selected by the user, the control process software 26 saves the information in the database 28.

Process flow then reverts back to block 119 for processing another communications device 62, if any remain to be processed.

C. Test Plan Setup

Figure 7A:
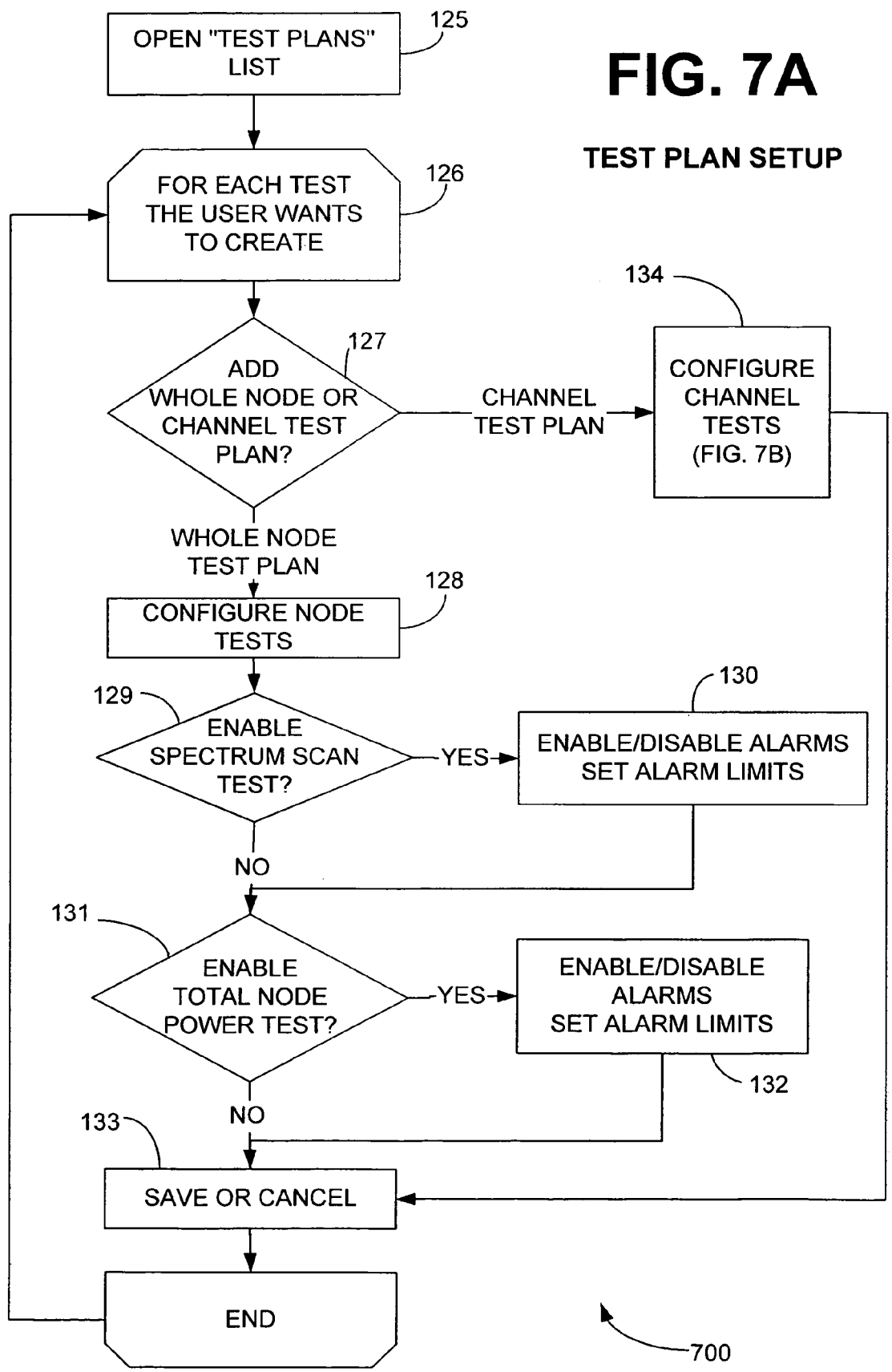
FIGS. 7A and 7B are flow charts showing an example of the architecture, functionality, and operation of a process for enabling a user to set up a test plan(s), the process being implemented by the combination of the control process and GUI of FIGS. 1A–1C.
Figure 7B:
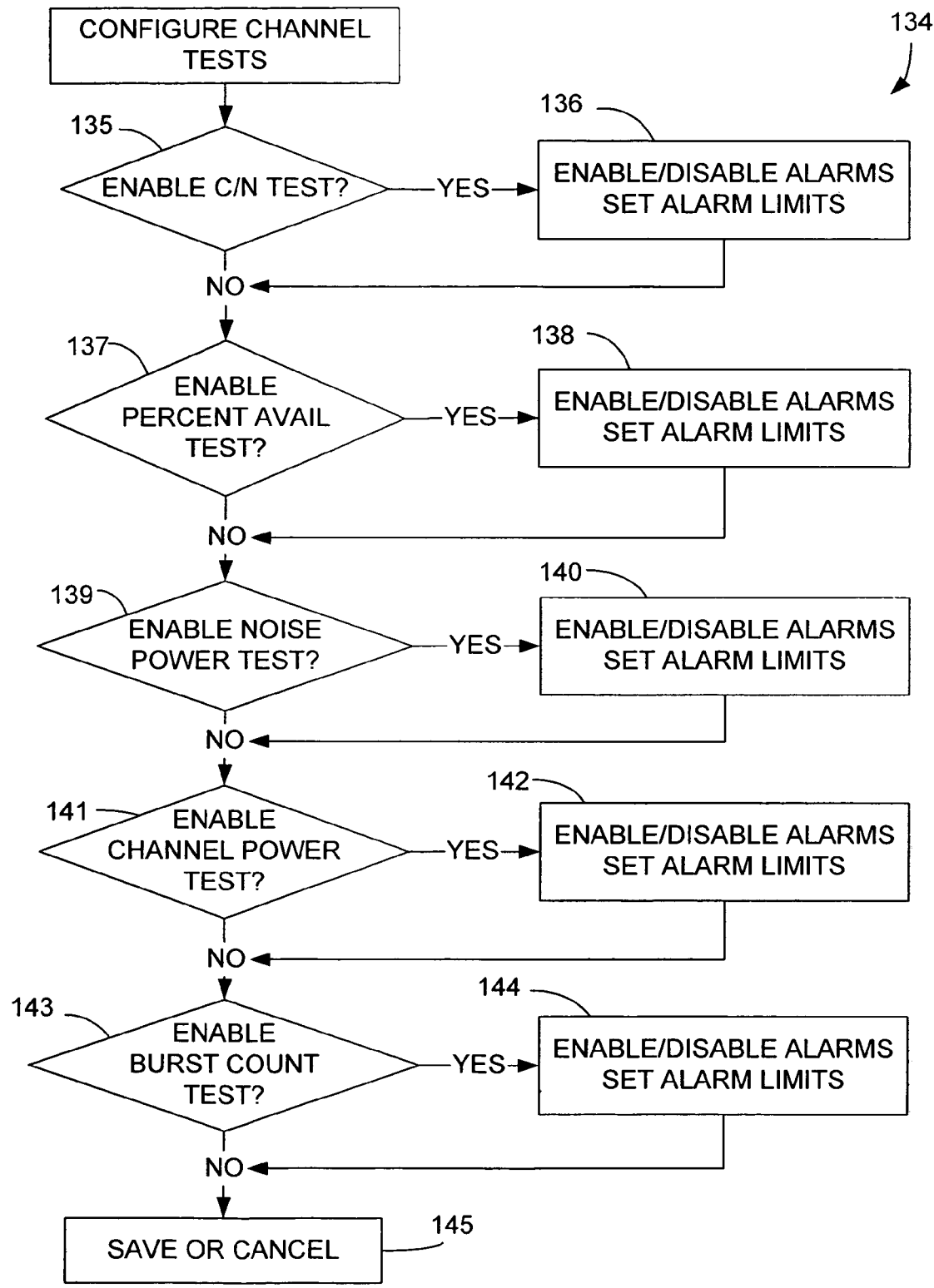

FIGS. 7A and 7B collectively show a flowchart of how a test plan 64 is setup, while the control process software 26 operates in the configuration mode 104 (FIG. 4). The steps indicated in the flow chart are executed by the GUI software 32 or the combination of the GUI software 32 and the control process software 26.

With reference to FIG. 7A, at block 125, the GUI software 32 enables the user to open a test plans list, which is read from the database 28 by the control process software 26 and forwarded on to the GUI software 32.

As indicated at block 126, a loop is entered to address each test that the user wants to create.

At block 127, a determination is made as to whether either a whole node or channel test plan 64 is to be added. When a whole node test plan 64 is to be added, then the process flow passes through blocks 128–133. Otherwise, when a channel test plan 64 is to be added, then process flow commences through the functionality indicated at blocks 134–145.

First addressing addition of a whole node, as indicated at block 128, the GUI software 32 will now enable the user to specify and configure channel tests in the blocks to follow.

At block 129 of FIG. 7A, the GUI software 32 enables the user to specify performance of the spectrum scan test 64a, and a determination is made by the GUI software 32 as to whether the spectrum scan test 64a is enabled by the user. If so, then the GUI software 32 allows the user to enable or disable alarms and set alarm limits, as indicated at block 130. If not, then process flow reverts to block 131.

At denoted at block 131, the GUI software 32 enables the user to specify performance of the total node power test 64b, and a determination is made by the GUI software 32 as to whether the total node power test 64b is enabled by the user. If so, then the GUI software 32 enables the user to enable or disable alarms and set alarm limits as denoted at block 132. If not, then process flow reverts to 133, where the GUI software 32 enables the user to save or cancel the aforementioned data.

At block 127, if it is determined that a channel test plan 64 is to be added, then process flow reverts to block 134.

As indicated at block 134 of FIG. 7A, the GUI software 32 enables the user to specify and configure channel tests. This process is shown in detail in FIG. 7B.

At block 135 in FIG. 7B, the GUI software 32 enables the user to specify performance of the C/N test 64e, and a determination is made by the GUI software 32 as to whether the C/N test 64e is enabled by the user. If so, then the GUI software 32 allows the user to enable or disable alarms and set alarm limits relative to the C/N test 64e, as indicated by block 136. If not, then process flow reverts to block 137.

At block 137, the GUI software 32 enables the user to specify performance of the percent availability test 64g, and a determination is made by the GUI software 32 as to whether the percent availability test 64g is enabled by the user. If so, then the GUI software 32 enables the user to enable or disable alarms and set alarm limits, as indicated at block 138. If not, then process flow reverts to block 139.

As indicated at block 139, the GUI software 32 enables the user to specify performance of the average noise power test 64c, and a determination is made by the GUI software 32 as to whether the noise power test is enabled by the user. If so, then the GUI software 32 enables the user to enable or disable alarms and set alarm limits relative to the average noise power test 64c, as indicated at block 140. If not, then process flow reverts to block 141.

At block 141 of FIG. 7B, the GUI software 32 enables the user to specify performance of the channel power test 64d, and a determination is made by the GUI software 32 as to whether the channel power test 64d is enabled by the user. If so, then the GUI software 32 enables the user to enable or disable alarms and set alarm limits, as indicated at block 142. If not, then process flow reverts to block 143.

As denoted at block 143, the GUI software 32 enables the user to specify performance of the burst counter test 64f, and a determination is made by the GUI software 32 as to whether the burst counter test 64f is enabled by the user. If so, then the GUI software 32 enables the user to enable or disable alarms and set alarm limits relative to the burst counter test 64f, as denoted at block 144. If not, then process flow reverts to block 145, where the GUI software 32 enables the user to save or cancel the aforementioned data.

Finally, process flow reverts back to block 126 of FIG. 7A to process another test, if the user so chooses.

D. First Embodiment Of Automatic Mode (Automated Testing Using Round Robin Algorithm)

Figure 8A:
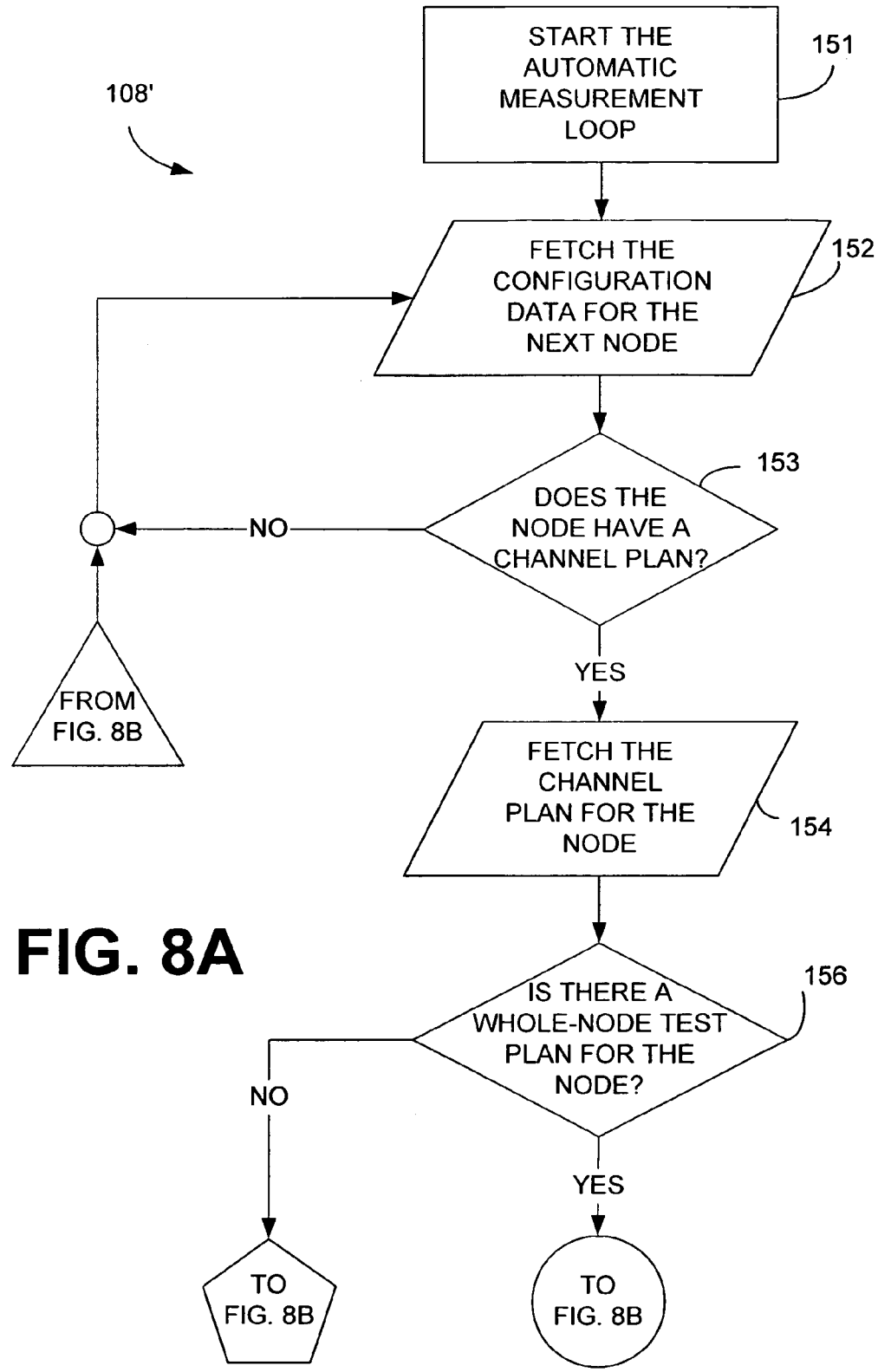
Figure 8B:
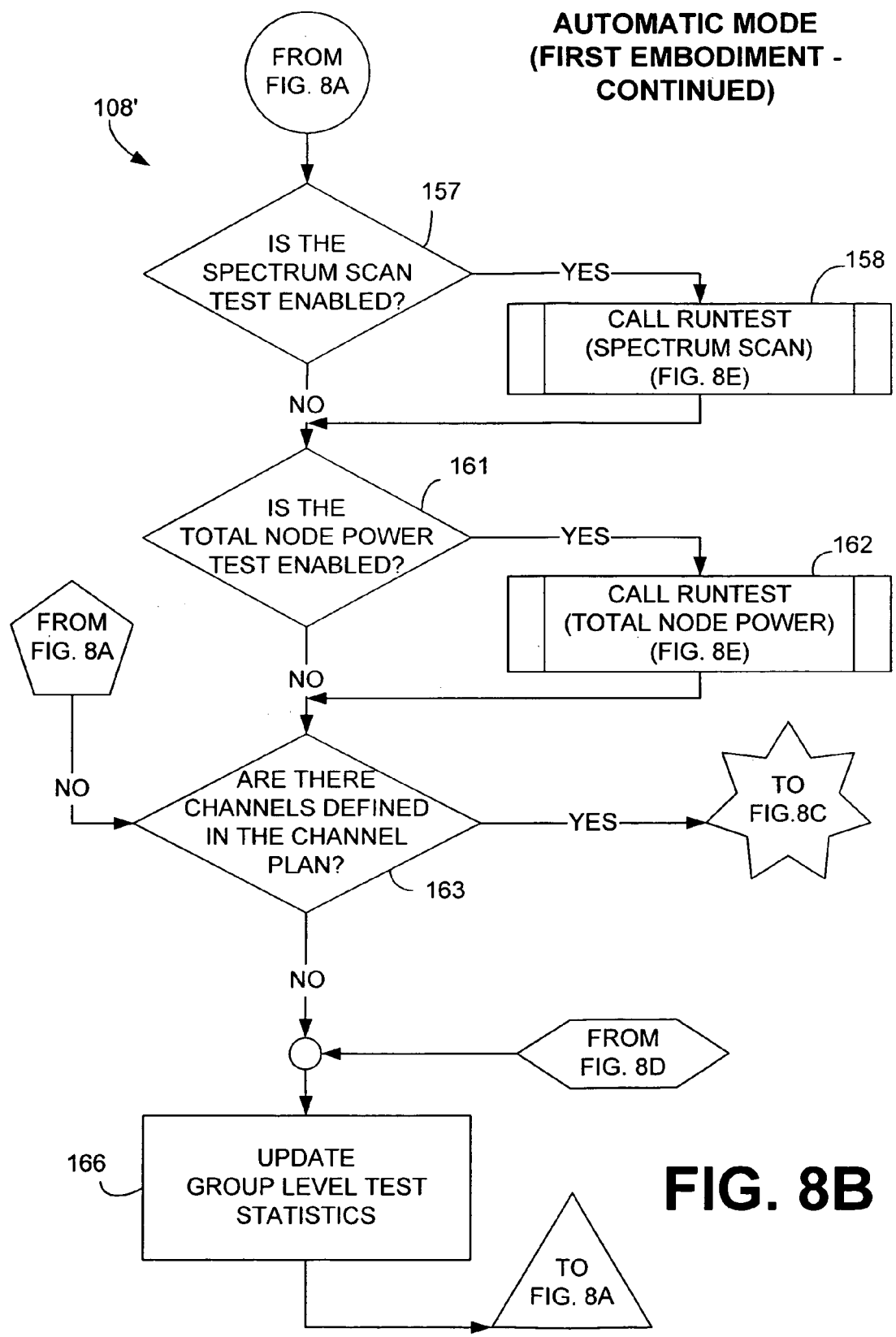
Figure 8E:
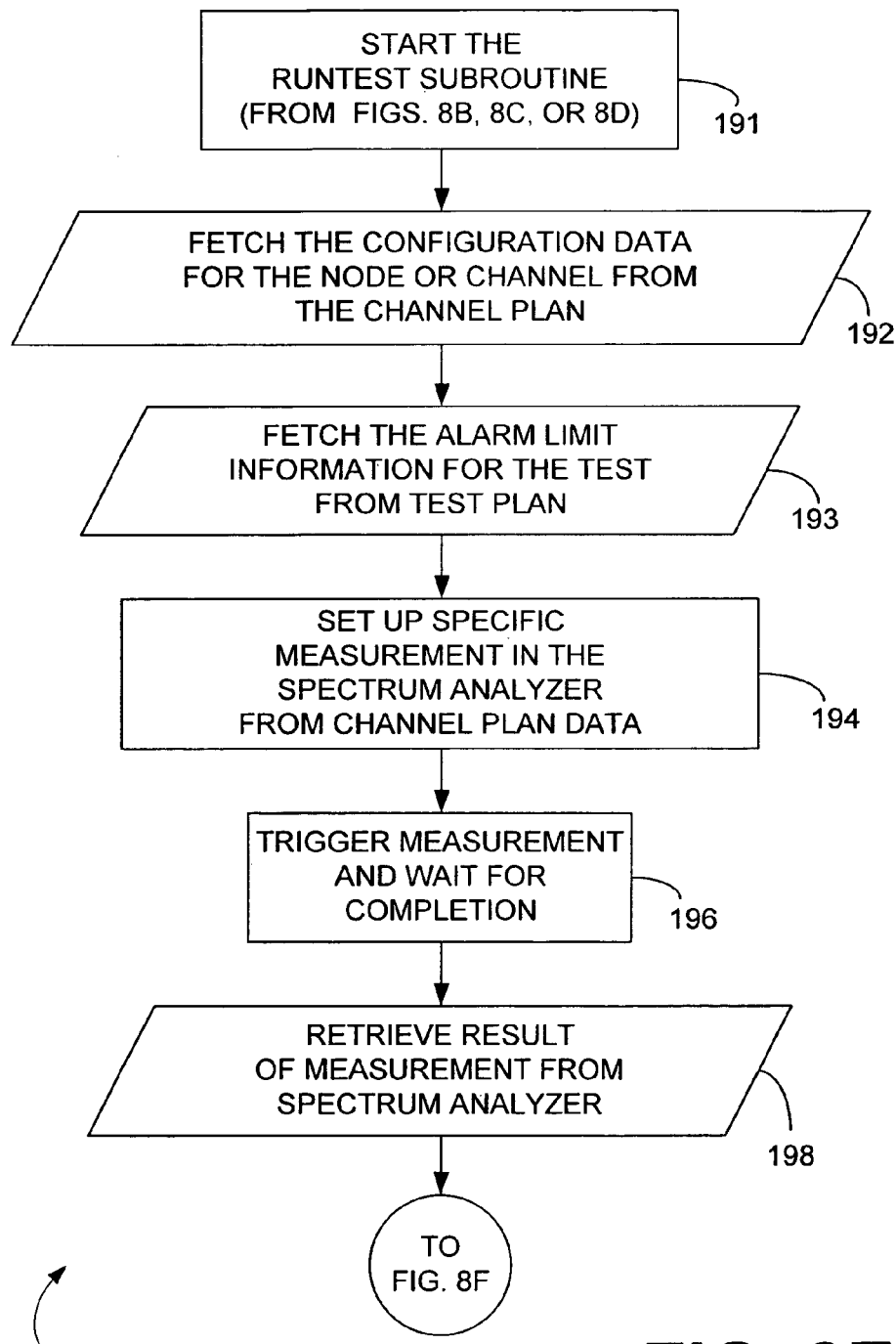
Figure 8F:
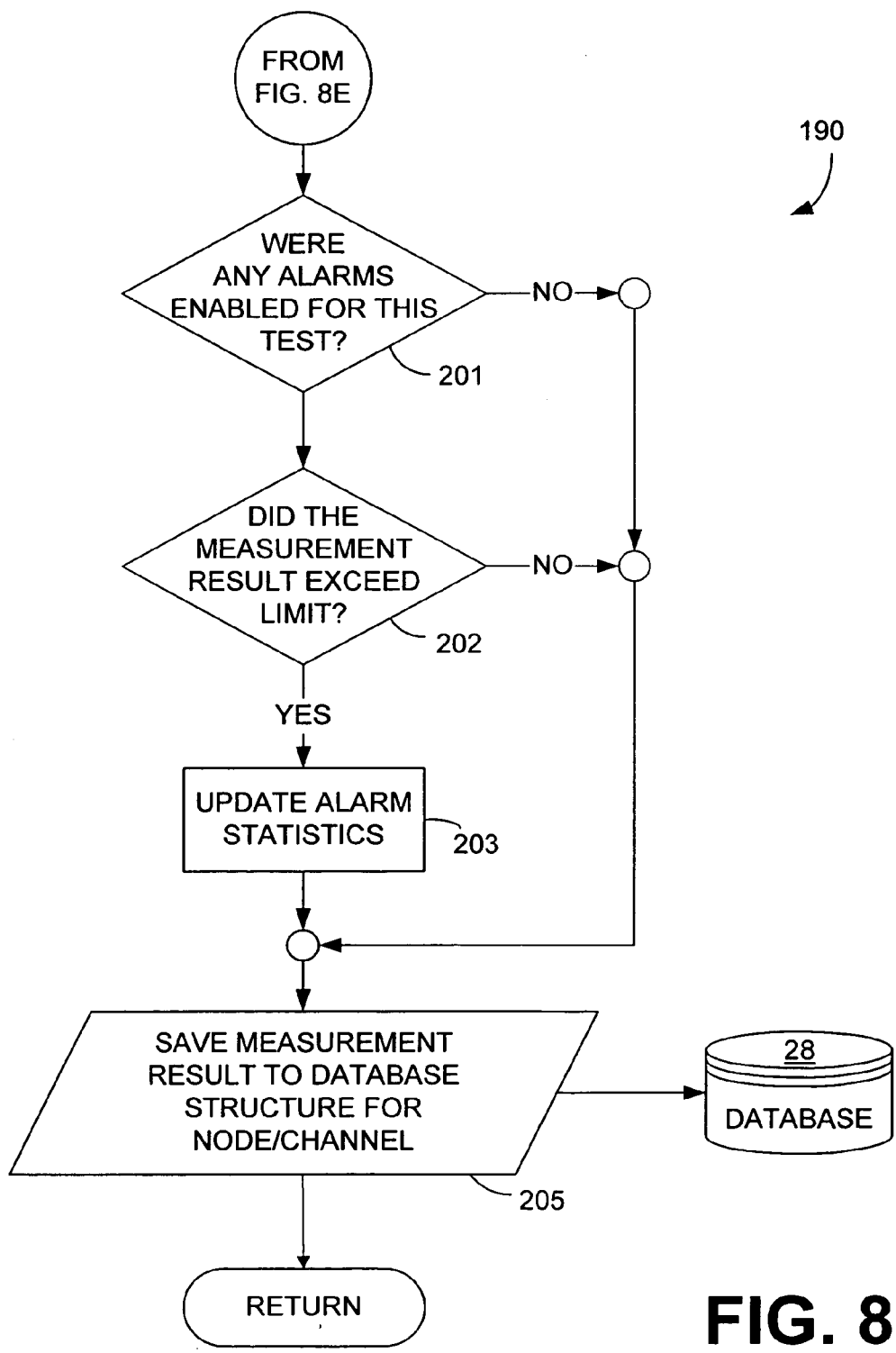

FIGS. 8A through 8F collectively show a flow chart to illustrate the architecture, functionality, and operation of a first embodiment 108' of software for the control process software 26 for implementing the automatic mode 108 (FIG. 4) of the control process software 26. Generally, FIGS. 8A through 8D show the high level concept of the first embodiment 108' of the software for implementing the automatic mode 108, and FIGS. 8E through 8F illustrate a run test subroutine associated with the automatic mode software of FIGS. 8A through 8D.

Referring first to FIG. 8A, when the automatic mode software 108' is initiated by the control process software 26, an automatic measurement loop is commenced, as indicated by block 151, wherein the control process software 26 causes the spectrum analyzer 12 to perform measurements and report the results back to the control process software 26. The loop runs indefinitely, until the user instructs the control process software 26 otherwise, via the GUI software 32, to enter a different operational mode (FIG. 4). Further, each loop through the process analyzes a single node 18, and hence, the nodes 18 are analyzed sequentially pursuant to a round robin algorithm.

As indicated by block 152, configuration data is fetched from the database 28 (FIGS. 1A–1C) for the first node 18 or next node 18 if returning from a later point in the flow chart. The configuration data includes the data pertaining to a channel plan 56 and test plan 64, if applicable to the particular node 18 at issue.

Next, at block 153, a determination is made by the control process software 26 as to whether the node 18 has a channel plan 56 associated with it. If not, then process flow reverts back to block 152. If so, then process flow reverts to block 154 for further analysis.

At block 154, the channel plan 56 is fetched from the database 28 for the particular node 18.

After the channel plan 56 is obtained, a determination is made by the control process software 26 as to whether there is a whole node test plan 64 for the node 18, as delineated at block 156. Whole node test plans 64 include, for example, but not limited to, the spectrum scan test 64a (FIGS. 3D and 3E) and the total node power test 64b (FIG. 3F). If not, then process flow reverts to block 163, which will be described later in this document. If so, then process flow reverts to block 157.

At block 157 of FIG. 8B, a determination is made by the control process software 26 as to whether the spectrum scan test 64a (FIGS. 3D and 3E) is enabled. A user can enable or disable this functionality via an appropriate input(s) to the GUI software 32. If so, then the run test module (FIG. 6B to be described later) is called for performing the spectrum scan test 64a, as denoted by block 158. If not, then process flow reverts to block 161.

As indicated at block 161, a determination is made by the control process software 26 as to whether the total node power test 64b (FIG. 3F) is enabled. A user can enable or disable this functionality via an appropriate input(s) to the GUI software 32. If so, then the run test module (FIG. 6B) is called to perform the total node power test 64b, as indicated at block 162. If not, then process flow reverts to block 163.

At block 163 of FIG. 8B, a determination is made by the control process software 26 as to whether there are channels 58 defined in the channel plan 56. If not, then group level statistics are updated, as indicated at block 166. Group level statistics are statistics involving all channels 58 of a node 18, collectively. As examples, group level statistics would include total node power test 64b data and percent availability test data. The foregoing data can be displayed to a user to enable the user to examine the same and used, for example, for determining whether or not to trigger an alarm, as each node may have predefined high and/or low thresholds. Afterward, process flow reverts back to block 152.

If there are any channels 58 defined in the channel plan 56 at block 163, then another looping operation is commenced by the control process software 26 for performing a plurality of tests on channels 58 associated with the particular node 18. The loop commences at block 164.

As indicated at block 164 of FIG. 8C, the configuration data for the next channel 58 in the particular nodes channel plan 56 is fetched from the database 28 (FIGS. 1A–1C) by the control process software 26.

Next, a determination is made as to whether the channel 58 has a test plan 64, as indicated at block 165. If not, then process flow reverts to block 183 for analyzing other channels 58 if they exist. If so, then process flow reverts to block 167.

At block 167 of FIG. 8C, a test plan 64 for the particular channel 58 is fetched from the database 28 by the control process software 26.

Next, a determination is made by the control process software 26 as to whether the C/N test 64e (FIG. 3L) is enabled, as indicated at block 168. If so, then the run test module (FIG. 6B) is called in order to perform the C/N test 64e (FIG. 3L), as indicated at block 171. If not, then process flow reverts to block 172.

Referring to FIG. 8D, at block 172, a determination is made by the control process software 26 as to whether the average noise power test 64c is enabled. If so, then the run test module is called to perform the average noise power test 64c (FIGS. 3G and 3H), as indicated at block 173. If not, then process flow reverts to block 174.

At block 174, a determination is made by the control process software 26 as to whether the channel power test 64d (FIGS. 3I and 3J) is enabled. If so, then the run test module is called to perform the channel power test 64d (FIGS. 3I and 3J), as denoted at block 176. If not, then process flow reverts to block 177.

At block 177 of FIG. 8D, a determination is made by the control process software 26 as to whether the percent availability test 64g (FIGS. 3N and 3O) is enabled. If so, then the run test module is called to perform the percent availability test 64g (FIGS. 3N and 3O), as indicated at block 178. If not, then process flow reverts to block 181.

As indicated at block 181, a determination is made by the control process software 26 as to whether the burst counter test 64f (FIG. 3M) is enabled. If so, then the run test module is called to perform the burst counter test 64f (FIG. 3M), as indicated at block 182. If not, then process flow reverts to block 183.

At block 183, a determination is made by the control process software 26 as to whether there are any other channels 58 in the channel plan 56 that should be tested. If so, then process flow reverts back to block 164 and the foregoing process continues. If not, then process flow reverts to block 166, where the group level statistics, as previously described, are updated.

An example of a possible implementation of the run test subroutine 190 is illustrated by way of flow chart in FIGS. 8E and 8F. Referring to FIG. 8E, after initiation of the run test subroutine 190 at block 191 (which is initiated by any one of the code segments denoted by blocks 158, 163, 171, 173, 175, 178, or 182 in FIGS. 8A–8D), the configuration data for the node 18 or channel 58, whichever is applicable, is fetched from the database 28 by the run test subroutine 190 of the control process software 26. This configuration data is defined within the channel plan 56.

Next, as indicated by block 193, the alarm limit information, if any, for the particular test to be performed is fetched from the database 28 by the run test subroutine 190 of the control process software 26. The alarm limited information is part of the test plan 64, if it has been specified and exists.

At block 194, the specific measurement in the spectrum analyzer 12 and its parameters are set up from the channel plan data.

As indicated at block 196 of FIG. 8E, the measurement is triggered by communicating appropriate control signals from the control process software 26 to the spectrum analyzer 12 via connection 27 (FIGS. 1A–1C), and the control process software 26 waits for signal data from the spectrum analyzer 12. At this step, the control process software 26 communicates to the spectrum analyzer 12 via the connection 27 (FIGS. 1A–1C).

Next, as denoted at block 198, the result of the measurement is retrieved by the control process software 26 from the spectrum analyzer 12.

A determination is made by the run test subroutine 190 as to whether any alarms have been enabled for the particular test, as indicated at block 201 of FIG. 8F, based upon the alarm limit information that was acquired at previous block 193. If not, then process flow reverts to block 205, which will be described hereinafter. If so, then process flow reverts to block 202.

At block 202, a determination is made by the run test subroutine 190 as to whether the measurement result exceeded the defined alarm limit. If not, then process flow reverts to block 205. If so, then process flow reverts to block 203.

As denoted at block 203 of FIG. 8F, alarm statistics are updated in temporary files for ultimate storage in the database 28. After the functionality of block 203 concludes, process flow reverts to block 205.

At block 205, the measurement result is saved to the database 28. The measurement result pertains to either a node 18 or a channel 58.

E. Second Embodiment of Automatic Mode
(Automated Testing Using Smart Scanning Algorithm)

A second embodiment 108" of the software for implementing the automatic mode 108 (FIG. 4) is illustrated by way of flow charts in FIGS. 9A through 9G. The second embodiment 108" incorporates a smart scanning algorithm, in accordance with the present invention, that allows the user to define three separate measurement loops. The second embodiment 108" is an optional feature of the control process software 26 of the data acquisition/analysis system 14 (FIGS. 1A–1C), but is preferred in the best mode (FIG. 1A) of practicing the present invention. As with the first embodiment 108', the second embodiment 108" is designed to run indefinitely, once initiated, until and unless the user controls the control process software 26 to perform some other operation.

Figure 9A:
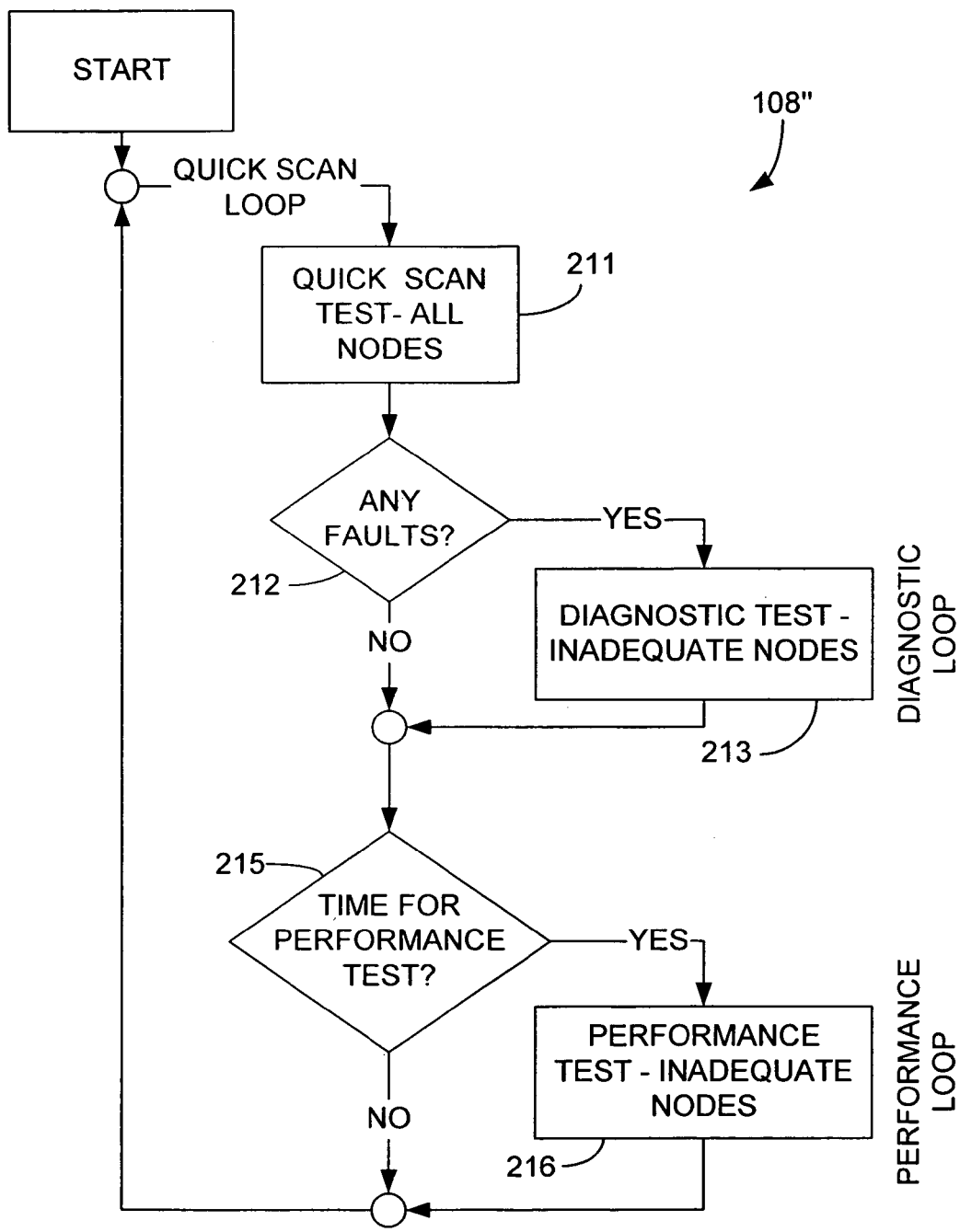

FIG. 9A is a high level flow chart of the methodology, and FIGS. 9B through 9G is a lower level flow chart of a specific implementation of same. Each of the measurement loops has the capabilities of monitoring and measuring different performance factors depending on the tests and time selected. In general, the smart scanning algorithm associated with this second embodiment 108" of the automatic mode software helps optimize system monitoring by identifying and focusing on problem nodes 18 and avoiding unnecessary tests on nodes 18 that are performing well.

1. Main Scanning Loop

With reference to FIG. 9A, the main scanning loop 211–216 performs a quick test of every node 18 within the system under test using, for example, either the spectrum scan test 64a or the DFS test, as in the preferred embodiment and as indicated at block 211. The quick scan test is performed at regular periodic time intervals, based upon a user defined time period (which is tracked internally by a quick scan loop timer). During each pass through the quick scan loop, the control process software 26 notes any nodes 18 that exceed any alarm limits for one or more of the prescribed tests, which are predefined by the user in the test plan 64. If one or more nodes 18 exceed the user-specified operational alarm limits, then the control process software 26 will track this alarm information and, if time permits, will select one or more of those inadequate nodes 18 and perform a more extensive diagnostic test sequence using the diagnostic test loop on the one or more inadequate nodes 18. This functionality is indicated at decisional block 212 in FIG. 9A. The control process software 26 selects the inadequate nodes 18 to test based upon alarm information and the time since the last extended test (under the diagnostic loop) on the node 18.

2. Diagnostic Test Loop

The diagnostic test loop generally performs the most detailed sequence of tests on channels 58 within the node 18, as specified by the user in the test plan 64, that are identified as nodes 18 having the greatest performance difficulties. Tests that exceed operational alarm limits generate critical or advisory alarms, as appropriate. The test plan 64 may prescribe that all available tests be performed on the node 18 at issue. The control process software 26 saves all results from these extended tests in the database 28 (FIGS. 1A–1C) for later review. The user can view and use this data to diagnose problems and evaluate trends.

3. Performance Loop

Based in general upon a user-defined time period (a performance loop timer tracks the time) for each node 18, the control process software 26 will perform a regularly-scheduled detailed set of tests on each node 18 within the system under test using the performance loop. These measurements ensure that baseline performance metrics are captured for all nodes 18 within the network under test for subsequent trend analysis. An example would be a C/N test 64e on all channels of the node 18 at some minimal baseline frequency. The time period can be any suitable period, for example, but not limited to, 2 hours.

If desired, the user may specify the same set of tests for the performance loop as the diagnostic loop. If the tests for these loops are different, then it is envisioned that the diagnostic loop will take longer to perform on a node 18, because it will likely have more tests to perform, as this loop focuses on substandard nodes 18.

4. Smart Scanning Algorithm

Some of the key objectives of the smart scanning algorithm associated with this second embodiment 108" of the automatic mode software are as follows: (a) test inadequate nodes 18 more frequently than adequate nodes 18; (b) the worse the node 18, the more frequent the node 18 should be tested; (c) make sure all inadequate nodes 18 get tested periodically (no starvation); (d) ensure that the quick scan loop is run at a guaranteed rate so as to find new problems in a timely way; and (e) consider both current data and trend data (over time) for determining test priority.

With reference to FIG. 9A, the smart scanning algorithm commences analysis by implementing the quick scan loop on all nodes 18, as indicated at block 211. The quick scan loop is re-initiated periodically, depending upon a quick scan loop timer, which tracks a quick scan loop time period (e.g., two minutes; interval between quick scan tests) that is predefined by the user or that is predefined by a default setting in the software. After the quick scan test on all nodes 18, the smart scanning algorithm will implement a diagnostic test analysis 213 using the diagnostic loop, on a node 18 that has been identified as the most inadequate in that it has the highest test priority score. After processing the worst node 18, then the diagnostic loop will move down the list of nodes 18, select the node 18 having the next highest test priority, and will analyze it. The diagnostic loop will continue the foregoing process, until the quick scan loop timer reaches the user-defined quick scan loop time period, at which point the diagnostic loop will be exited, and the quick scan loop will be re-initiated.

Finally, a performance test analysis 216 using the performance loop is periodically performed on a node 18 under consideration after the quick scan analysis 211 on each node 18, at the time when a performance loop timer reaches a user-defined performance loop time period for the node 18 (e.g., every two hours) and provided that there is time on the quick scan timer to perform the performance loop.

a. Test Priority Score System

With respect to the diagnostic loop and the performance loop, the smart scanning algorithm implements a test priority score system (many other types of prioritizing schemes are obviously possible) in the preferred embodiment to determine a sequence for extensively testing nodes 18 via the loops. Those nodes 18 exhibiting a high test priority score (points) will be tested earlier than those nodes 18 having a lower test priority score.

This test priority score is recalculated every time through the quick scan loop. In the preferred embodiment, there are five components of the overall test priority score for a node 18, which are mathematically combined (summed) in order to derive the test priority score for the node 18. The first three components are based on measured results from the node 18. The fourth element is indicative of whether or not the performance loop timer for the node 18 has expired. The fifth element is the deferral score for the node 18, which is used to make sure that all inadequate nodes 18 eventually get tested. Otherwise, the worst nodes 18 would tend to get re-tested and starve some not-so-inadequate nodes 18 from ever being evaluated with the diagnostic and/or performance loops.

The "quick scan score" is based on the measurement performed in the quick scan loop, which will either be the DFS test or a spectrum scan test 64a in the preferred embodiment. In either case, the test essentially retrieves a collection of data points representing power amplitude versus frequency. Each of these values will either be within defined limits or outside of the alarm limits. In the preferred embodiment, the quick scan score is computed by deriving the percentage of these data points that are outside the acceptable range and multiplying this percentage by a suitable value, for example but not limited to, 50.

The "previous diagnostic loop alarm score" is indicative of any alarms associated with the particular node 18 that were generated by said diagnostic loop tests. In the preferred embodiment, the previous diagnostic loop alarm score is computed by taking the percentage of alarmable measurements from the most recent diagnostic loop that caused alarms and multiplying this percentage by a suitable value, for example but not limited to, 25.

The "long term alarm score" is similar to the previous diagnostic loop alarm score, except that the former is based on all the alarmable tests since the node's alarms were last reset. Thus, in the preferred embodiment, the long term alarm score is computed by taking the percentage of all alarmable measurements from all of the loops (quick scan, diagnostic, and performance loops) and multiplying this percentage by a suitable value, for example but not limited to, 25.

The fourth element is the "performance loop timer expired score." This score is indicative of if and when the performance loop timer expired. It can be based upon the time remaining on the timer, the time since the timer expired, and/or the fact that the timer has expired. In the preferred embodiment, this score is based upon the latter and can be either 0 or 40, depending if the timer has not expired or has expired, respectively.

The fifth element is the "deferral score," which represents whether a node 18 should have been tested on a previous iteration through the diagnostic or performance loop, but was deferred, because the quick scan timer expired. Each time a node 18 is deferred, the deferral score rises by a predefined fixed number, for example, 25, as in the preferred embodiment, or in the alternative, by a number generated from a suitable equation. The latter approach enables implementation of a nonlinear function. Eventually, a deferred node 18 will advance to the top of the priority list and will get a diagnostic test. This methodology prevents a consistently inadequate node 18 from starving a less-inadequate node from getting attention 18.

Based upon the architecture of the second embodiment 108" of the automatic mode software, each node 18 under consideration will get a diagnostic test through the diagnostic loop, or alternatively, a deferral, based upon a predefined node adequacy threshold. More specifically, a node adequacy threshold is defined by the user, which serves as the line of demarcation between adequate and inadequate nodes 18. For example, the node adequacy threshold could be set at 25. In this case, any nodes 18 that have a test priority score of less than 25 are adequate, will get a deferral, and will not be analyzed by the diagnostic loop during the current iteration through the functionality defined by the flowchart. In contrast, any nodes 18 that have a test priority score of 25 or greater are inadequate.

In conclusion, the test priority score for a node 18 is computed by summing the following points: (a) quick scan score (in the preferred embodiment (intended to be a non-limiting example), between 0 and 50, inclusive); (b) previous diagnostic loop alarm score (in the preferred embodiment, between 0 and 25, inclusive); (c) long term alarm score (in the preferred embodiment, between 0 and 25, inclusive); (d) performance loop timer expired score (in the preferred embodiment, 0 or 40, for timer not expired or timer expired, respectively); and (e) total deferral score (in the preferred embodiment, add a particular number each time the node 18 is deferred, perhaps, 25). Moreover, a node adequacy threshold is set and is compared to the test priority score of a node 18 to determine whether a node will undergo analysis via the diagnostic loop.

b. Example of Test Priority Score Computation

Consider the following example to understand better the computation of the test priority score for each node 18.

Assume that the quick scan loop performed a quick scan test on a particular node 18. If the DFS test had 20 discrete frequencies that it is measuring, and for 12 of those frequencies the measured value is above or below the expected range, then the quick scan score would be mathematically calculated as follows:

$$(12/20)*50=30.$$

Now consider the previous diagnostic loop alarm score. Assume, for example, that the last diagnostic loop for the particular node 18 had 7 measurements (pursuant to the test plan 64) and 3 of the measurements exceeded alarm limits. In this event, the previous diagnostic loop alarm score for this particular node 18 would be computed as follows:

$$(3/7)*25=10.7$$

Next, the long term alarm score is calculated. If since the last reset, there were 6000 alarmable tests that were run, and 1000 of them triggered an alarm, then the long term alarm score would be computed as follows:

$$(1000/6000)*25=4.2.$$

Further, the performance loop timer expired score is now computed. As an example, assume that 0 means that no time has expired on the timer and that 40 means that all time has expired on the timer. Further assume that the time on the performance loop timer was half expired when the test priority is computed. At this point, the score would be computed as follows:

$$(1/2)*40=20.$$

The deferral score is determined as follows. Assume that the particular node 18 had been deferred only once. Thus, the deferral score would be 25.

Accordingly, when the quick scan loop determines the test priority score at block 232 (FIG. 9B), the test priority score would be computed as follows:

$$30+10.7+4.2+20+25=89.9.$$

Furthermore, because the adequacy threshold in the preferred embodiment is 25, this particular node 18 is very inadequate and will likely be reviewed early during the next iteration through the diagnostic loop.

5. Preferred Specific Implementation

FIGS. 9B through 9G collectively show an example of a possible specific implementation of the second embodiment of the automatic mode software (smart scan algorithm) shown in FIG. 9A that may be implemented by the control process software 26 when it operates in the automatic mode 108 (FIG. 4).

Figure 9B:
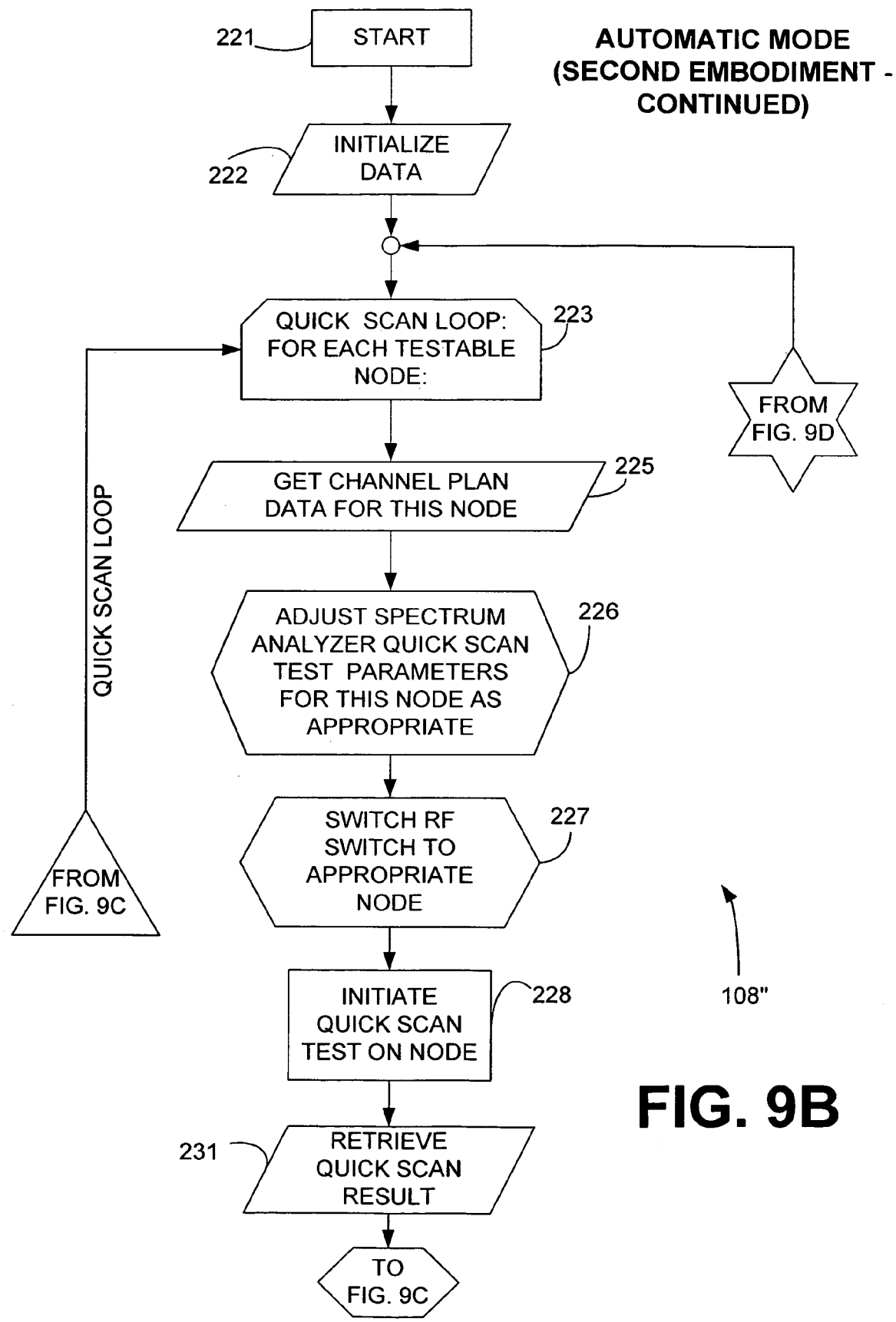

With reference to FIG. 9B, after the smart scanning algorithm is commenced at block 221, data is initialized at block 222. In this step, among other things, variables are initialized (set to zero or another predefined value, for example), including the scores and timers. Process flow then reverts to block 223.

a. Quick Scan Loop

At block 223, the quick scan loop is commenced. The quick scan loop is designed to perform a quick test measurement, for example, but not limited to, a spectrum scan or DFS test on all of the nodes 18. At block 223, a testable node 18 is identified, and process flow then reverts to block 225.

As indicated at block 225, the channel plan data for this node 18 under consideration is obtained from the database 28 by the control process software 26.

Next, at block 226, the parameters for the quick scan test are determined and adjusted for the node 18 that is at issue. As mentioned, the quick scan test can be any suitable test that can be performed quickly, including but not limited to, the spectrum scan test 64*a* or the DFS test.

At block 227, the switch 16 (FIGS. 1A–1C) is controlled by the control process software 26 to select an appropriate node 18 for analysis by the spectrum analyzer 12. Process flow then reverts to block 228.

At block 228, the quick scan test is initiated on the selected node 18. The control process software 26 sends appropriate control signals to the spectrum analyzer 12 on connection 27, thereby causing the quick scan test to occur.

As indicated at block 231, the control process software 26 retrieves the quick scan result(s) from the spectrum analyzer 12 via the connection 27.

Figure 9C:
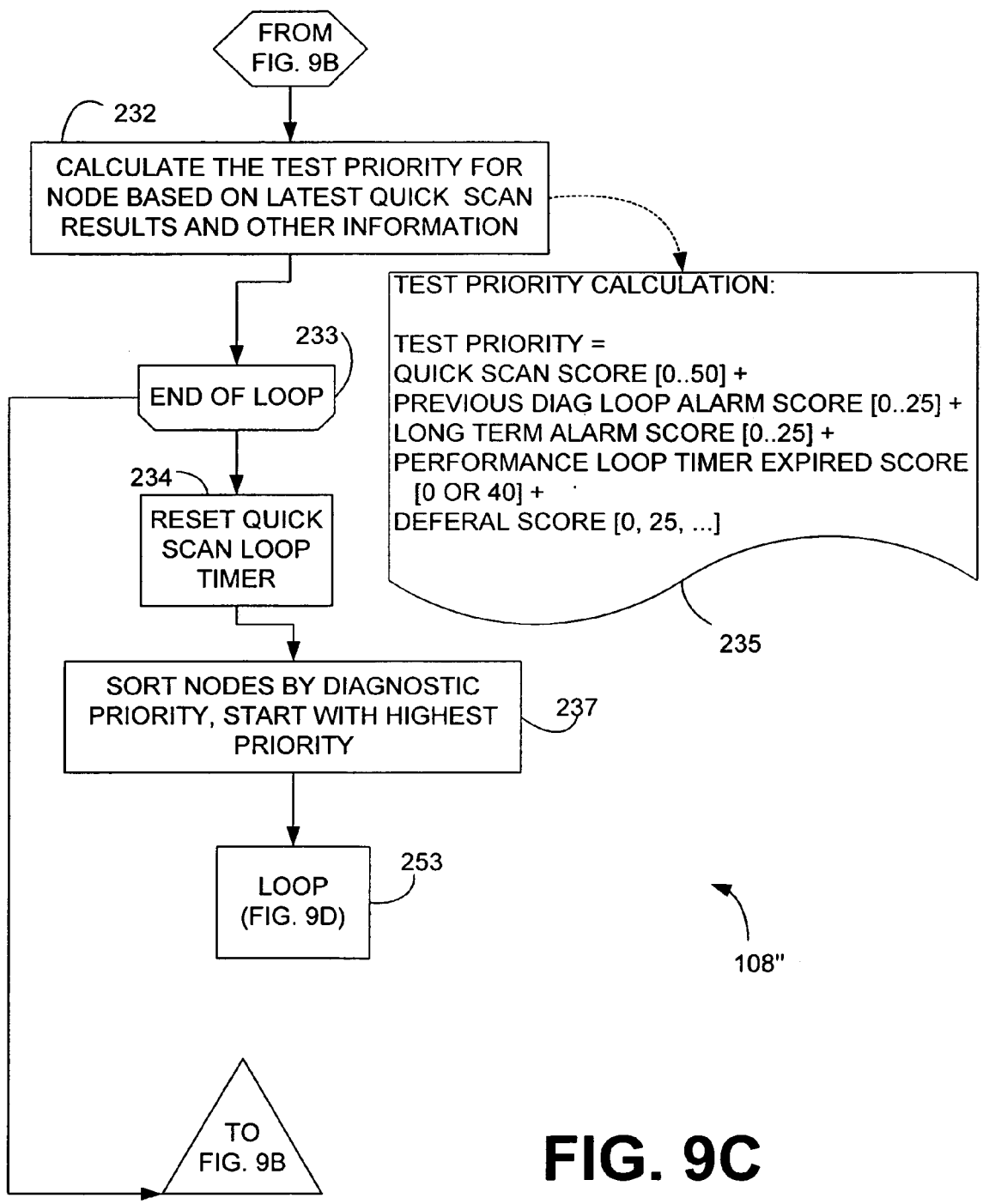

As indicated at block 232 in FIG. 9C, the test priority score for the node 18 is updated based on the latest quick scan results and history information. The test priority score for a node 18 is computed by summing the following points: (a) quick scan score (between 0 and 50, inclusive); (b) previous diagnostic loop alarm score (between 0 and 25, inclusive); (c) long term alarm score (between 0 and 25, inclusive); and total deferral score (add a particular predefined number each time the node 18 is deferred, perhaps, 25).

Afterward, this iteration of the quick scan loop concludes, as indicated at block 233, and process flow reverts back to block 223 of FIG. 9B for analysis of another testable node, if any remain. If any do not remain, then process flow passes to block 234 of FIG. 9C.

b. Setup For Large Loop

As indicated at block 234 of FIG. 9C, the quick scan loop timer is reset. At this point, process flow will be passed to a large looping operation that will perform either the diagnostic loop or the performance loop on a node-by-node basis based upon the test priority score for each node 18, and this quick scan loop timer will eventually force a context switch out of this large looping operation and back to the beginning of the quick scan loop.

Next, as indicated at block 237, the nodes 18 are sorted by test priority score, from highest priority to lowest priority (i.e., from those needing the most attention to those needing the least attention) to form a sorted list.

c. Large Loop

A loop operation begins at block 238 of FIG. 9D that will cause, during each iteration through the loop, performance of either the diagnostic loop or the performance loop on each node 18. In essence, the diagnostic loop and the performance loop are parallel loops that are nested within a large loop.

As indicated at block 239, the channel and test plan data for the next node 18 having the highest priority, as determined from the sorted list, is retrieved by the control process software 26 from the database 28. Process flow then reverts to block 241.

At block 241, a determination is made as to whether it is time for an analysis of the current node 18 under the performance loop. This determination is based upon the performance loop time period, for example but not limited to, 2 hours, which is predefined by the user or otherwise. The time period it tracked with a performance loop timer. Based upon the timer, process flow reverts to either block 242 for performance of the diagnostic loop or block 268 of FIG. 9F for performance of the performance loop.

d. Diagnostic Loop

Figure 9E:
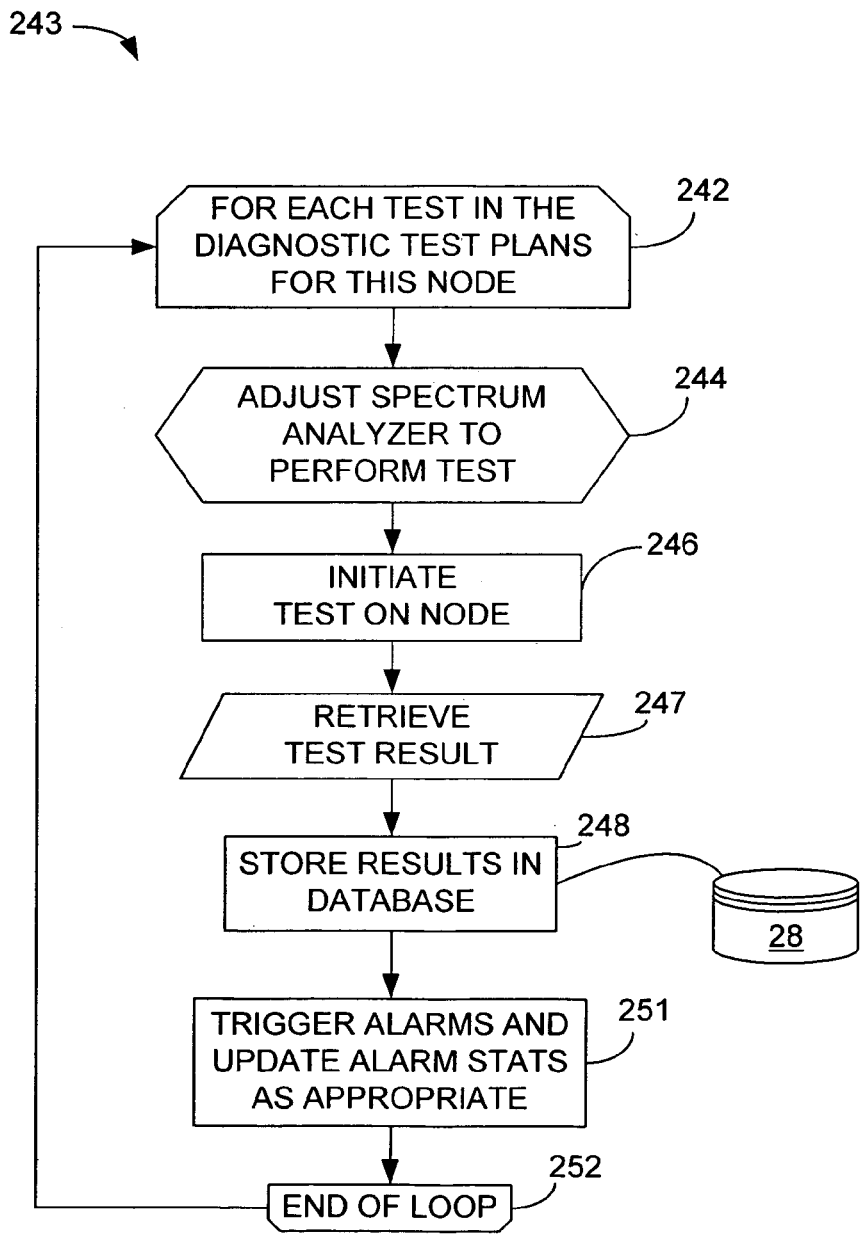

Starting at block 242 of FIG. 9E, the diagnostic loop identifies a test prescribed in the test plan 64 pertaining to this particular node 18.

At block 244, the spectrum analyzer 12 is adjusted to perform the particular test. In this regard, the computer 22 (FIGS. 1A–1C) passes appropriate control signals to the spectrum analyzer 12 via the connection 27.

Next, at block 246, the test is initiated by the control process software 26 on the node 18 that is at issue, via communicating appropriate control signals by way of connection 27 to the spectrum analyzer 12.

At block 247, the control process software 26 retrieves the test result(s) from the spectrum analyzer 12, and the result(s) is stored in the database 28, as indicated at block 248.

At block 251, the alarm limits, if any, associated with the current test are considered. Alarms are triggered, if appropriate. Further, alarm statistics are updated, as appropriate. At this point, as indicated at block 252, this iteration of the diagnostic loop concludes and process flow reverts back to block 242 for performance of another test, if any remain to be performed. If no tests remain in the test plan 64 for this current node 18, then process flow reverts to block 254 of FIG. 9D.

With reference to FIG. 9D, as denoted at block 254, a determination is made (a) as to whether it is time to perform the quick scan loop and also (b) as to whether the next node 18 on the priority list is adequate (so that another iteration of the diagnostic loop is unnecessary). The quick scan loop is performed every quick scan loop time period, which is predefined by the user or otherwise. This time period is tracked with the software-based quick scan loop timer. If the time period has expired, then process flow will revert to a software module, starting at block 258, for adjusting the deferral score of the current node 18. Also, the diagnostic loop will be exited if the current node 18 has a test priority score of less than, for example but not limited to, 25, which means that the current node 18 is adequate (and also that the remainder of the nodes 18 after it in the priority list are also adequate, as they were sorted from highest to lowest and analyzed in that manner). When the current node 18 does have a test priority score of less than 25, then process flow passes to the software module for adjusting the deferral score, starting at block 258. If neither the quick scan loop time period has expired nor the test priority score is less than 25, then process flow reverts back to block 238 for another iteration through either the diagnostic loop or the performance loop and thus analysis (with perhaps a new channel plan 56 and new test plan 64) of another node 18.

e. Adjusting Deferral Scores Loop

The module for adjusting deferral scores is now described. This module starts at block 258 of FIG. 9G.

Figure 9G:
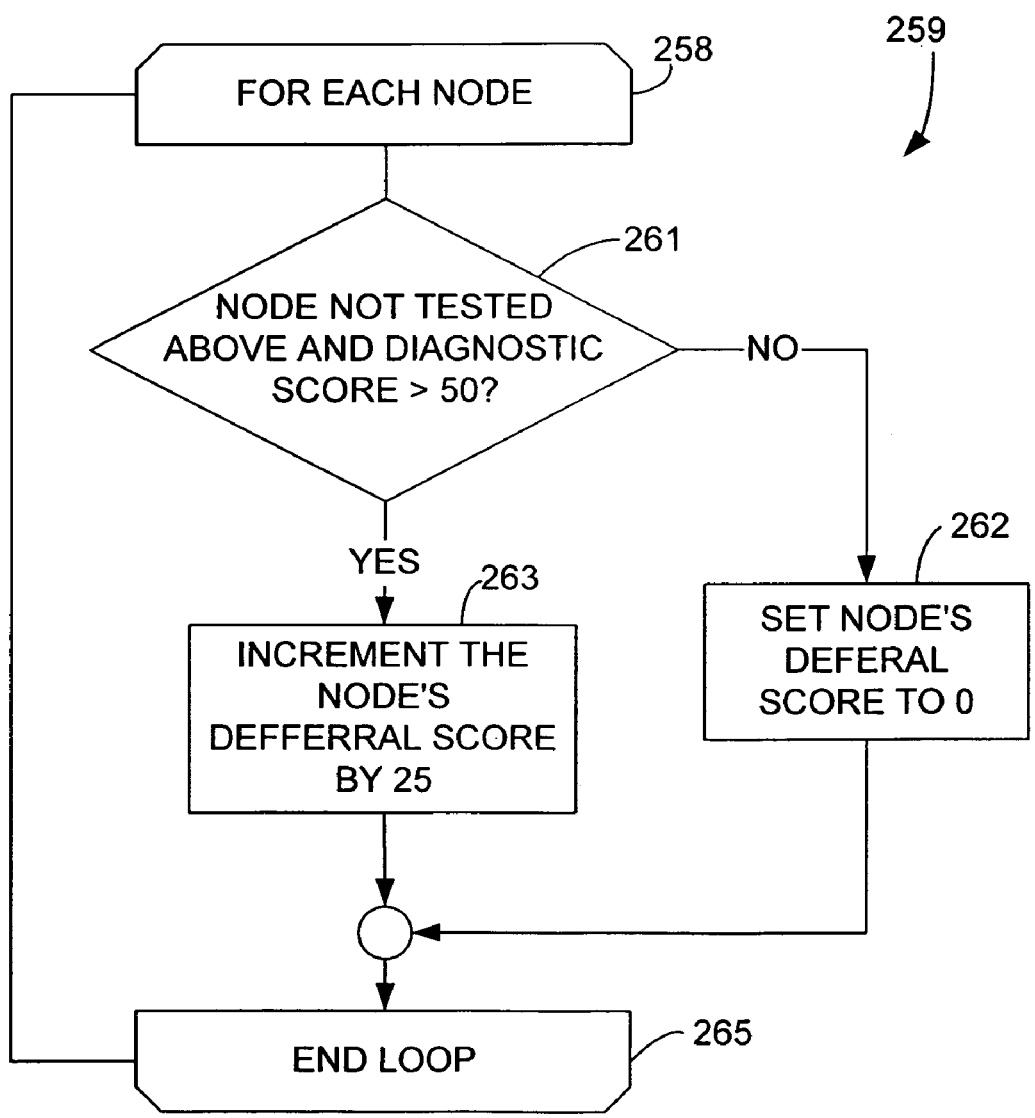

Referring to FIG. 9G, at block 258, a looping operation is commenced, for analysis of all remaining nodes 18, i.e., those nodes 18 that were not analyzed in large loop 242–256.

At block 261, a determination is made as to whether the node 18 was (a) not tested previously and (b) exhibited a test priority score of greater than or equal to 25. If not, then the deferral score of the node 18 is set to zero, as indicated at block 262. If so, then the deferral score of the node 18 is incremented by a value of 25. Increasing the deferral score of a node 18 will insure that a node 18 eventually gets analyzed under the diagnostic loop.

Finally, the adjust deferral scores loop ends, as indicated at block 265 and process flow reverts back to block 258, if there are other nodes 18 to consider. If there are no other nodes 18 to consider, then process flow reverts to block 223 of FIG. 9B, where another quick scan loop is commenced.

f. Performance Loop

Starting at block 268 of FIG. 9F, the performance loop identifies a test prescribed in the test plan 64 pertaining to this particular node 18.

At block 273, the spectrum analyzer 12 is adjusted to perform the particular test. In this regard, the computer 22 (FIGS. 1A–1C) passes appropriate control signals to the spectrum analyzer 12 via the connection 27.

Next, at block 274, the test is initiated by the control process software 26 on the node 18 that is at issue, via communicating appropriate control signals by way of connection 27 to the spectrum analyzer 12.

At block 276 of FIG. 9F, the control process software 26 retrieves the test result(s) from the spectrum analyzer 12, and the result(s) is stored in the database 28, as indicated at block 277.

At block 279, the alarm limits, if any, associated with the current test are considered. Alarms are triggered, if appropriate. Further, alarm statistics are updated, as appropriate. At this point, as indicated at block 281, this iteration of the performance loop concludes and process flow reverts back to block 268 for performance of another test, if any remain to be performed. If no tests remain in the test plan 64 for this current node 18, then process flow reverts to block 282.

At block 282, the performance loop timer for the current node 18 is reset to, for example, zero. At this point, process flow will be passed back to the large looping operation that could perform either the diagnostic loop or the performance loop on another node 18, provided that the quick scan loop timer has not expired and the test priority score for the next node 18 is not less than the predefined adequacy threshold. This performance loop timer will eventually force the large loop to pass the node 18 back to the performance loop.

After block 282, process flow passes to block 254 of FIG. 9D, which has been described previously, and so on.

V. Graphical User Interface (GUI) Screens

A. Navigation/Monitoring

With reference to FIGS. 10 and 11A–11K, the following discussion describes a number of GUI screens that can be produced by the GUI software 32 in the preferred embodiment and by which a user may control the monitoring system 10 (FIG. 1A). The GUI screens of FIGS. 10 and 11A–11K provide information at different levels, namely, group, node, and channel levels. The various GUI screens of FIGS. 11A–11K provide a significant advantage in that critical problem events associated with a particular group of nodes 18, node 18, or channel 58 are indicated in the context of the particular group, node 18, or channel 58. In this manner, a user can rapidly identify one or more problems with a particular group, node 18, or channel 58 to take corrective action. Within the context of the GUI screens of FIGS. 11A–11K, there are generally two levels of problem indication. The first is a critical level and the second is an advisory level. The particular test parameters that trigger either a critical warning or an advisory warning are user configurable as will be discussed.

Figure 10:
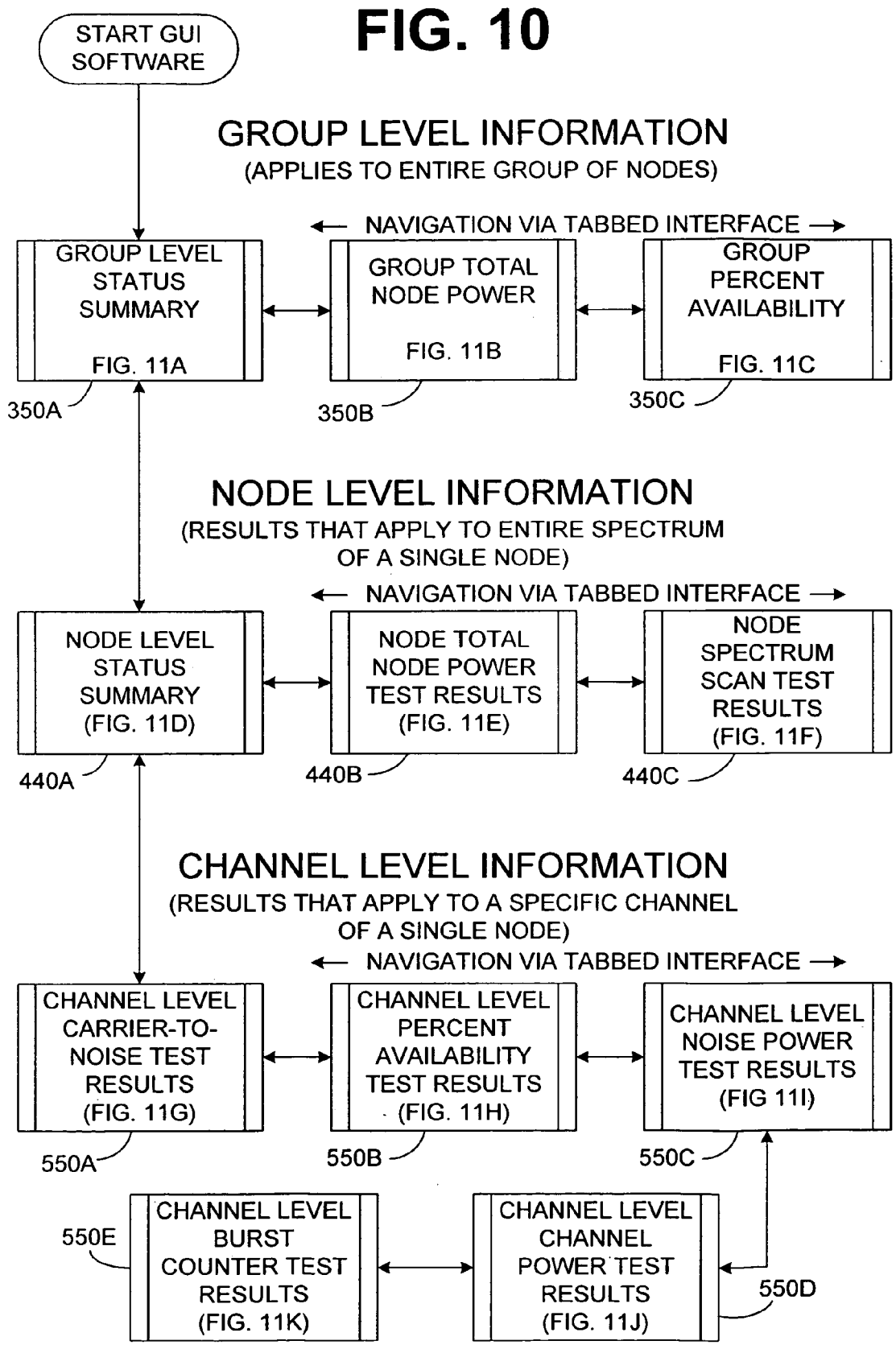
FIG. 10 is a diagram showing the hierarchical relationship of and navigational path through display screens generated by the graphical user interface (GUI) of the monitoring system of FIGS. 1A–1C.

FIG. 10 shows how a user can navigate through the various GUI screens to be described in detail relative to FIGS. 11A through 11K.

Turning then, to FIG. 11A, shown is a group level GUI screen 350. The GUI screen 350 includes a first indicator box 353 that indicates a number of parameters. These parameters include a number of critical events with an accompanying facial indicator 356 and also a percent advisory critical indicator 359. The first indicator box 353 also includes a test status box 363 that indicates a name and operational status of a particular test if relevant. The first indicator box 353 also includes a current mode box 366 in which is included, among other things, a monitor button 366a, a manual button 366b, and a configure button 366c. The monitor, manual, and configure buttons 366a–366c correspond to the various modes 102, 104, and 106 (FIG. 4) of operation of the monitoring system 10 (FIG. 1A) and can be selected by the user to cause the monitoring system 10 to operate in one of these modes. Finally, the first indicator box 353 includes a help button and quit button which are depressed when the user desires a help menu with related information or if the user wishes to quit the operation of the monitoring system 10. The first indicator box 353 may also be considered as a universal interface component as it is displayed with most of the following GUI screens as will be discussed.

The group level GUI screen 350a also includes a display level selector box 369. The group level GUI 350 also includes a group level tab box 373. The group level tab box 373 generally appears when the group button in the display level selector box 369 is depressed.

The group level GUI screen 350a further includes an informational box 376 that lists various information pertaining to the particular group displayed as well as a group alarms box 379. The group alarms box 379 includes the facial indicator 356 as well as the number of critical events that have occurred within the group and the percent advisory indicator 359 as shown. The group alarms box 379 also includes a reset alarm button that resets a number of recorded values relative to the operation of the particular group indicated in the group level GUI screen 350a.

The group level tab box 373 is shown with an active group status tab 383. Under the group status tab 383 is a node information table 386 that indicates a number of nodes 389 with a number of parameters relating to each of the nodes 389. The group status tab 383 also shows a view selector 393, a sort selector 396 and a print button 399. The view selector 393 indicates the particular format of the information on the node information table 386. Likewise, the sort selector 396 controls the particular parameter by which the nodes 389 ordered in the node information table 386. Finally, once depressed, the print button 399 causes the node information table 386 to be printed accordingly.

If the user wishes to view a particular node level GUI screen (to be described later) for one of the nodes 389 listed in the node information table 386, the user need only double-click or select the specific node 389 listed in the node information table 386. The user may also single click on one of the nodes 389 to select that node 389 as indicated by highlighting the node button in the display level selector box 369. Note that the various mechanisms of the GUI screens discussed herein may be manipulated with mouse or keyboard, as is well known in the art.

For each node 389, the node information table 386 includes a status field which indicates a state of the node 189. Each node 389 transitions between one of three states, including a normal state as indicated by the smiling facial indicator, an advisory state as indicated by the "worried" facial indicator as shown, and a critical state as indicated by a frowning facial indicator. Note that the frowning facial indicator is indicated as a color separate from the advisory and normal smiley faces as shown. In the preferred embodiment, the particular color of all critical components of a GUI screen 350A are red so that the user is quickly apprised of critical events associated with a particular node or group. Likewise, all advisory components are preferably yellow or some other suitable color. The GUI screens of the present invention provide a significant advantage in that to determine or locate a particular problem with a specific node 18 and/or channel 58, a user need only to "follow the red or yellow" throughout the various GUI screens as is discussed herein. Note that the channel plan graph 385 also includes parameters such as the switch number, number of critical events, and a percent advisory value for each respective node 389 as shown as well as the number of tests that each node has undergone. The group status tab 383 also includes a help button 401 that the user may manipulate to generate a help interface screen, etc., as shown in the art. The group level tab box 373 also includes a "group total node power" tab 403 that is depressed by the user to display the relevant information as will be discussed.

Turning then, to FIG. 11B, shown is a group level GUI screen 350b according to another embodiment of the present invention. The group level GUI screen 350b is similar to the group level GUI screen 350a (FIG. 11A) except that the group total node power tab 403 is active. The group total node power tab 403 provides a graphical depiction of the power for each node reference 389 (FIG. 11A; corresponds to each node 18 in FIGS. 1A–1C) in the identified group. The group total node power tab 403 includes a total node power graph 406 that illustrates the power for each node reference 389 in terms of decibel millivolts per bandwidth (dBmV/BW) as shown. For each node reference 389, a range is shown with an average value of the node power in the center indicated by the circles 409. For each node reference 389, an upper and lower triangle 411 is displayed to indicate high and low node power values. The group total node power tab 403 also includes a number of push buttons 413 that allow the user to perform a number of functions relative to the total node power graph 406, including saving, copying, graph orientation and type, note taking, zoom in and zoom out, printing, print preview, and toggling amongst the various nodes in the group.

Referring to FIG. 11C, shown is a group level GUI screen 350c in which the group percent availability tab 423 is active. The group percent availability tab 423 causes an average percent availability graph 426 to be displayed. The average percent availability graph 426 displays a low availability, a high availability, and an average availability for each node in the group in the form of a bar graph as shown.

Generally, the group status tab 383, group total node power tab 403, the group percent availability tab 423, and the informational box 376 may be considered group level interface components that are displayed at the group level as discussed above.

Turning then to FIG. 11D, shown is a node level GUI screen 440a according to another embodiment of the present invention. The node level GUI screen 440a includes the first indicator box 353 in similar fashion to the group level GUI screens 350a–350c (FIGS. 11A–11C). Also included, is the display level selector box 369 in which the node button id depressed as shown thereby displaying a node level tab box 436 and a node level information box 439. The node level tab box 436 and node level information box 439 provide information relative to a selected node 18 in the particular group, as discussed. The node level tab box 436 also includes a node status tab 433, a total node power results tab 436, and a spectrum scan results tab 449. The particular node 18 for which information is displayed in the node level tab box 436 and the node level information box 439 depends upon the selected node 389 (FIG. 11A) that is shown in the group level tab box 373 with the group status tab 383. To show information on a different node 18, the user depresses the group button in the display level selector box 369 to select a different node 389 accordingly. The node level information box 439 displays information relative to the particular node selected in the node information table 386 (FIG. 11A). In addition, the node level information box 439 includes a node alarms box 453 in which a percent advisory indicator 456 is shown for the particular node 18 in question as well as the number of critical events and a corresponding facial indicator 356.

The node status tab 443 is indicated with a colored region 459 and an appropriate facial indicator 356 that informs a user whether a critical event has occurred with one of the channels 58 in the node 18 displayed. Note that the colored region 459 may be, for example, red if a critical event has occurred, or yellow if the advisory percentage is greater than zero for a channel 58 associated with the node 18 displayed. The node status tab 443 also includes a channel plan graph 463 that shows a frequency spectrum of a number of channels 58 on a particular node 18 as shown. In particular, a number of frequency bands 466 are displayed. Each frequency band 466 is associated with a respective channel 58 of the node 18. The frequency bands 466 may be filled in with an appropriate indicator color 469 that indicates whether the particular channel 58 associated therewith has experienced one or more critical events or includes a percent advisory greater than zero (i.e., red, yellow, etc.). The user may select one of the channels 58 by clicking on the associated frequency band 466 therewith. The user may also double-click on the associated frequency band 466 to move to a channel level display for that particular channel 58. Likewise, the user may select one of the frequency bands 466 and then depress the channel button in the display level selector box 369 to move to the same channel level display. Listed at the bottom of the node status tab 443 is information relevant to the channel 58 corresponding to the selected frequency band 466 as shown.

Turning then to FIG. 11E, shown is the display screen when the total node power results tab 446 is active according to another embodiment of the present invention. The total node power results tab 446 includes a total node power graph 473 that indicates the power of a particular node with respect to time as shown. The total node power graph 473 includes an upper critical limit 476, an upper advisory limit 479, a lower advisory limit 483, and a lower critical limit 486. The limits 476, 479, 483, and 486 are indicated by dashed lines; however, they may be indicated by lines of specific colors such as, red lines for the upper and lower critical limits 476 and 486, and yellow lines for the upper and lower advisory limits 479 and 483. Note other colors may be used as well. The upper and lower critical/advisory limits 476, 479, 483, and 486 provide thresholds that indicate a critical or advisory event when the amplitude of the total node power exceeds the particular limit in question. The total node power graph 473 also includes a number of discrete node power points 489 that correspond to specific measurements of the total node power at specific times using the monitoring system 10 (FIG. 1A).

The total node power results tab 446 also includes a scroll bar 493 by which one may retreat or advance the time indication of the total node power graph 473 appropriately.

FIG. 11E also includes the run manual test button 496. The run manual test button 496 allows the user to change the current operating mode from "monitor" to "manual" (after confirming the operation in a confirmation interface (not shown). The GUI software 32 transfers all the 3010H spectrum analyzer 12 configuration settings that were used in the original test. In this way, the user enters manual mode with the 3010H spectrum analyzer already configured to perform a particular test with the same settings that were used when the test was performed when the data acquisition/analysis system 14 was in automatic test mode. In this way, the user can determine what is currently occurring on a particular node 18 or channel 56. It is important to note that the run manual test button 496 is available with total node power results, spectrum scan results, average noise power results, channel power results, and burst counter results (FIGS. 11E–F, and 11I–11K).

With reference to FIG. 11F, shown is a node level GUI screen 440c in which the spectrum scan results tab 449 is active. The spectrum scan results tab 449 includes a node spectrum scan 503 in which the frequency bands 466 are illustrated as shown. The node spectrum scan 503 also includes a plot of an actual spectrum scan 506 across a particular node 189. Note that the actual spectrum scan 506 is a discrete scan in that it is performed at a specific time. The user may cause the frequency bands 466 to appear or disappear based on a channel plan selector 509. In this manner, the user can display the channel plan that comprises the number of frequency bands 466 and compare it with the actual spectrum scan 606 of the node itself. Given that a number of actual spectrum scans 506 are performed periodically, the spectrum scan results tab 449 also includes a playback mechanism 513 in which the user may play back the recorded actual spectrum scans 506 consecutively to provide a real time appearance of the behavior of the node power for the particular node in question.

The point/point delta button 517 opens a user window interface that enables the user to obtain detailed information from any two points on the node spectrum scan 503. Specifically, the interface provides the change in frequency in MHz and the change in amplitude in dBmV/230 kHz between any two user selectable points. The user selects a first data point by manipulating a cursor over the node spectrum scan 503 and applying a double-left-click on the mouse. Similarly, the user selects a second data point by locating the cursor over the second data point and applying a second double-left-click on the computer mouse or similar pointing device. Once both the first and the second data points are selected, the interface computes and displays the deltas as described above.

The multiple traces button 521 opens an interface that allows the user to create a spectrograph by overlaying multiple individual node spectrum scans 503. In short, the interface allows the user to scroll through the history of individual node spectrum scans 503 and provides an "add trace" button (not shown) that permits the user to overlay spectrum scans on the same display.

Generally, the node status tab 443, total node power results tab 446, the spectrum scan results tab 449, and the informational box 439 may be considered node level interface components that are displayed at the node level as discussed above.

Turning to FIG. 11G, shown is a channel level GUI screen 550a according to another embodiment of the present invention. The channel level GUI screen 550a is displayed when the channel button in the display level selector box 369 is depressed from the node level GUI screens 440a–c or by double clicking on a particular frequency band 466 (FIG. 11D). The channel level GUI screen 550a includes a channel level information box 553 that lists a number of parameters relevant to the particular channel 58 displayed as shown. The channel level information box 553 also includes a channel alarms box 556 with a facial indicator 356 and a percent advisory indicator 456 that relate to the particular selected channel 58.

The channel level GUI screen 550a also includes a channel level tab box 559. The channel level tab box 559 is comprised of a C/N ratio results tab 563, a percent available results tab 566, an average noise power results tab 569, a channel power results tab 573, and a burst counter results tab 576. As shown in FIG. 11G, the C/N ratio results tab 563 is active in the channel level GUI screen 550a.

Within the C/N ratio results tab 573 is a channel carrier to noise graph 579 that plots the channel carrier-to-noise ratio curve 581 with respect to time as shown. The channel C/N graph 579 includes an advisory limit 583 and a critical limit 586 that trigger when the channel C/N ratio is unacceptable. Note that facial indicator 356 and the percent advisory indicator in the channel alarms box 556 are generated based upon the critical events and the advisory events that occur based upon the advisory limit 583 and a critical limit 586 as shown.

Turning then, to FIG. 11H, shown is a channel level GUI screen 550b that includes the channel level tab box 559 with the percent available results tab 566 active. The percent available results tab 566 displays a channel percent available graph 589 that plots the percent availability 593 of the respective channel 58 with respect to time. The channel percent available graph 589 includes a critical limit 596 and an advisory limit 599 specified by the user and employed to trigger the advisory and critical events with respect to the channel level alarms 556.

Figure 11I:
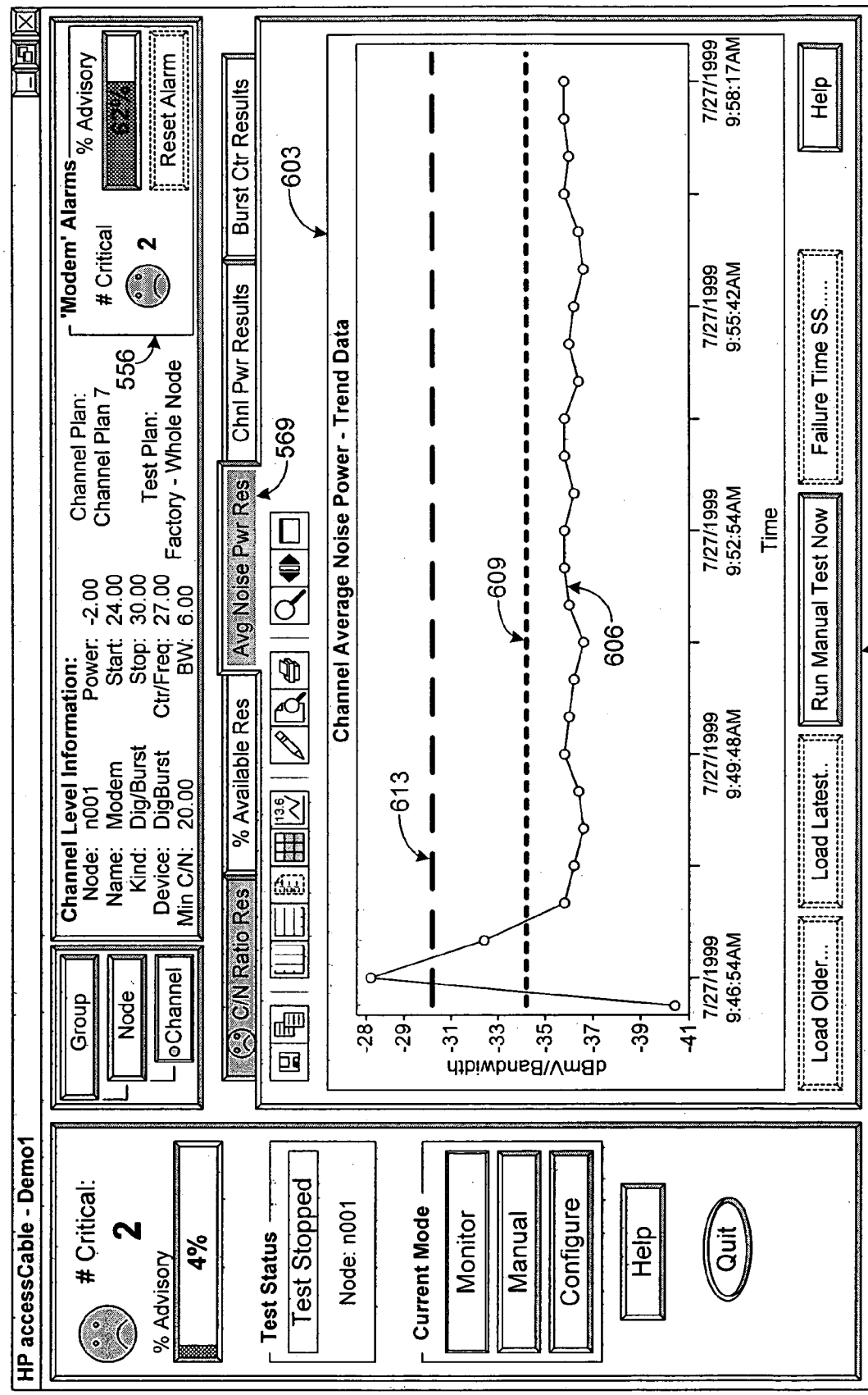

With reference then, to FIG. 11I, shown is another channel level GUI screen 550c that includes the channel level tab box 559 with the average noise power results tab 569 active. The average noise power results tab 569 includes a channel average noise power graph 603 that plots the average noise power 606 with respect to time as shown. The channel average noise power graph 603 includes an advisory limit 609 and a critical limit 613 that trigger advisory and critical events when breached by the average noise power 606.

Figure 11J:
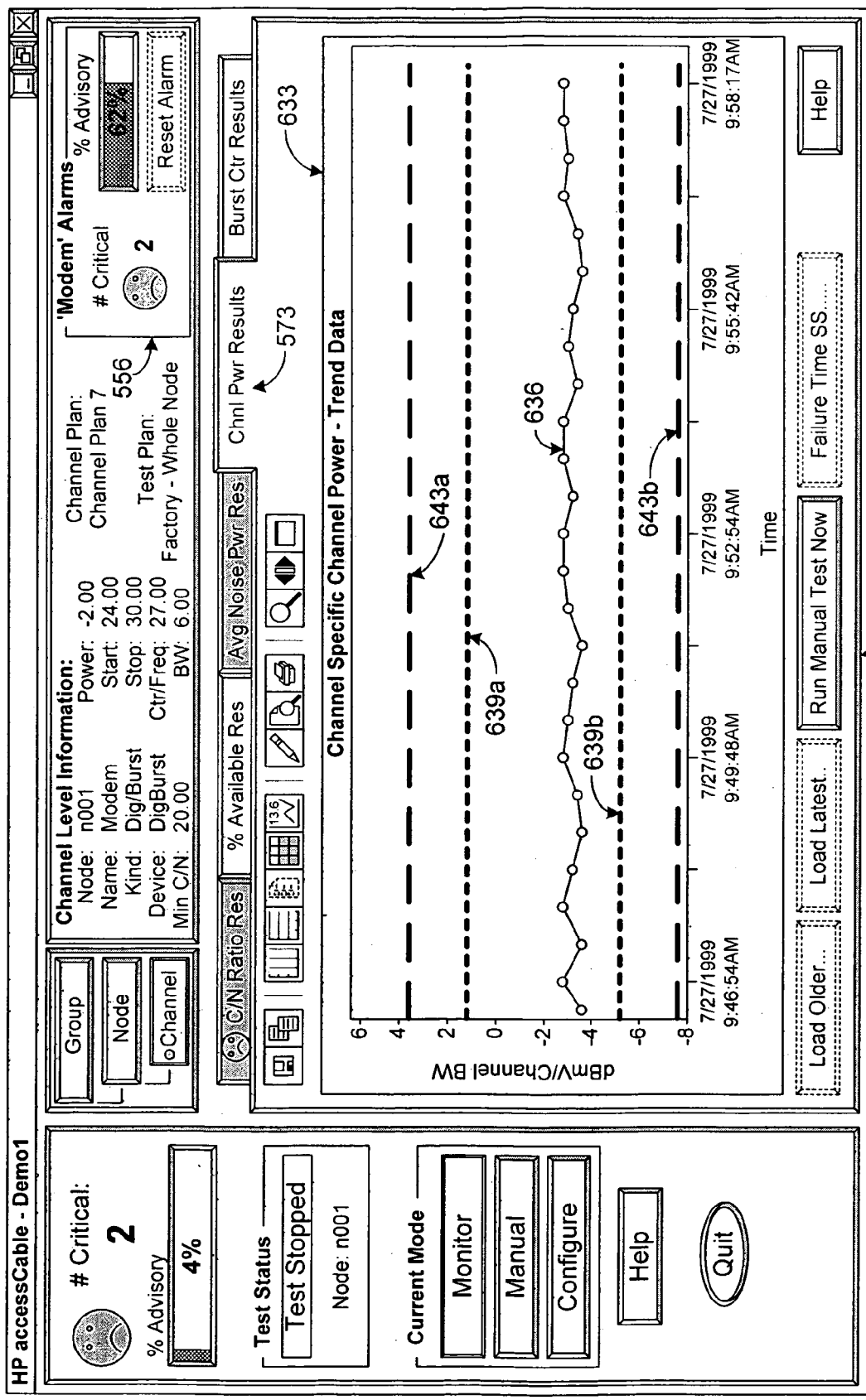

With reference then, to FIG. 11J, shown is another channel level GUI screen 550d that includes the channel level tab box 559 with the channel power results tab 573 active. The channel power results tab 573 includes a channel specific channel power graph 633 that plots the channel power 636 for the identified channel 58 with respect to time as shown. The channel specific channel power graph 633 includes upper and lower advisory limits 639a and 639b, and upper and lower critical limits 643a and 643b that trigger advisory and critical events when breached by the channel power 636 accordingly.

Figure 11K:
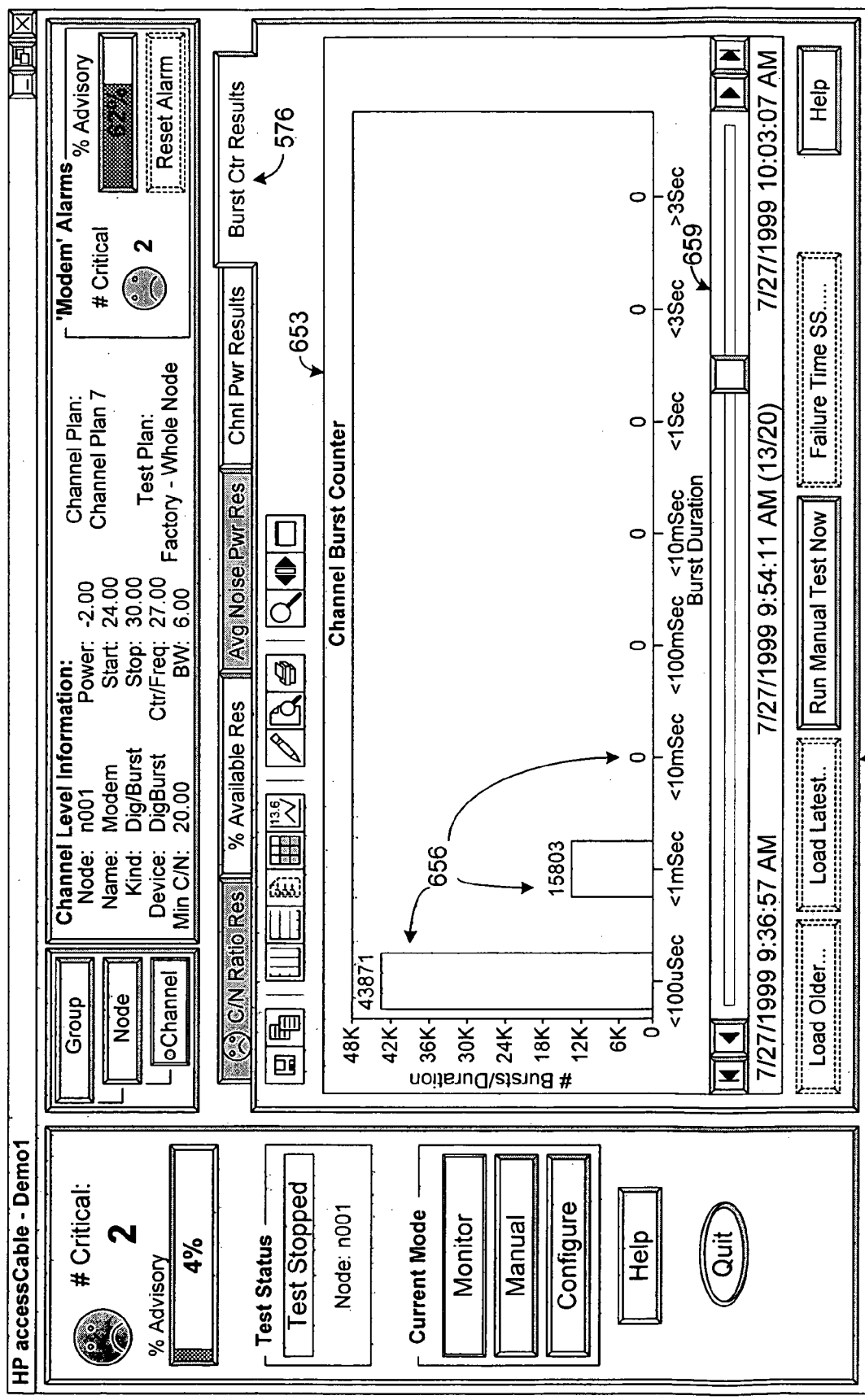

With reference then, to FIG. 11K, shown is another channel level GUI screen 550e that includes the channel level tab box 559 with the burst counter results tab 576 active. The burst counter results tab 576 includes a channel burst counter graph 653 that depicts the number of bursts 656 for each time duration as shown. The burst counter results tab 576 also includes a playback mechanism 659 that allows the user to follow the occurrences of the channel bursts with respect to time. This feature is advantageous as the user is appraised of approximately what time the rate at which the bursts occur starts to increase.

Generally, the C/N ratio results tab 573, percent available results tab 566, average noise power results tab 569, channel power results tab 573, burst counter results tab 576, and the channel level information box 553 may be considered channel level interface components that are displayed at the channel level as discussed above.

B. Configuration of Tests

The following discussion with reference to FIGS. 12 and 12A–12H describes the GUI screens employed in conjunction with the flow charts of FIGS. 5, 6, and 7 according to another embodiment of the present invention. The GUI screens of FIGS. 12A and 12A–12H generally allow the user to perform the tasks necessary to configure the data acquisition/analysis system 14.

Figure 12:
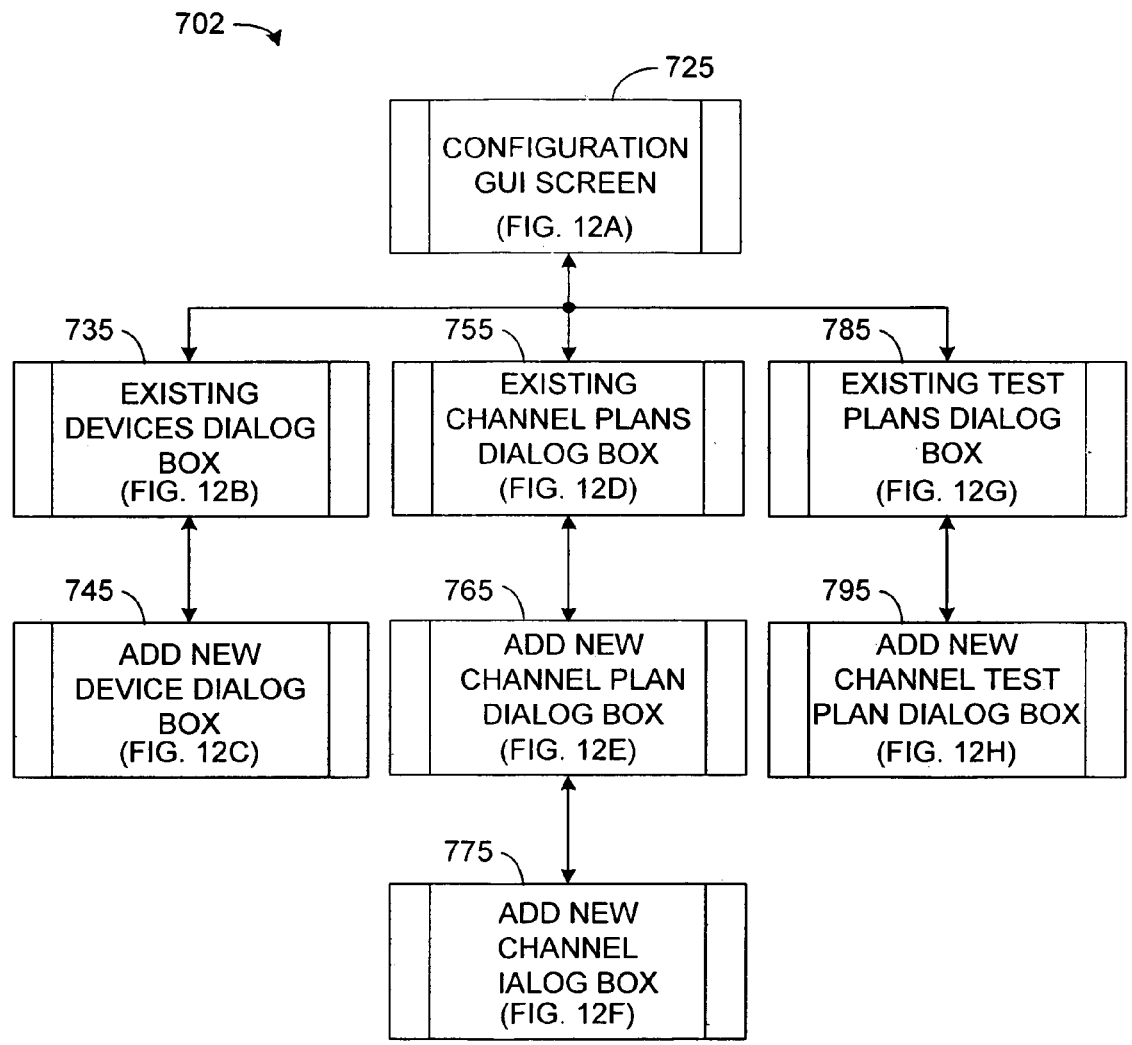
FIG. 12 is a diagram showing the hierarchical relationship of and navigational path through display screens generated by the graphical user interface (GUI) of the monitoring system of FIGS. 1A–1C.

FIG. 12 illustrates the test configuration GUI navigation 702 as a user progresses through each individual screen and or dialog box. In this regard, all test configuration starts with the configuration GUI screen 725 (see FIG. 12A). From the configuration GUI screen 725, a user may proceed to the existing devices dialog box 735 (see FIG. 12B), the existing channel plans dialog box 755 (see FIG. 12D), and the existing test plans dialog 785 (see FIG. 12G). From the existing devices dialog box 735, a user may proceed either back to the configuration GUI screen 725, or down to the add new device dialog box 745 (see FIG. 12C). Once a user displays the add new device dialog box 745, the user may return to the existing devices dialog box 735.

Figure 12A:
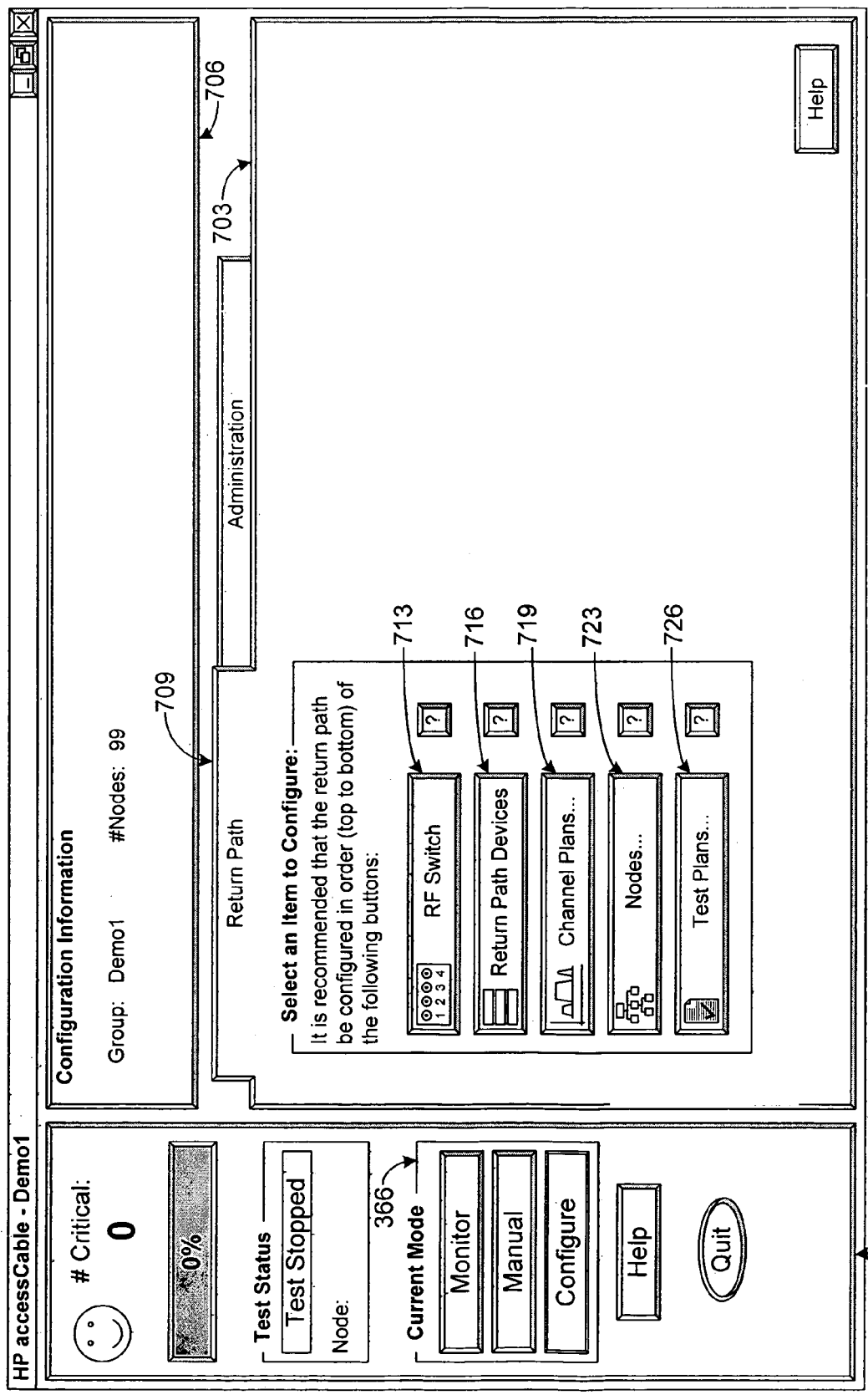
FIGS. 12A–12H are display screens generated by the GUI software of the monitoring system of FIGS. 1A–1C for enabling a user to configure tests.
Figure 12B:
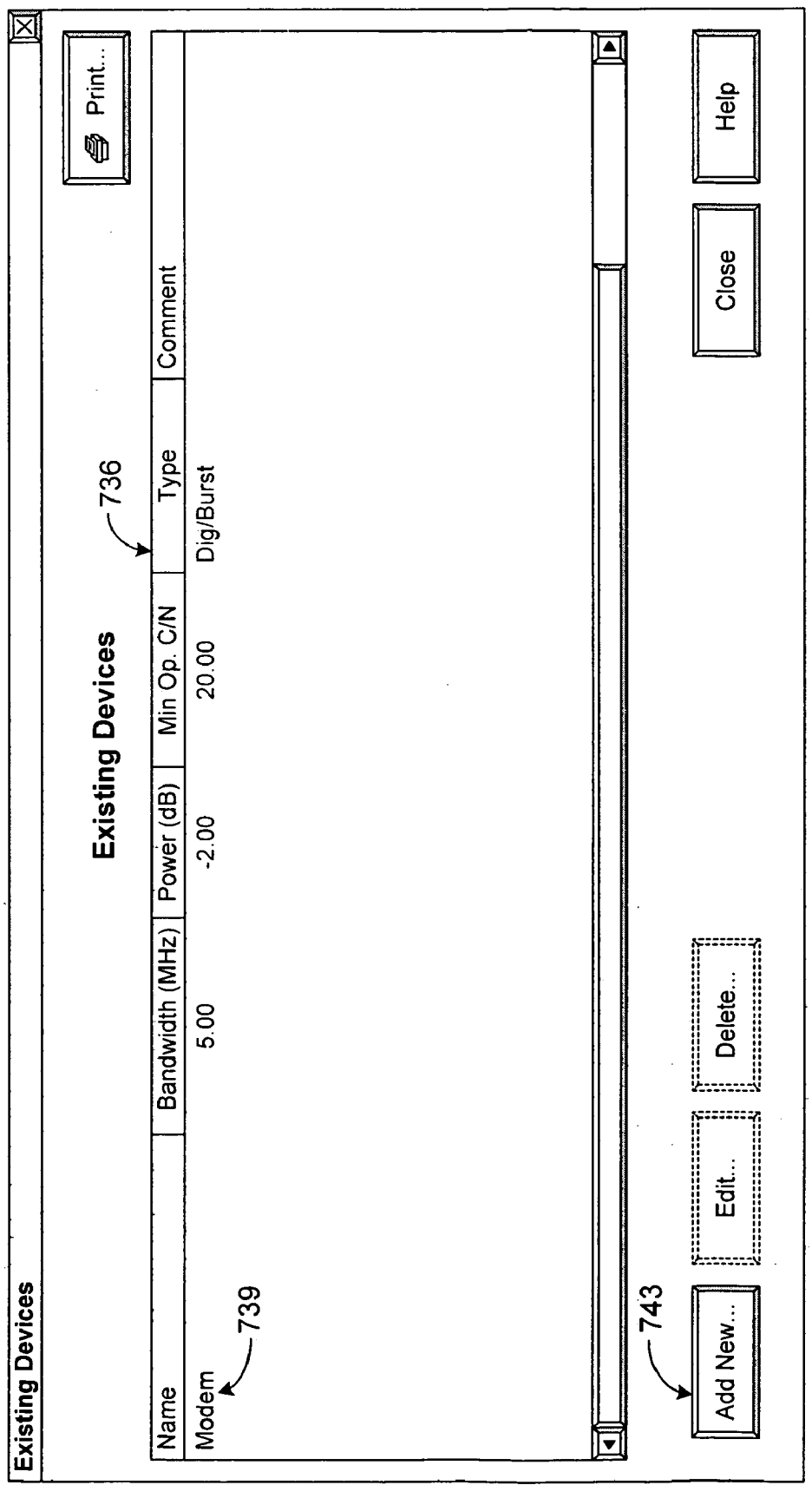
Figure 12C:
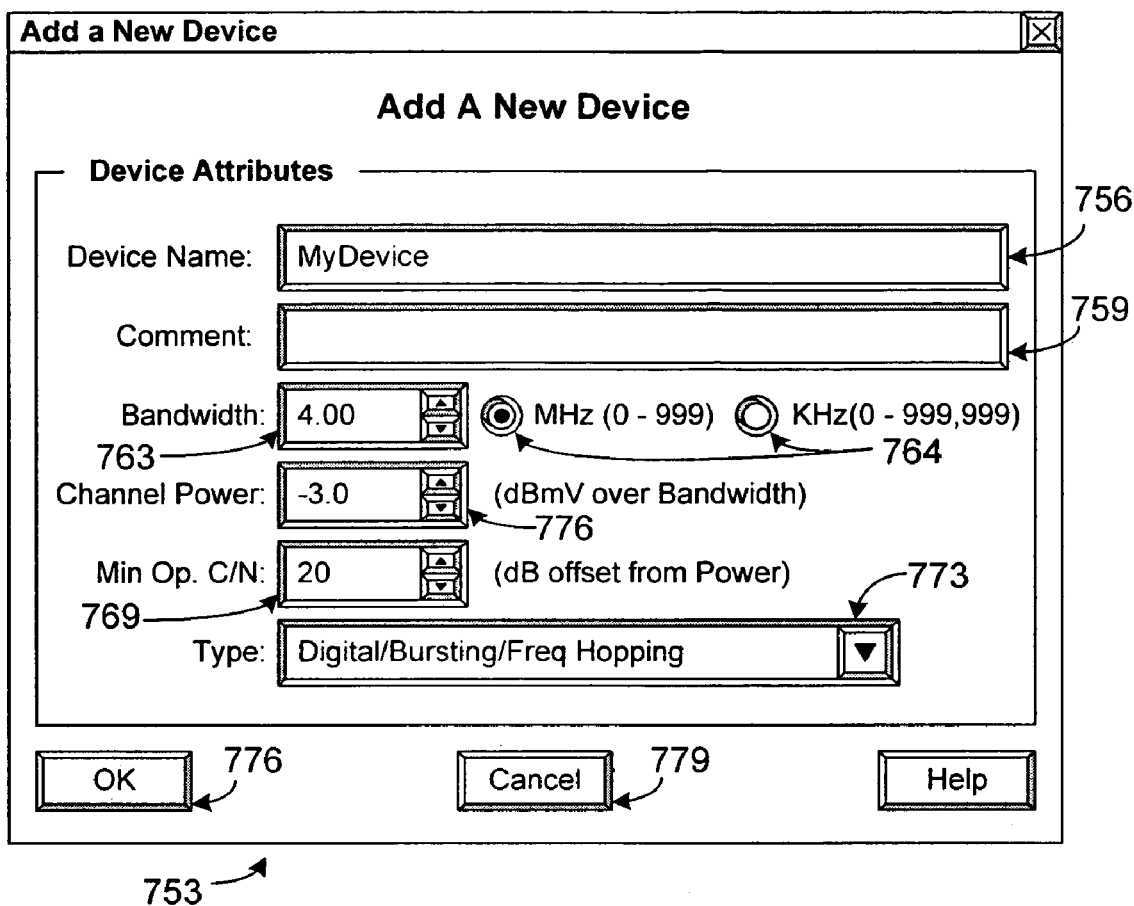
Figure 12D:
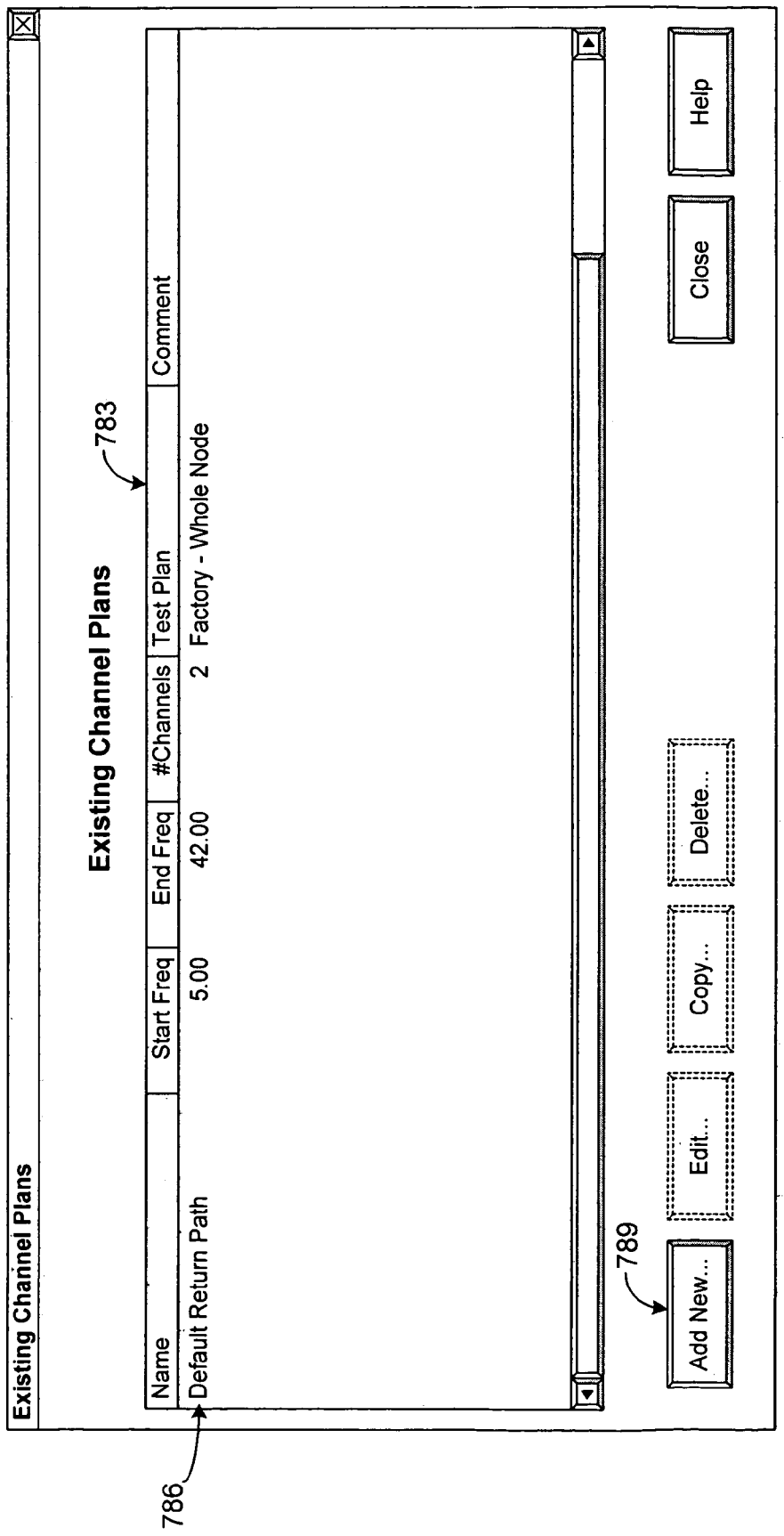
Figure 12E:
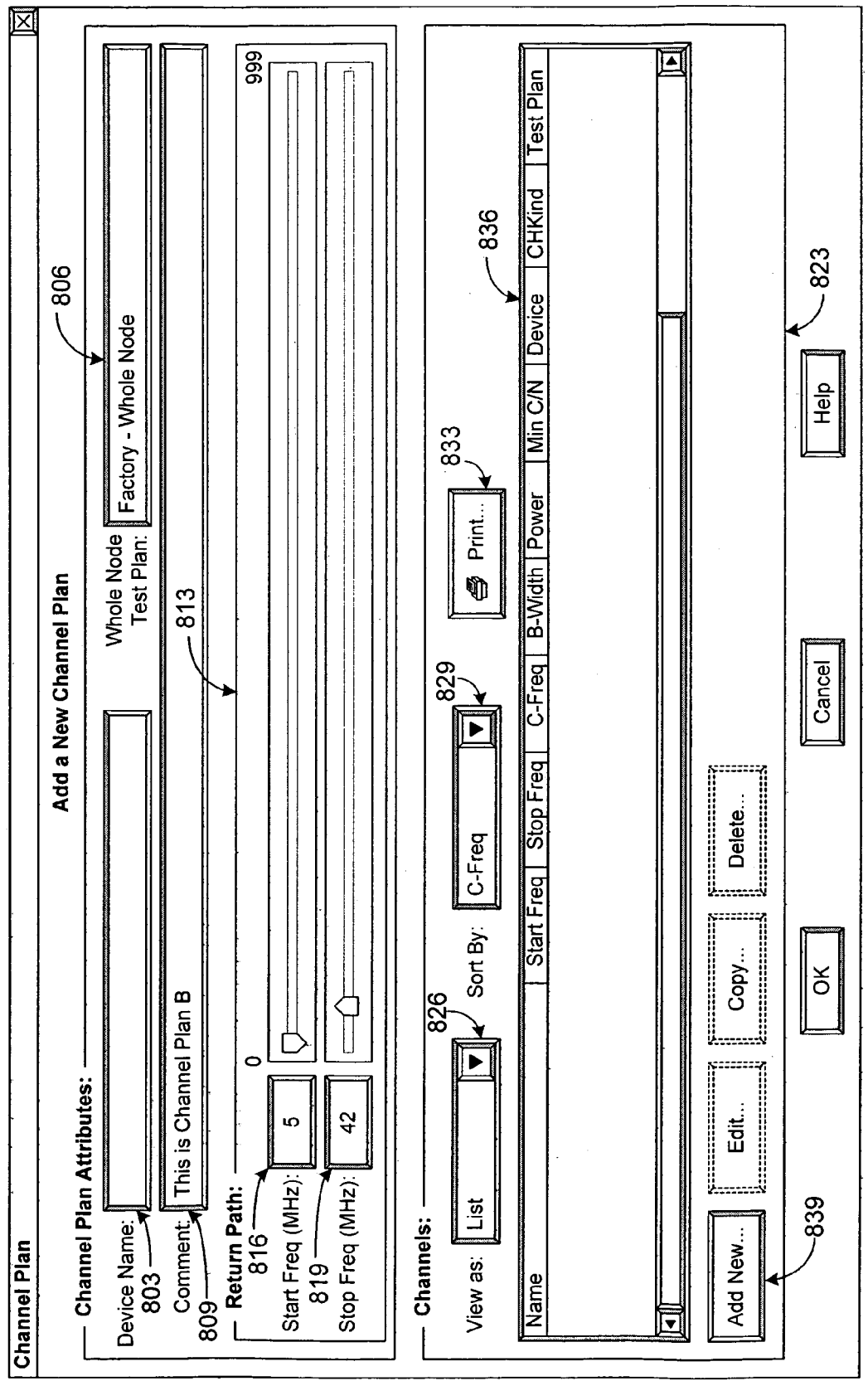

Similarly, from the existing channel plans dialog box 755, a user may proceed either back to the configuration GUI screen 725, or down to the add new channel plan dialog box 765 (see FIG. 12E). From the add new channel plan dialog box 765, a user may proceed either back to the existing channel plans dialog box 755, or down to the add new channel dialog box 775 (see FIG. 12F). Once a user displays the add new channel dialog box 775, the user may return to the add new channel plan dialog box 765.

Figure 12F:
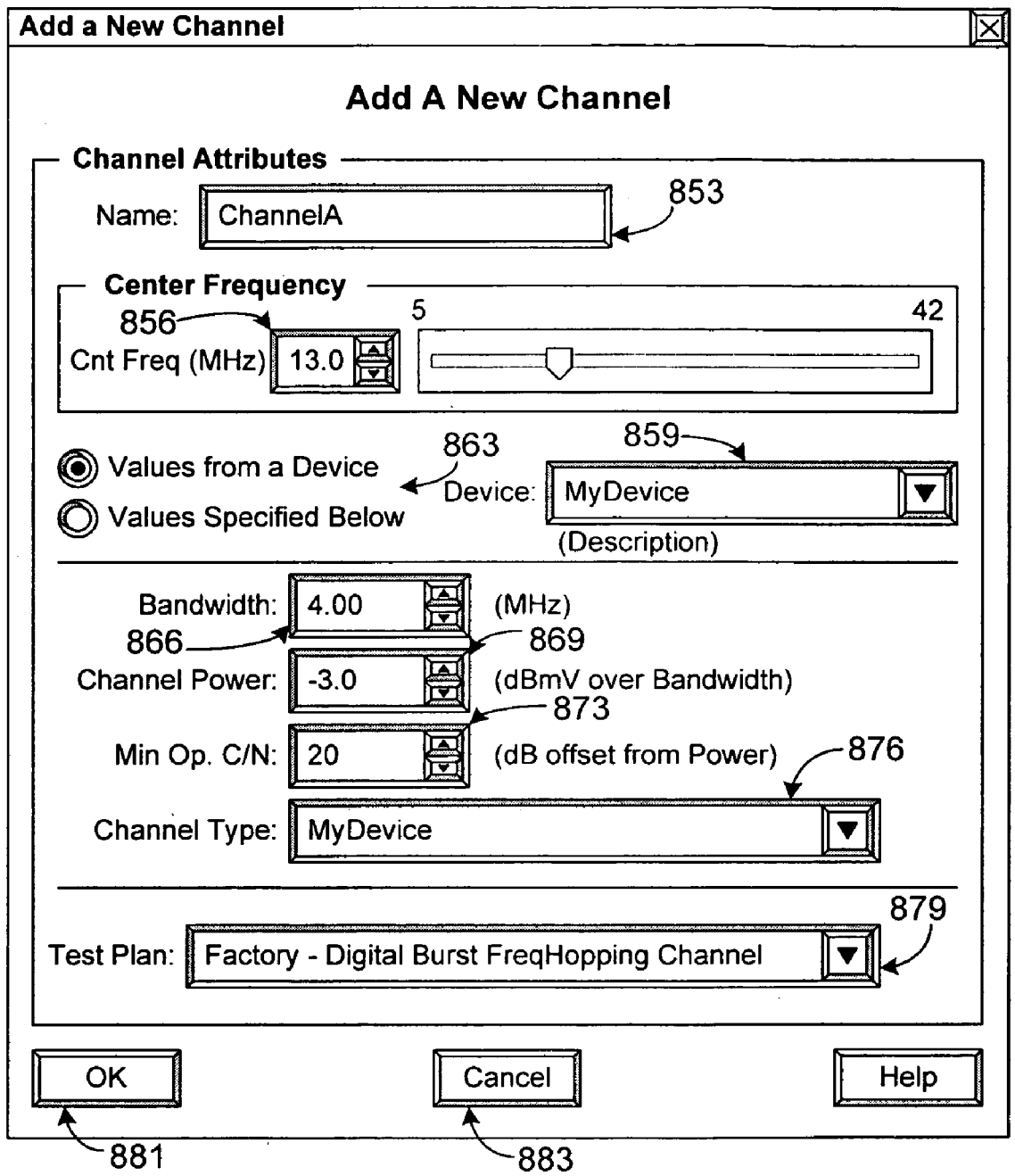
Figure 12G:
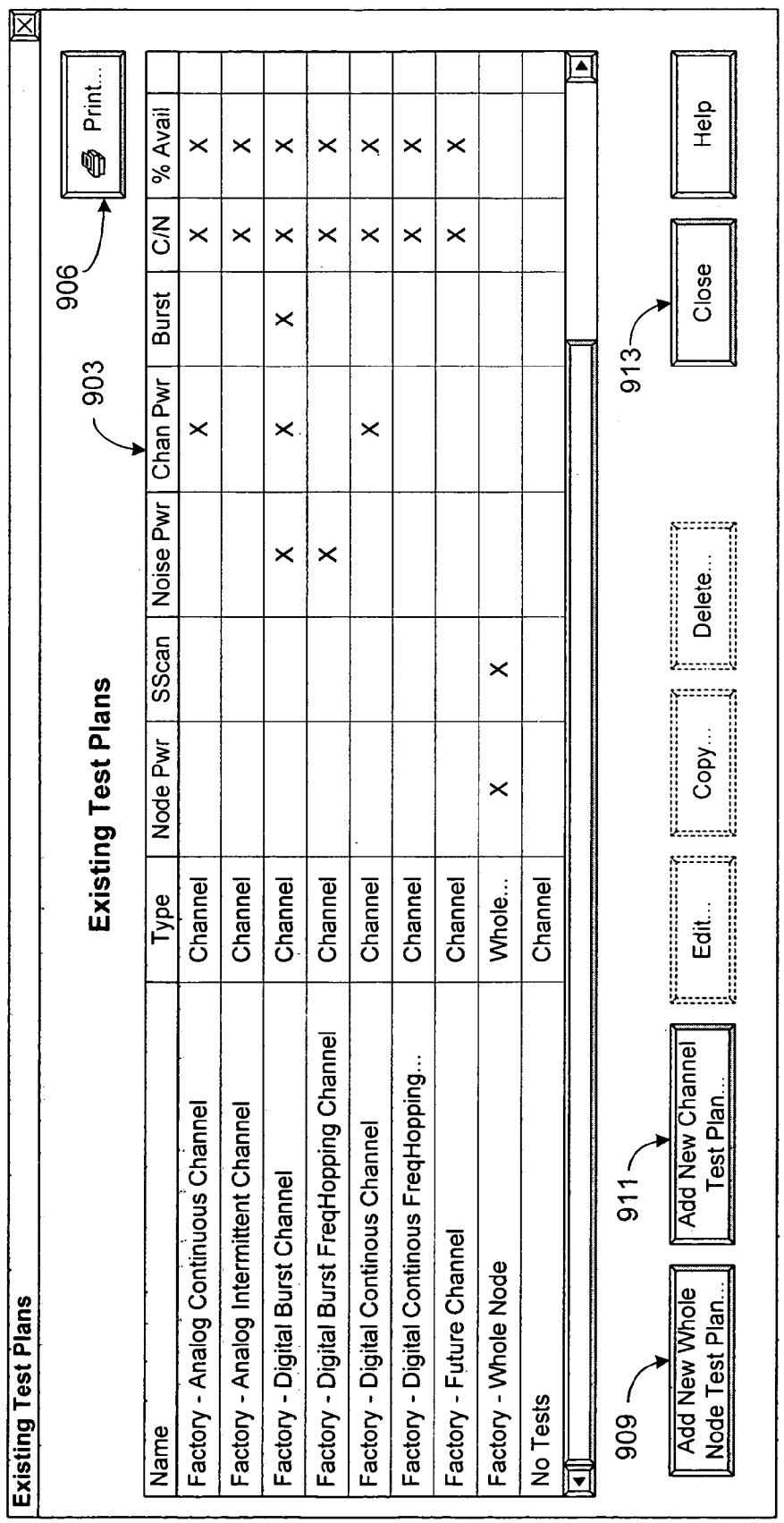
Figure 12H:
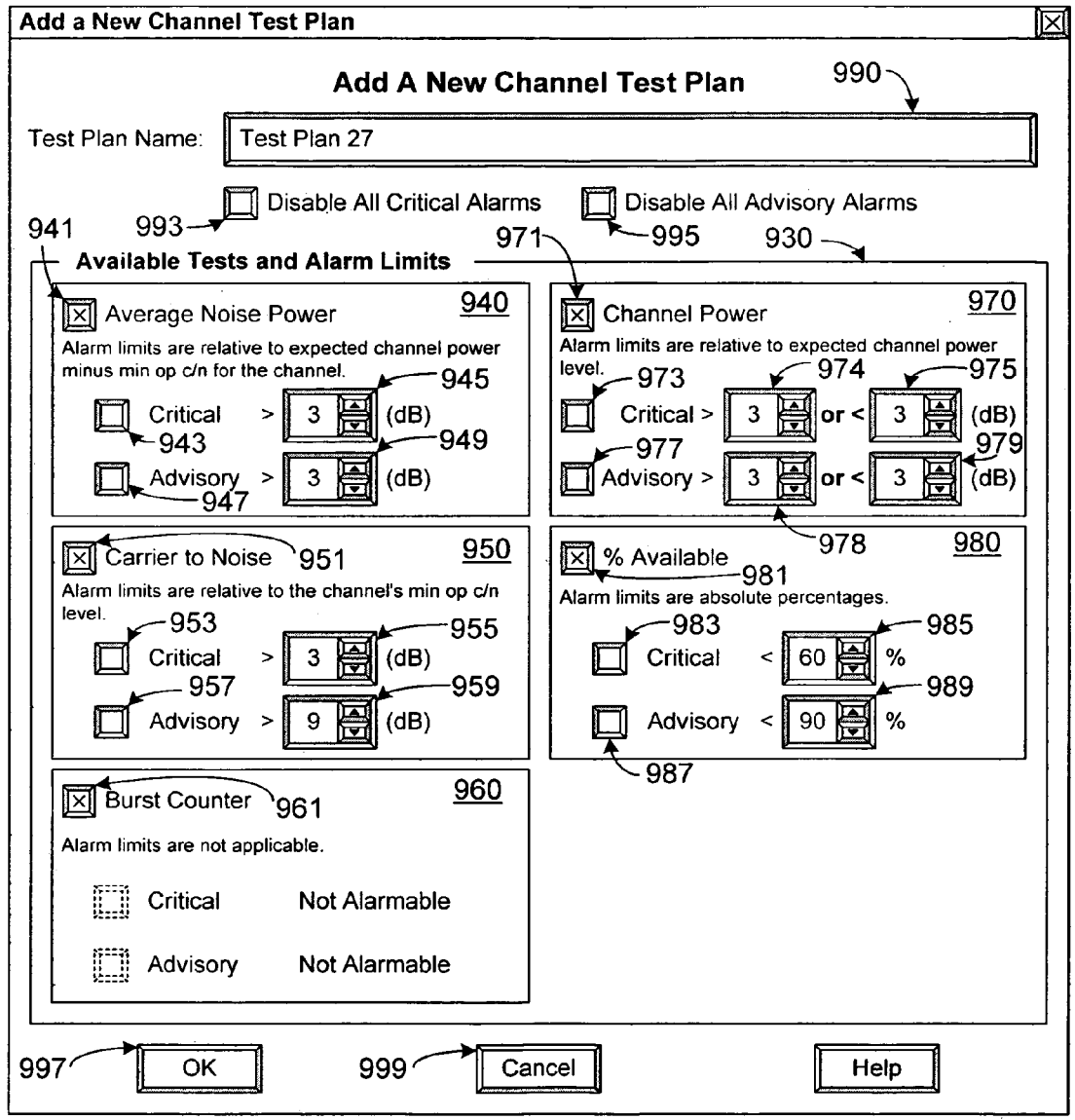

In the same fashion, a user may navigate from the existing test plans dialog box 785 either back to the configuration GUI screen 725, or down to the add new channel test plan dialog box 795 (see FIG. 12H). Once a user displays the add new channel test dialog box 795, the user may return to the existing test plans dialog box 785.

With reference to FIG. 12A, shown is a configuration GUI screen 700 according to an embodiment of the present invention. The configuration GUI screen 700 includes the first indicator box 353 as discussed with reference to FIGS. 11A–11K. By depressing the configure button in the current mode box 366, the configuration GUI screen 700 appears including a configuration tab box 703 and a configuration information box 706. The configuration information box 706 includes a group designation and a total number of nodes 18 in the particular group selected. The configuration tab box 703 includes a return path tab 709 with an RF switch button 713, a return path devices button 716, a channel plans button 719, a node button 723, and a test plans button 726. When each one of these buttons is depressed, a different GUI screen is generated to allow the user to configure the appropriate factor associated therewith as will be discussed.

The RF switch button 713 opens a simple configuration interface that allows the user to configure both the number of ports on the RF switch and a global switch power loss correction factor. For example, if the user is configuring the system for a head end in a cable television network with 32 nodes, the user would set the number of ports to 32. The global switch power loss correction factor normalizes the measured power levels at the 3010H spectrum analyzer 12 to the power level one would expect if the RF switch were not in the monitoring system. The global switch power loss correction factor allows the user to compensate for switch power loss across all nodes.

With reference to FIG. 12B, shown is an existing devices list screen 733 that is displayed when the return path devices button 716 is depressed as discussed in block 118 (FIG. 6) according to an embodiment of the present invention. The return path devices button 716 includes a device list 736 that lists each existing return path device 739 associated with a particular group. The device list 736 provides the bandwidth (MHz), power (dB), minimum operating channel-to-noise ratio, type of device, and general comments associated with the device. The existing devices list screen 733 includes an "Add New" button 743 that is depressed when the user wishes to generate a new device as described in block 120 (FIG. 6).

Reference is now made to FIG. 12C. FIG. 12C illustrates a new device dialog box 753 that appears when the Add New button 743 is depressed as above. The new device dialog box 753 includes a device name field 756, a comment field 759, a bandwidth field 763 with scale indicators 764, a channel power field 766, a minimum operating channel-to-noise ratio field 769, and a device type field 773. To add a new device, the user enters the information for each of the fields and presses the OK button 776 to accept the device or the cancel button 779 to reject the device and return to the existing devices list screen 733 as described with reference to blocks 121–124 (FIG. 6).

With reference to FIG. 12D, shown is an existing channel plans list screen 780 that is displayed when the channel plans button 719 is depressed as discussed in block 105 (FIG. 5). The existing channel plans list screen 780 includes a channel plans list 783 of channel plans 786 along with the various parameters associated therewith including a start frequency, an end frequency, a number of channels 58 in the channel plan 56, an associated test plan 64, and comments. The existing channel plans list screen 780 also includes an "Add New" button 789 that is depressed to add new channel plans 56 to the channel plans list 783.

Referring to FIG. 12E, shown is a channel plan addition dialog box 800 that is manipulated to add a channel plan 56 to the channel plans list 783 (FIG. 12D). The channel plan addition dialog box 800 appears when the user depresses the Add New button 789 (FIG. 12D) as described in block 107 (FIG. 5). The channel plan addition dialog box 800 includes a device name field 803, a whole node test plan field 806, and a comment field 809 into which the user may enter the relevant information relating to the new channel plan 56. The channel plan addition dialog box 800 also includes a return path box 813 that allows the user to specify the boundaries of the frequency spectrum of the channel plan 56. Specifically, the return path box 813 includes a start frequency field 816 and a stop frequency field 819 with sliding scales that may be manipulated to determine a specific value. Alternatively, a value may be entered directly into the start frequency field 816 or the stop frequency field 819 using a computer keyboard.

The channel plan addition dialog box 800 also includes a channels box 823 that includes a view selector 826, a sort selector 829, and a print button 833. The channels box also includes a channels list 836 in which the particular channels within the channel plan 56 are listed along with the associated start frequency, stop frequency, center frequency, bandwidth, channel power, minimum channel-to-noise ratio, device type, channel kind, and test plan 64. In order to add a new channel 58 to the channels list 836, an "add new" button 839 is provided as described with reference to block 113 (FIG. 5).

Turning to FIG. 12F, shown is a new channel dialog box 850 that appears when the Add New button 839 is depressed as above. The new channel dialog box 850 includes a channel name field 853, a center frequency field 856, a device description field 859, and a value origin toggle mechanism 863. To create a new channel 58, the user enters the appropriate information into these fields and selects an active selector of the origin toggle mechanism 863. The new channel dialog box 850 also includes a bandwidth field 866, a channel power field 869, a minimum operating channel-to-noise ratio 873, and a channel type field 876. Depending upon the active selector of the origin toggle mechanism 863, the user can enter the pertinent information into the fields 866, 869, 873, and 876 or the same information may be obtained from the device itself. Finally, the test plan 64 associated with the particular channel 58 is identified in the test plan field 879 as shown. The channel 58 may then be saved by depressing the OK button 881 or discarded by pressing the cancel button 883, after which the channel plan addition dialog box 800 reappears.

Reference is now directed to FIG. 12G. FIG. 12G illustrates the existing test plans 64 stored in database 28. The existing test plans dialog box 900 is displayed when a test operator selects the test plans button 726 as previously described on FIG. 12A. The test plans dialog box 900 consists of an existing test plans list 903, a print button 906, an add new whole node test plan button 909, an add new channel test plan button 911, and a close button 913. The existing test plans list 903 provides the test plan name and test plan type in a vertical table with node power, spectrum scan, noise power, channel power burst, carrier-to-noise ratio, and percent availability tests indicated by an "X" in the appropriate row and column to indicate which specific tests are prescribed for each of the test plans 64 listed. The add new whole node test plan button 909 takes the user to step 128 configure node tests (see FIG. 7). The add new channel test plan button 911, takes the user to FIG. 12H which is further described below. The close button 913, closes the existing test plan dialog box 900 and returns the user to the configuration GUI screen 700 (FIG. 12A).

Reference is now made to FIG. 12H which illustrates the add new channel test plan dialog box 925 that appears when the add new channel test button 911 is depressed as above. The add new channel test plan dialog box 925 includes a test plan name field 990, an available tests and alarm limits interface 930, a disable all critical alarms toggle mechanism 993, and a disable all advisory alarms toggle mechanism 995. To create a new channel test plan 64, the user enters the appropriate information into these fields and selects available tests and alarm limits from within the available tests and alarm limits interface 930. Depending upon the state of the disable all critical alarms toggle mechanism 993 and the disable all advisory alarms toggle mechanism 995, the user can enter the pertinent alarm information into the average noise power test 940, carrier to noise test 950, burst counter test 960, channel power test 970, and percent available test alarm data entry fields.

In this regard, the average noise power test alarm data entry field 940 consists of the average noise power test selection button 941, the critical alarm selection button 943, the critical alarm limit entry field 945, the advisory alarm selection button 947, and the advisory alarm limit entry field 949. Upon selecting either the critical alarm selection button 943 and or the advisory alarm entry selection button 947, the user can proceed to enter a critical alarm limit in dB in the critical alarm entry field 945 either from the average noise power test alarm data entry field 940 or from a computer keyboard. Similarly, a user may proceed to enter an advisory alarm limit in dB in the advisory alarm entry field 949 either from the average noise power test alarm data entry field 940 or from a computer keyboard.

With regards to the carrier to noise test, the carrier to noise test alarm data entry field 950 consists of the carrier to noise test selection button 951, the critical alarm selection button 953, the critical alarm limit entry field 955, the advisory alarm selection button 957, and the advisory alarm limit entry field 959. Upon selecting either the critical alarm selection button 953 and or the advisory alarm entry selection button 957, the user can proceed to enter a critical alarm limit in dB in the critical alarm entry field 955 either from the carrier to noise test alarm data entry field 950 or from a computer keyboard. Similarly, a user may proceed to enter an advisory alarm limit in dB in the advisory alarm entry field 959 either from the carrier to noise test alarm data entry field 950 or from a computer keyboard.

With regards to the burst counter test, the burst counter test alarm data entry field 960 consists of the burst counter test selection button 961. Alarm limits are not applicable to the burst counter test.

With regards to the channel power test, the channel power test alarm data entry field 970 consists of the channel power test selection button 971, the critical alarm selection button 973, the upper critical alarm limit entry field 974, the lower critical alarm limit entry field 975, the advisory alarm selection button 977, the upper advisory alarm limit entry field 978, and the lower advisory alarm limit entry field 979. Upon selecting either the critical alarm selection button 973 and or the advisory alarm entry selection button 977, the user can proceed to enter critical alarm limits in dB in the upper critical alarm entry field 974 or the lower critical alarm entry field 975 either from the channel power test alarm data entry field 970 or from a computer keyboard. Similarly, a user may proceed to enter an advisory alarm limit in dB in the upper advisory alarm entry field 978 or the lower advisory alarm entry field 979 either from the channel power test alarm data entry field 950 or from a computer keyboard.

With regards to the percent available test, the percent available test alarm data entry field 980 consists of the percent available test selection button 981, the critical alarm selection button 983, the critical alarm limit entry field 985, the advisory alarm selection button 987, and the advisory alarm limit entry field 989. Upon selecting either the critical alarm selection button 983 and or the advisory alarm entry selection button 987, the user can proceed to enter a critical alarm limit in percent in the critical alarm entry field 985 either from the percent available test alarm data entry field 980 or from a computer keyboard. Similarly, a user may proceed to enter an advisory alarm limit in percent in the advisory alarm entry field 989 either from the percent available test alarm data entry field 980 or from a computer keyboard.

The channel 58 may then be saved by depressing the OK button 997 or discarded by pressing the cancel button 999, after which the channel plan addition dialog box 800 reappears.

VI. Advantages

The monitoring systems 10 of the present invention has many advantages, a few of which are delineated hereafter, as merely examples, for better understanding the significant advancement that the inventors have made in the relevant art.

An advantage of the present invention is that it can be used in connection with analyzing and monitoring signals associated with virtually any type of signal channel 58, including but not limited to, a return path and a forward path associated with a node 18 associated with a television cable network.

Another advantage of the present invention is that services on a node 18 can be tested to actual operational parameters of the communications devices 62 being used, rather than arbitrary levels.

Another advantage of the present invention is that the alarm limits within the system are specified relative to the desired operational levels within the system under test, rather than at arbitrary levels.

Another advantage of the present invention is that the product can test a node 18 at the level of individual services, report when any given service is out of specification or operating with insufficient carrier-to-noise levels.

Another advantage of the present invention is that the product can store and retrieve information organized by the different services within the system, allowing for efficient browsing of data.

Another advantage of the present invention is that the separation between the channel and test plan 64 allows for very efficient storage of the information about the nodes.

Another advantage of the present invention is the individual nodes in different physical locations can be tested the same way so that "apples-to-apples" comparisons are possible.

Another advantage of the present invention is that it is possible to specify the planned deployment of services even before those services are activated to measure their potential performance on a given node 18 prior to deployment.

VII. Anticipated Variations and Modifications

It should be emphasized that the above-described embodiments of the present invention, particularly, any "preferred" embodiments, are merely possible examples of implementations, merely set forth for the benefit of the reader for clearly disclosing to the reader the basic principles of the invention. Many variations and modifications may be made to the above-described embodiment(s) of the invention without departing substantially from the spirit and principles of the invention, and such variations and modifications have not been described herein for brevity sake and simplicity. All such variations and modifications are intended to be included herein within the scope of this disclosure and the present invention and are intended to be protected by the following claims.

As an example, it should be noted that the channel plan and test plan can be implemented in connection with a different type of spectrum analyzer (other than the 3010H), in connection with different tests (depending upon the spectrum analyzer that is used, and/or in connection with different types of signal channels (other than the return path channels associated with a cable television network).

What is claimed is:

1. A system, comprising:
    a plurality of nodes providing signal channels pursuant to a single channel plan, said channel plan having predefined characteristics including at least a center frequency, a bandwidth and a power level of a carrier signal for each of the signal channels;
    a spectrum analyzer;
    a switch capable of connecting one of said nodes with said spectrum analyzer; and
    a controller controlling said switch to select said one node, said controller capable of monitoring signals on signal channels provided by said selected one node by conducting a test plan prescribing performance of an automated test which compares actual measured values from monitoring the signals with expected values indicated by the predefined characteristics of the channel plan and thereby produces a test result, said test plan further configured with an alarm limit, the controller further configured to compare the test result from said test with said alarm limit, the controller further configured to control said spectrum analyzer to perform a failure time spectrum scan when the test result exceeds said alarm limit, to generate a plot of power amplitude versus frequency over the frequency spectrum of said selected one node, and to display the generated plot.

2. The system of claim 1, further comprising a database, wherein said controller is further configured to store said failure time spectrum scan in the database.

3. The system of claim 2, wherein said controller is further configured to control said spectrum analyzer to perform said failure time spectrum scan wherein said failure time spectrum scan is performed over a portion of said selected one node's frequency spectrum.

4. The system of claim 3, wherein said controller controls said spectrum analyzer in response to said test plan.

5. The system of claim 4, wherein said controller controls said response to said test plan by adjusting start and stop frequencies sent to configure said spectrum analyzer based on a respective channel under test at a time said alarm limit was exceeded.

6. The system of claim 1, wherein the controller is further configured to control the spectrum analyzer to perform a failure time spectrum scan over the entire frequency spectrum of said selected one node.

7. The system of claim 1, wherein said nodes are part of a cable television network.

8. The system of claim 1, further comprising:
    a graphical user interface, wherein said controller is configured to retrieve and communicate said failure time spectrum scan from said database to said graphical user interface for displaying said failure time spectrum scan in response to a user request.

9. The system of claim 8, wherein said user request is communicated to said controller via said graphical user interface.

10. The system of claim of claim 8, wherein said controller is further configured to permit a user to configure said spectrum analyzer to repeat the failure time spectrum scan in response to a user request.

11. The system of claim 10, wherein said spectrum analyzer is configured to perform said repeat of said failure time spectrum scan with the same spectrum analyzer configuration.

12. The system of claim 11, wherein said user request is communicated to said controller via said graphical user interface.

13. The system of claim 1, wherein said test is a test of total node power, carrier-to-noise power, percent availability, average noise power, channel power or burst counter.

14. A computer readable medium having a program for enabling efficient monitoring of electrical signals communicated along a plurality of nodes, each node having a plurality of signal channels, the signals being measured by a spectrum analyzer, the program comprising:

means for providing a channel plan having predefined characteristics including at least a center frequency, a bandwidth and a power level of a carrier signal for each signal channel;

means for receiving signal data from a respective node sampled by the spectrum analyzer; and means for testing communication of said signals on the respective node by conducting a test plan prescribing performance of an automated test which compares actual measured values from the received signal data with expected values indicated by the predefined characteristics of the channel plan and thereby produces a test result, said means for testing further configured to compare the test result with an alarm limit and to control said spectrum analyzer to perform a failure time spectrum scan when said test results exceed said alarm limit, said failure time spectrum scan representative of power amplitude versus frequency over the frequency spectrum of the respective node; and means for displaying the power amplitude versus frequency over the frequency spectrum represented by the failure time spectrum scan.

15. A method comprising:

providing a channel plan having predefined characteristics including at least a center frequency, a bandwidth and a power level of a carrier signal for each signal channel provided by a node of a network;

testing communication of a plurality of signals communicated on the node by conducting a test plan, said test plan prescribing an automated test which compares actual measured values on each signal channel provided by the node with expected values indicated by the predefined characteristics of the channel plan, and thereby produces a test result;

comparing the test result with a user definable alarm limit;

performing a failure time spectrum scan on the node when said test result exceed said alarm limit, said failure time spectrum scan representative of power amplitude versus frequency over the frequency spectrum of the node; and displaying the power amplitude versus frequency over the frequency spectrum of the node.

16. The method of claim 15, further comprising the step of storing said failure time spectrum scan in a database.

17. The method of claim 16, wherein said failure time spectrum scan is performed in response to said test plan by adjusting start and stop frequencies of said failure time spectrum scan based on a respective channel under test at a time said alarm limit was exceeded.

18. An apparatus comprising:

a spectrum analyzer monitoring a plurality of channels corresponding to a respective node of a network in accordance with a test plan for the node, wherein a channel plan provides predefined characteristics including at least a center frequency, a bandwidth and a power level of a carrier signal for each of the channels, and the test plan provides an automated test which compares actual measured values from monitoring signals on the channels by the spectrum analyzer with expected values indicated by the predetermined characteristics of the channel plan; and a controller automatically performing a failure test spectrum scan for the respective node when a result of the test exceeds an alarm limit for the test, wherein the failure test plan provides a power amplitude versus frequency graph over a frequency spectrum of the node, and the controller automatically displays the graph.

19. The apparatus of claim 18, wherein the respective node is a node of a cable television network.

20. The apparatus of claim 18, further comprising:

a graphical user interface, wherein the controller displays the graph on the graphical user interface in response to a user request.

21. An apparatus comprising:

a spectrum analyzer monitoring a plurality of channels corresponding to a respective node of a network in accordance with a test plan for the node, wherein a channel plan provides predefined characteristics including at least a center frequency, a bandwidth and a power level of a carrier signal for each of the channels, and the test plan provides an automated test which compares actual measured values from monitoring signals on the channels by the spectrum analyzer with expected values indicated by the predetermined characteristics of the channel plan;

means for automatically performing a failure test spectrum scan for the respective node when a result of the test exceeds an alarm limit for the test, the failure test plan providing a power amplitude versus frequency graph over a frequency spectrum of the node; and means for displaying the graph.

22. An apparatus comprising:

a spectrum analyzer;

a switch controllable to connect a respective node of a plurality of nodes of a network to the spectrum analyzer, each node having a corresponding plurality of channels; and a controller controlling the switch to connect a selected node of the plurality of nodes to the spectrum analyzer, wherein the spectrum analyzer monitors the plurality of channels corresponding to the selected node in accordance with a test plan for the selected node, a channel plan provides predefined characteristics including at least a center frequency, a bandwidth and a power level of a carrier signal for each of the plurality of channels corresponding to the selected node, the test plan provides an automated test which compares actual measured values from monitoring signals on the plurality of channels corresponding to the selected node by the spectrum monitor with expected values indicated by the predetermined characteristics of the channel plan, the controller automatically performs a failure test spectrum scan for the selected node when a result of the test exceeds an alarm limit for the test, the failure test plan providing a power amplitude versus frequency graph over a frequency spectrum of the selected node, and the controller displays the graph on a screen.

* * * * *